US010685560B2

(12) United States Patent
Dimberg et al.

(10) Patent No.: US 10,685,560 B2
(45) Date of Patent: *Jun. 16, 2020

(54) REMOTE LOAD CONTROL DEVICE CAPABLE OF ORIENTATION DETECTION

(71) Applicant: Lutron Technology Company LLC, Coopersburg, PA (US)

(72) Inventors: Chris Dimberg, Easton, PA (US); Alexander Wade Gage, Havertown, PA (US); Matthew V. Harte, Stewartsville, NJ (US); Jason C. Killo, Emmaus, PA (US); Brad Michael Kreschollek, Bethlehem, PA (US); Matthew Philip McDonald, Phoenixville, PA (US); Daniel L. Twaddell, Allentown, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/183,696

(22) Filed: Nov. 7, 2018

(65) Prior Publication Data

US 2019/0073898 A1    Mar. 7, 2019

Related U.S. Application Data

(63) Continuation of application No. 15/469,427, filed on Mar. 24, 2017, now Pat. No. 10,134,268.
(Continued)

(51) Int. Cl.
*G08C 17/02* (2006.01)
*G06F 3/0488* (2013.01)
(Continued)

(52) U.S. Cl.
CPC ............... *G08C 17/02* (2013.01); *G01D 5/02* (2013.01); *G01D 5/145* (2013.01); *G01D 5/20* (2013.01);
(Continued)

(58) Field of Classification Search
None
See application file for complete search history.

(56) References Cited

U.S. PATENT DOCUMENTS

| 5,264,761 A | 11/1993 | Johnson |
| 5,731,756 A | 3/1998 | Roddy |

(Continued)

FOREIGN PATENT DOCUMENTS

| CN | 2596671 Y | 12/2003 |
| CN | 101999253 A | 3/2011 |

(Continued)

*Primary Examiner* — K. Wong
(74) *Attorney, Agent, or Firm* — Flaster Greenberg PC

(57) ABSTRACT

A remote control device is provided that is configured for use in a load control system that includes one or more electrical loads. The remote control device includes a mounting structure and a control unit, and the control unit is configured to be attached to the mounting structure in a plurality of different orientations. The control unit includes a user interface, an orientation sensing circuit, and a communication circuit. The control unit is configured to determine an orientation of the control unit via the orientation sensing circuit. The control unit is also configured to translate a user input from the user interface into control data to control an electrical load of the load control system based on the orientation of the control unit and/or provide a visual indication of an amount of power delivered to the electrical load based on the orientation of the control unit.

25 Claims, 32 Drawing Sheets

Related U.S. Application Data

(60) Provisional application No. 62/411,223, filed on Oct. 21, 2016, provisional application No. 62/356,179, filed on Jun. 29, 2016, provisional application No. 62/356,007, filed on Jun. 29, 2016, provisional application No. 62/356,288, filed on Jun. 29, 2016, provisional application No. 62/345,449, filed on Jun. 3, 2016, provisional application No. 62/345,222, filed on Jun. 3, 2016, provisional application No. 62/345,464, filed on Jun. 3, 2016.

(51) Int. Cl.

| | | |
|---|---|---|
| *H01H 9/02* | (2006.01) | |
| *H01H 11/00* | (2006.01) | |
| *H01H 23/16* | (2006.01) | |
| *H02G 3/14* | (2006.01) | |
| *H03K 17/96* | (2006.01) | |
| *H05B 45/00* | (2020.01) | |
| *H05B 45/20* | (2020.01) | |
| *H05B 47/10* | (2020.01) | |
| *H05B 47/19* | (2020.01) | |
| *H05B 47/105* | (2020.01) | |
| *H05B 47/175* | (2020.01) | |
| *G01D 5/02* | (2006.01) | |
| *G01D 5/14* | (2006.01) | |
| *G01D 5/20* | (2006.01) | |
| *G01D 5/34* | (2006.01) | |
| *G01R 21/00* | (2006.01) | |
| *H01H 35/02* | (2006.01) | |
| *G05G 1/08* | (2006.01) | |
| *G06F 3/0484* | (2013.01) | |
| *G06F 3/0354* | (2013.01) | |
| *G06F 3/01* | (2006.01) | |
| *H01H 9/28* | (2006.01) | |
| *H01H 19/14* | (2006.01) | |
| *H01H 23/12* | (2006.01) | |

(52) U.S. Cl.
CPC ............... *G01D 5/34* (2013.01); *G01R 21/00* (2013.01); *G05G 1/08* (2013.01); *G06F 3/0488* (2013.01); *G06F 3/04847* (2013.01); *G06F 3/04883* (2013.01); *H01H 9/02* (2013.01); *H01H 9/0207* (2013.01); *H01H 9/0235* (2013.01); *H01H 11/00* (2013.01); *H01H 23/16* (2013.01); *H01H 35/02* (2013.01); *H02G 3/14* (2013.01); *H03K 17/96* (2013.01); *H03K 17/962* (2013.01); *H05B 45/00* (2020.01); *H05B 45/20* (2020.01); *H05B 47/10* (2020.01); *H05B 47/105* (2020.01); *H05B 47/175* (2020.01); *H05B 47/19* (2020.01); *G06F 3/017* (2013.01); *G06F 3/03547* (2013.01); *G06F 2203/04808* (2013.01); *G08C 2201/32* (2013.01); *H01H 9/025* (2013.01); *H01H 9/287* (2013.01); *H01H 19/14* (2013.01); *H01H 23/12* (2013.01); *H01H 2223/034* (2013.01); *H01H 2231/032* (2013.01); *H01H 2300/03* (2013.01); *Y02B 90/224* (2013.01); *Y04S 20/14* (2013.01)

(56) References Cited

U.S. PATENT DOCUMENTS

| | | | |
|---|---|---|---|
| 5,905,442 | A | 5/1999 | Mosebrook et al. |
| 7,242,150 | B2 | 7/2007 | DeJonge et al. |
| 7,348,504 | B2 | 3/2008 | Brojanac |
| 7,546,473 | B2 | 6/2009 | Newman |
| 7,573,208 | B2 | 8/2009 | Newman, Jr. |
| 7,834,856 | B2 | 11/2010 | Grinshpoon et al. |
| 7,940,167 | B2 | 5/2011 | Steiner et al. |
| 8,009,042 | B2 | 8/2011 | Steiner et al. |
| 8,199,010 | B2 | 6/2012 | Sloan et al. |
| 8,330,638 | B2 | 12/2012 | Altonen et al. |
| 8,410,706 | B2 | 4/2013 | Steiner et al. |
| 8,451,116 | B2 | 5/2013 | Steiner et al. |
| 8,664,881 | B2 | 3/2014 | Newman, Jr. et al. |
| 8,786,196 | B2 | 7/2014 | Biery et al. |
| 9,208,965 | B2 | 12/2015 | Busby et al. |
| 9,268,488 | B2 | 2/2016 | Dong |
| 9,418,802 | B2 | 8/2016 | Romano et al. |
| 9,520,247 | B1 | 12/2016 | Finnegan et al. |
| 9,583,288 | B2 | 2/2017 | Jones et al. |
| 9,589,461 | B1 | 3/2017 | Byrne et al. |
| 9,799,469 | B2 | 10/2017 | Bailey et al. |
| 9,959,997 | B2 | 5/2018 | Bailey et al. |
| 10,102,742 | B2 | 10/2018 | Dimberg et al. |
| 10,109,181 | B2 | 10/2018 | Dimberg et al. |
| 10,134,268 | B2 * | 11/2018 | Dimberg .................. G01D 5/02 |
| 10,237,954 | B2 | 3/2019 | Dimberg et al. |
| 2008/0111491 | A1 | 5/2008 | Spira |
| 2009/0206983 | A1 | 8/2009 | Knode et al. |
| 2011/0074672 | A1 | 3/2011 | Diederiks et al. |
| 2011/0266122 | A1 | 11/2011 | Zaharchuk et al. |
| 2013/0030589 | A1 | 1/2013 | Pessina et al. |
| 2013/0222122 | A1 | 8/2013 | Killo et al. |
| 2014/0117871 | A1 | 5/2014 | Swatsky et al. |
| 2015/0077021 | A1 | 3/2015 | Smith et al. |
| 2015/0357133 | A1 | 12/2015 | Keirstead et al. |
| 2015/0371534 | A1 | 12/2015 | Dimberg et al. |
| 2016/0013626 | A1 | 1/2016 | Gage |
| 2016/0073479 | A1 | 3/2016 | Erchak et al. |
| 2017/0105176 | A1 | 4/2017 | Finnegan et al. |
| 2018/0190451 | A1 | 7/2018 | Scruggs |

FOREIGN PATENT DOCUMENTS

| | | |
|---|---|---|
| CN | 203365657 U | 12/2013 |
| CN | 104077908 A | 10/2014 |
| CN | 204595591 U | 8/2015 |
| WO | WO 2013/012547 A1 | 1/2013 |

* cited by examiner

REMOTE LOAD CONTROL DEVICE CAPABLE OF ORIENTATION DETECTION

CROSS-REFERENCE TO RELATED APPLICATIONS

This application is a continuation of U.S. patent application Ser. No. 15/469,427, filed Mar. 24, 2017, which claims the benefit of Provisional U.S. Patent Application No. 62/312,863, filed Mar. 24, 2016, Provisional U.S. Patent Application No. 62/345,222, filed Jun. 3, 2016, Provisional U.S. Patent Application No. 62/345,449, filed Jun. 3, 2016, Provisional U.S. Patent Application No. 62/345,464, filed Jun. 3, 2016, Provisional U.S. Patent Application No. 62/356,007, filed Jun. 29, 2016, Provisional U.S. Patent Application No. 62/356,179, filed Jun. 29, 2016, Provisional U.S. Patent Application No. 62/356,288, filed Jun. 29, 2016, and Provisional U.S. Patent Application No. 62/411,223, filed Oct. 21, 2016, the disclosures of which are incorporated herein by reference in their entireties.

BACKGROUND

A load control system may include one or more electrical loads that a user may wish to control via a single load control device. These electrical loads may include, for example, lighting loads, HVAC units, motorized window treatment or projection screens, humidity control units, audio systems or amplifiers, Internet of Things (IoT) devices, and/or the like.

During the installation of typical load control systems, standard mechanical switches, such as traditional toggle switches or decorator paddle switches, may be replaced by more advanced load control devices. However, such an installation procedure typically requires that the existing mechanical switch be disconnected from the electrical wiring and removed from a wallbox in which it is mounted, and that the load control device then be connected to the electrical wiring and installed in the wallbox. An average consumer may not feel comfortable performing the electrical wiring required in such an installation. Accordingly, such a procedure may typically be performed by an electrical contractor or other skilled installer, but hiring an electrical contractor may be cost prohibitive to the average consumer.

Moreover, in some installations, the standard mechanical switches may be kept in place (or not part of the system at all) and supplemented with one or more remote control devices that are installed and incorporated into the load control system. The remote control devices may be mounted to different structures and in a variety of different orientations, which for example, may be unknown to the device prior to installation. For example, the remote control devices may be mounted over an existing standard mechanical switch or affixed directly to the surface of the wall, and the orientation of the device may be at least partially determined by the installer. Additionally, the remote control devices may be standalone devices, such as tabletop or handle devices that may be placed or held in a variety of orientations.

SUMMARY

Described herein are control devices (e.g., load control devices, remote control devices, etc.) that are configured for use in a load control system. A remote control device may include a mounting structure (e.g., an adaptor, a base portion, a tabletop pedestal, etc.) and a control unit. The control unit configured to be mounted in a plurality of orientations (e.g., attached to the mounting structure in a plurality of orientations, attached to different types of mounting structures, etc.). The control unit may include a rotating portion that is rotatable with respect to the mounting structure. The control unit is rectangular in shape.

The mounting structure may be configured to be attached to a load control device that is configured to control an amount of power delivered to the electrical load that is electrically connected to the load control device. For example, the mounting structure may be configured to be attached to a yoke of the load control device, configured to be attached to a mechanical switch of the load control device, and/or configured to be attached a between a bezel portion of the load control device and an opening of a faceplate. In some instances, the remote control device may be a tabletop device or a handheld device. Further, in some instances, the remote control device may be configured to be mounted directed to a wall or into a standard electrical wallbox.

The control unit may include a user interface (e.g., a symmetric user interface), an orientation sensing circuit, and a communication circuit (e.g., a wireless communication circuit). The user interface of the control unit comprises a capacitive touch circuit. The control unit configured to determine an orientation of the control unit via the orientation sensing circuit, and translate a user input from the user interface into control data based on the orientation of the control unit, where the control data configured to control an electrical load of the load control system. The control unit is also configured to cause the communication circuit to transmit a control signal comprising the control data. The control data may be configured to control an intensity or a color of a lighting load of the load control system.

The orientation sensing circuit may include a switch that is configured to be closed (e.g., conductive) when the control unit is in a first orientation and open (e.g., non-conductive) when the control unit is in a second orientation. The switch may include an electrical contact pad and/or a shorting member, a tactile switch and/or a protrusion, a gravity switch, a mercury switch, etc. The orientation sensing circuit may include a ball and a light emitting diode (LED) sensor, a photosensitive device, an optocoupler that comprises an infra-red (IR) light emitting diode (LED) and a photodiode, an inductive sensor, a hall-effect sensor circuit, a manually operated switch, an accelerometer, a gyroscope, and/or the like.

The control unit may be configured to automatically determine the orientation of the control unit upon the control unit being attached to the mounting structure. The control unit may be configured to determine the orientation of the control unit each time the control unit wakes up from an off or sleep state. The control unit may be configured to translate user inputs that correspond to on and off commands of the electrical load to respective control data based on the orientation of the control unit. Alternatively or additionally, the control unit may be configured to translate user inputs that correspond to raise and lower commands of the electrical load to respective control data based on the orientation of the control unit.

The user interface may be configured to provide, via visual indicators of the control unit, a visual indication of an amount of power delivered to the electrical load based on the orientation of the control unit. For example, the user interface may be configured to emit an amount of light that corresponds to the amount of power delivered to the electrical load based on the orientation of the control unit. Alternatively or additionally, the user interface comprises a plurality of light emitting diodes (e.g., arranged as a light bar) that are arranged in a linear array and that are configured to provide the visual indication based on the orientation of the control unit. For example, the array of light emitting diodes may defines a first end of the visual indication that corresponds to a high-end amount of power and an opposed second end of the visual indication that corresponds to a low-end amount of power. The control unit may be configured to determine the relative locations of the first and second ends of the visual indication based on the orientation of the control unit.

In examples where the LEDs are arranged as a light bar, the light bar may define a starting point of the visual indication that corresponds to low-end amount of power and an ending point of the visual indication that corresponds to a high-end amount of power, and the control unit may be configured to determine the relative locations of the starting point and ending point of the visual indication based on the orientation of the control unit. In some examples, the starting point and the ending point are the same location or adjacent locations on the light bar. Moreover, the starting point and the ending point are located at a bottom of the light bar.

The control unit may be configured to receive the orientation during a configuration mode of the control unit, for example, when the control unit is placed into the configuration mode via a unique user input via the user interface and/or placed into the configuration mode via an external device. The remote control device may also be paired with an electrical load of the load control system during the configuration mode. The control unit may be configured to receive the orientation of the control unit from an external device (e.g., smartphone, tablet, etc.) via the communication circuit. The external device may be configured to determine the orientation of the control unit using a camera of the external device. In such instances, the control unit may be configured to illuminate light sources of the control unit in a unique pattern to communicate the orientation of the control unit.

DETAILED DESCRIPTION

Figure 1:
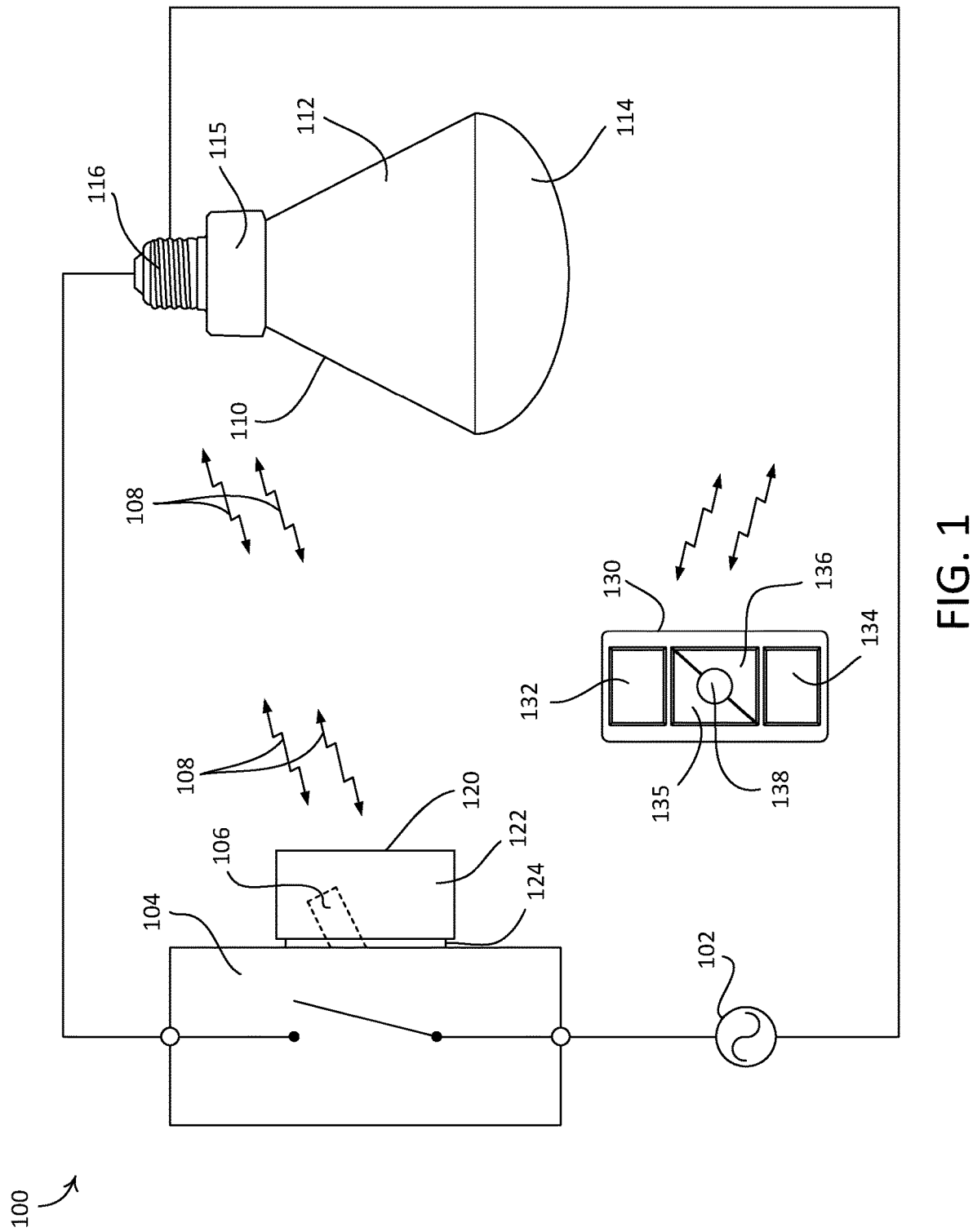
FIG. 1 depicts an example load control system that includes an example remote control device.

FIG. 1 depicts an example load control system 100. As shown, the load control system 100 may be configured as a lighting control system that may include an electrical load (e.g., such as a controllable light source 110), and a remote control device 120 (e.g., such as a battery-powered rotary remote control device). The load control system 100 may include a standard, single pole single throw (SPST) maintained mechanical switch 104 (e.g., a "toggle switch" or a "light switch"). The switch 104 may be in place prior to installation of the remote control device 120 (e.g., pre-existing in the load control system 100). The switch 104 may be electrically coupled (e.g., in series) between an alternating current (AC) power source 102 and the controllable light source 110. The switch 104 may include a toggle actuator 106 that may be actuated to toggle (e.g., to turn on and/or turn off) the controllable light source 110. The controllable light source 110 may be electrically coupled to the AC power source 102 when the switch 104 is closed (e.g., conductive), and may be disconnected from the AC power source 102 when the switch 104 is open (e.g., nonconductive).

The remote control device 120 may include a control unit. The control unit may include a control circuit, one or more input devices, a wireless communication circuit (e.g., a radio frequency (RF) transceiver), memory, a power supply (e.g., a battery), a feedback mechanism (e.g., one or more light emitting diodes (LEDs), an orientations sensing circuit, etc.

The input devices, such as actuators, a touch sensitive surface (e.g., a capacitive touch circuit response to a capacitive touch surface), a rotary knob, etc. The remote control device 120 may be configured to receive user inputs via the user input devices, and additionally may be configured to receive user inputs via external input devices, such as a battery-powered, remote control device 130. Accordingly, the remote control device 120 may be configured to translate the user inputs into control data for controlling one or more electrical loads, such as the controllable light source 110. The remote control device 120 may be configured to transmit one or more control signals that include the control data for controlling the one or more electrical loads. For example, the remote control device 120 may be operable to transmit wireless signals, for example radio frequency (RF) signals 108, to the controllable light source 110. The wireless signals may be used to control the one or more characteristics (e.g., intensity, color, etc.) of the controllable light source 110. The controllable light source 110 may be associated with the remote control device 120 (e.g., during a configuration procedure of the load control system 100) such that the controllable light source 110 may be responsive to the RF signals 108 transmitted by the remote control device 120. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The control circuit of the remote control device 120 may be configured to detect point actuations and/or gestures using the touch sensitive circuit, and generate control data for controlling an electrical load, such as the controllable light source 110, accordingly. A point actuation, as described herein, may be characterized by a contact applied at a specific location of a detection surface (e.g., a touch sensitive surface). Examples of point actuations may include a "tap" or "poke" (e.g., a quick touch and release applied at a single point of detection), a "press and hold" (e.g., a finger press applied at a single point of detection for a period of time), and a "double tap" (e.g., two taps applied in quick succession at a single point of detection). A user input device sensitive to point actuations (e.g., the touch sensitive surface) may be configured to detect a point actuation and generate an output signal indicating the detection. Such a user input device may be further configured to interpret other types of user inputs as multiple, continuous point actuations. For example, the user input device may be configured to detect a finger sliding or dragging across a touch sensitive surface and interpret such a "slide" or "drag" as multiple, continuous point actuations. The user input device may generate multiple output signals in response to the "slide" or "drag" (e.g., one output signal corresponding to each of the point actuations).

A gesture, as described here, may be distinguishable from a point actuation in at least a spatial and/or timing aspect. A gesture may represent a motion associated with specific timing characteristics. A user input device sensitive to gestures may be configured to detect a gesture, interpret the gesture as a single action, and generate an output signal indicating the detection and/or action. Gestures may be contact based (e.g., effectuated via one or more physical contacts with a detection surface), or non-contact based (e.g., effectuated without direct physical contact with a detection surface).

Contact based gestures, as described herein, may include a "swipe," a "smack," a multi-finger "pinch," a multi-finger "spread" or "open," and/or the like. A "smack" may be characterized by contacts applied at multiple locations of a detection surface within a predetermined time window (e.g., a narrow time window for detecting simultaneity of the contacts). Contacts with multiple locations may indicate that multiple fingers, palm of a hand, and/or the like, are involved, and a narrow time window may indicate that the contacts are brief and simultaneous to indicate a smacking motion. A "swipe" may be characterized by consecutive contacts with multiple locations within a brief time period. Consecutive contacts with multiple locations may indicate a movement (e.g., by one or more fingers) over the detection surface, and the brevity of time may indicate that the movement was performed with quickness to indicate a swiping motion. A multi-finger "pinch" may be characterized by multiple fingers (e.g., two fingers) moving together, and a multi-finger "spread" or "open" may be characterized by multiple fingers (e.g., two fingers) moving apart. It should be noted that the terms used to describe the above gestures may be varied and should not limit the scope of the disclosure. Gestures may be user-programmable, reprogrammable, and custom gestures. For example, a user may pre-program a control device (e.g., via a mobile app) to recognize additional gestures such as a "rotate," a "zig-zag," and/or a "circling" motion as commands to control a certain operational aspect of an electrical load.

Non-contact based gestures, as described herein, may include various hand, arm, or body movements in front of a detection surface. For example, the user input unit may be configured to detect, via a capacitive touch element, a finger hovering over a front surface of the control device and interpret such a motion as a command to change a state of the control device or an electrical load controlled by the control device. Such non-contact based gestures may be detected by a touch sensitive device (e.g., a capacitive based touch surface) even without physical contact with the surface, for example, as long as the gestures are within a limited distance from the touch sensitive device (e.g., within 2 cm).

It should be appreciated that the control circuit is not limited to interpreting signals associated with the above-described example gestures, and that the control circuit may be configured to interpret signals associated with more, fewer, or different gestures as desired. The touch sensitive surface may define one linear column (e.g., a one-dimensional column) that may provide a Y-axis output. However, it should further be appreciated that the remote control device 120 is not so limited. For example, the touch sensitive surface may define, for example, two, three, or more linear columns that may provide respective Y-axis outputs, one or more linear rows that provide respective X-axis outputs, or any combination thereof. The touch sensitive surface may also be, for example, a multi-dimensional touch element, such as a two-dimensional touch element having both X-axis and Y-axis outputs. Such implementations may enable the remote control device 120 to control multiple electrical loads from the control unit. For example, gestures applied to a first capacitive touch column of the capacitive touch circuit may cause commands to be issued to a first lighting load associated with the first capacitive touch column, gestures applied to a second capacitive touch column of the capacitive touch circuit may cause commands to be issued to a second lighting load associated with the second capacitive touch column, and gestures applied simultaneously to both the first and second capacitive touch columns may cause a command to be issued to both the first and second lighting loads.

The control circuit may be configured to associate particular user gestures with predetermined scenes, such as predefined lighting scenes for example. The control circuit may be configured to enable one or more of user-programmable, reprogrammable, and custom gestures. Further, the control circuit may be configured to associate particular user gestures with predetermined scenes, such as predefined lighting scenes for example.

The controllable light source 110 may include an internal lighting load (not shown), such as, for example, a light-emitting diode (LED) light engine, a compact fluorescent lamp, an incandescent lamp, a halogen lamp, or other suitable light sources. The controllable light source 110 may include a housing 112. The housing 112 may comprise an end portion 114 through which light emitted from the lighting load may shine. The controllable light source 110 may include an enclosure 115 configured to house one or more electrical components of the controllable light source 110 (e.g., such as an integral load control circuit (not shown). The one or more electrical components may be operable to control the intensity of the lighting load between a low-end intensity (e.g., approximately 1%) and a high-end intensity (e.g., approximately 100%). The one or more electrical components may be operable to control the color of the light emitted by the controllable light source 110. For example, when the controllable light source 110 is an LED light source, the one or more electrical components may be operable to control the color of the LED in a color temperature control mode or a full-color control mode.

The controllable light source 110 may include a wireless communication circuit (not shown) housed inside the enclosure 115, such that the controllable light source 110 may be operable to receive the RF signals 108 transmitted by the remote control device 120, and to control the intensity and/or color of the lighting load in response to the received RF signals. The enclosure 115 may be attached to the housing 112 (e.g., as shown in FIG. 1). The enclosure 115 may be integral with (e.g., monolithic with) the housing 112, such that the enclosure 115 may define an enclosure portion of the housing 112. The controllable light source 110 may include a screw-in base 116 configured to be screwed into a standard Edison socket, such that the controllable light source may be coupled to the AC power source 102. The controllable light source 110 may be configured as a down-light (e.g., as shown in FIG. 1) that may be installed in a recessed light fixture. The controllable light source 110 may not be limited to the illustrated screw-in base 116, and may include any suitable base (e.g., a bayonet-style base or other suitable base providing electrical connections).

The switch 104 may be in place prior to installation of the remote control device 120 (e.g., pre-existing in the load control system 100). The switch 104 may be configured to perform simple tasks such as turning on and/or turning off (e.g., via the toggle actuator 106) the controllable light source 110. An example purpose of the remote control device 120 may be to allow a user to control additional aspects of the controllable light source 110 (e.g., such as light intensity and color). Another example purpose of the remote control device 120 may be to provide a user with feedback regarding the type and/or outcome of the control exercised by the user. As described herein, both of the foregoing purposes may be fulfilled with limited or no additional electrical wiring work.

The remote control device 120 may be configured to be attached to the switch 104, for example, to the toggle actuator 106 of the switch 104. For example, the remote control device 120 may be attached to the toggle actuator 106 when it is in the on position (e.g., pointing upwards) and when the switch 104 is closed and conductive. As shown in FIG. 1, the remote control device 120 may include an actuation portion 122 (e.g., a rotating portion) and a base portion 124. The base portion 124 may be configured to be mounted over the toggle actuator 106 of the switch 104. The actuation portion 122 may be supported by the base portion 124 and may be rotatable about the base portion 124. The base portion 124 may be configured to maintain the toggle actuator 106 in the on position. In this regard, the base portion 124 may be configured such that a user is not able to inadvertently switch the toggle actuator 106 to the off position when the remote control device 120 is attached to the switch 104. Greater detail of the remote control device 120 will be provided herein, after a brief discussion of other components that may be included in the load control system 100.

The load control system 100 may include one or more other devices configured to communicate (e.g., wirelessly communicate) with the controllable light source 110. For example, the load control system 100 includes the battery-powered, remote control device 130 (e.g., as shown in FIG. 1) for controlling the controllable light source 110. The remote control device 130 may include one or more actuators, for example, an on button 132, an off button 134, a raise button 135, a lower button 136, and a preset button 138, as shown in FIG. 1. The remote control device 130 may include a wireless communication circuit (not shown) for transmitting digital messages (e.g., including commands to control the light source 110) to the controllable light source 110 (e.g., via the RF signals 108) responsive to actuations of one or more of the buttons 132, 134, 135, 136, and 138. The remote control device 130 may be handheld, mounted to a wall, or supported by a pedestal (e.g., a pedestal configured to be mounted on a tabletop). Examples of battery-powered remote controls are described in greater detail in commonly assigned U.S. Pat. No. 8,330,638, issued Dec. 11, 2012, entitled "Wireless Battery Powered Remote Control Having Multiple Mounting Means," and U.S. Pat. No. 7,573,208, issued Aug. 22, 1009, entitled "Method Of Programming A Lighting Preset From A Radio-Frequency Remote Control," the entire disclosures of which are hereby incorporated by reference.

The load control system 100 may include one or more of a remote occupancy sensor or a remote vacancy sensor (not shown) for detecting occupancy and/or vacancy conditions in a space surrounding the sensors. The occupancy or vacancy sensors may be configured to transmit digital messages to the controllable light source 110, for example via the RF signals 108, in response to detecting occupancy or vacancy conditions. Examples of RF load control systems having occupancy and vacancy sensors are described in greater detail in commonly-assigned U.S. Pat. No. 7,940,167, issued May 10, 2011, entitled "Battery Powered Occupancy Sensor," U.S. Pat. No. 8,009,042, issued Aug. 30, 2011, entitled "Radio Frequency Lighting Control System With Occupancy Sensing," and U.S. Pat. No. 8,199,010, issued Jun. 12, 2012, entitled "Method And Apparatus For Configuring A Wireless Sensor," the entire disclosures of which are hereby incorporated by reference.

The load control system 100 may include a remote daylight sensor (not shown) for measuring a total light intensity in the space around the daylight sensor. The daylight sensor may be configured to transmit digital messages, such as a measured light intensity, to the controllable light source 110, for example via the RF signals 108, such that the controllable light source 110 is operable to control the intensity of the lighting load in response to the measured light intensity. Examples of RF load control systems having daylight sensors are described in greater detail in commonly assigned U.S. patent application Ser. No. 12/727,956, filed Mar. 19, 2010, entitled "Wireless Battery-Powered Daylight Sensor," and U.S. patent application Ser. No. 12/727,923, filed Mar. 19, 2010, entitled "Method Of Calibrating A Daylight Sensor," the entire disclosures of which are hereby incorporated by reference.

The load control system 100 may include other types of input devices, for example, radiometers, cloudy-day sensors, temperature sensors, humidity sensors, pressure sensors, smoke detectors, carbon monoxide detectors, air-quality sensors, security sensors, proximity sensors, fixture sensors, partition sensors, keypads, kinetic or solar-powered remote controls, key fobs, cell phones, smart phones, tablets, personal digital assistants, personal computers, laptops, time clocks, audio-visual controls, safety devices, power monitoring devices (e.g., such as power meters, energy meters, utility submeters, utility rate meters, etc.), central control transmitters, residential, commercial, or industrial controllers, or any combination of these input devices.

The controllable light source 110 may be associated with a wireless control device (e.g., the remote control device 120) during a configuration procedure of the load control system 100. For example, the association may be accomplished by actuating an actuator on the controllable light source 110 and then actuating (e.g., pressing and holding) an actuator on the wireless remote control device for a predetermined amount of time (e.g., approximately 10 seconds), and/or for example, through the use of an external device (e.g., a smartphone or tablet, a system controller, etc.).

Digital messages transmitted by the remote control device 120 (e.g., messages directed to the controllable light source 110) may include a command and identifying information, such as a unique identifier (e.g., a serial number) associated with the remote control device 120. After being associated with the remote control device 120, the controllable light source 110 may be responsive to messages containing the unique identifier of the remote control device 120. The controllable light source 110 may be associated with one or more other wireless control devices of the load control system 100 (e.g., the remote control device 130, the occupancy sensor, the vacancy sensor, and/or the daylight sensor), for example using similar association process. Alternatively or additionally, the controllable light source 100 may be associated with a wireless control device via a central controller, through the use of a mobile application residing on an external device, such as a smartphone or tablet, and/or the like.

After a remote control device (e.g., the remote control device 120 or the remote control device 130) is associated with the controllable light source 110, the remote control device may be used to associate the controllable light source 110 with the occupancy sensor, the vacancy sensor, and/or the daylight sensor (e.g., without actuating the actuator 118 of the controllable light source 110). Examples for associating an electrical load with one or more sensors are described in greater detail in commonly-assigned U.S. patent application Ser. No. 13/598,529, filed Aug. 29, 2012, entitled "Two Part Load Control System Mountable To A Single Electrical Wallbox," the entire disclosure of which is hereby incorporated by reference.

In an example configuration, the remote control device 120 may be mounted over a toggle actuator of a switch (e.g., the toggle actuator 106). In such a configuration, the base portion 124 may function to secure the toggle actuator 106 from being toggled. For example, the base portion 124 may be configured to maintain the toggle actuator 106 in an on position, such that a user of the remote control device 120 is not able to mistakenly switch the toggle actuator 106 to the off position (e.g., which may disconnect the controllable light source 110 from the AC power source 102). Maintaining the toggle actuator 106 in the on position may also prevent the controllable light source 110 from being controlled by one or more remote control devices of the load control system 100 (e.g., the remote control devices 120 and/or 130), which may cause user confusion.

The remote control device 120 may be battery-powered (e.g., not wired in series electrical connection between the AC power source 102 and the controllable light source 110). Since the mechanical switch 104 is kept closed (e.g., conductive), the controllable light source 110 may continue to receive a full AC voltage waveform from the AC power source 102 (e.g., the controllable light source 110 does not receive a phase-control voltage that may be created by a standard dimmer switch). Because the controllable light source 110 receives the full AC voltage waveform, multiple controllable light sources (e.g., more than one controllable light sources 110) may be coupled in parallel on a single electrical circuit (e.g., coupled to the mechanical switch 104). The multiple controllable light sources may include light sources of different types (e.g., incandescent lamps, fluorescent lamps, and/or LED light sources). The remote control device 120 may be configured to control one or more of the multiple controllable light sources, for example substantially in unison. In addition, if there are multiple controllable light sources coupled in parallel on a single circuit, each controllable light source may be zoned, for example to provide individual control of each controllable light source. For example, a first controllable light 110 source may be controlled by the remote control device 120, while a second controllable light source 110 may be controlled by the remote control device 130.

The remote control device 120 may be part of a larger RF load control system than that depicted in FIG. 1. Examples of RF load control systems are described in commonly-assigned U.S. Pat. No. 5,905,442, issued on May 18, 1999, entitled "Method And Apparatus For Controlling And Determining The Status Of Electrical Devices From Remote Locations," and commonly-assigned U.S. Patent Application Publication No. 2009/0206983, published Aug. 20, 2009, entitled "Communication Protocol For A Radio Frequency Load Control System," the entire disclosures of which are incorporated herein by reference.

While the load control system 100 was described with reference to the single-pole system shown in FIG. 1, one or both of the controllable light source 110 and the remote control device 120 may be implemented in a "three-way" lighting system having two single-pole double-throw (SPDT) mechanical switches (e.g., a "three-way" switch) for controlling a single electrical load. For example, the system could comprise two remote control devices 120, with one remote control device 120 connected to the toggle actuator of each SPDT switch. The toggle actuators of the respective SPDT switches may be positioned such that the SPDT switches form a complete circuit between the AC source and the electrical load before the remote control devices 120 are installed on the toggle actuators.

The load control system 100 shown in FIG. 1 may provide a retrofit solution for an existing load control system. The load control system 100 may provide energy savings and/or advanced control features, for example without requiring significant electrical re-wiring and/or without requiring the replacement of existing mechanical switches. As an example, to install and use the load control system 100 of FIG. 1, a consumer may replace an existing lamp with the controllable light source 110, switch the toggle actuator 106 of the mechanical switch 104 to the on position, install (e.g., mount) the remote control device 120 onto the toggle actuator 106, and associate the remote control device 120 with the controllable light source 110, as described herein.

It should be appreciated that the load control system 100 is not limited to including the controllable light source 110. For example, the load control system 100 may include a plug-in load control device for controlling an external lighting load (e.g., in lieu of the controllable light source 110). For example, the plug-in load control device may be configured to be plugged into a receptacle of a standard electrical outlet that is electrically connected to an AC power source. The plug-in load control device may have one or more receptacles to which one or more plug-in electrical loads (e.g., a table lamp or a floor lamp) may be plugged. The plug-in load control device may be configured to control the intensity and/or light color of the lighting loads plugged into the receptacles of the plug-in load control device. It should further be appreciated that the remote control device 120 is not limited to being associated with, and controlling, a single electrical load (e.g., a load control device, such as a plug-in load control device). For example, the remote control device 120 may be configured to control multiple controllable electrical loads (e.g., substantially in unison).

For example, the load control system 100 may include more or fewer lighting loads, other types of lighting loads, and/or other types of electrical loads that may be configured to be controlled by the one or more load control devices (e.g., the remote control device 120, the remote control device 130, and/or the like). For example, the load control system 100 may include one or more of: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Examples of remote control devices configured to be mounted over existing switches (e.g., light switches) are described in greater detail in commonly-assigned U.S. Patent Application Publication No. 2014/0117871, published May 4, 2016, and U.S. Patent Application Publication No. 2015/0371534, published Dec. 24, 2015, both entitled "Battery-Powered Retrofit Remote Control Device," the entire disclosures of which are hereby incorporated by reference.

Figure 2A:
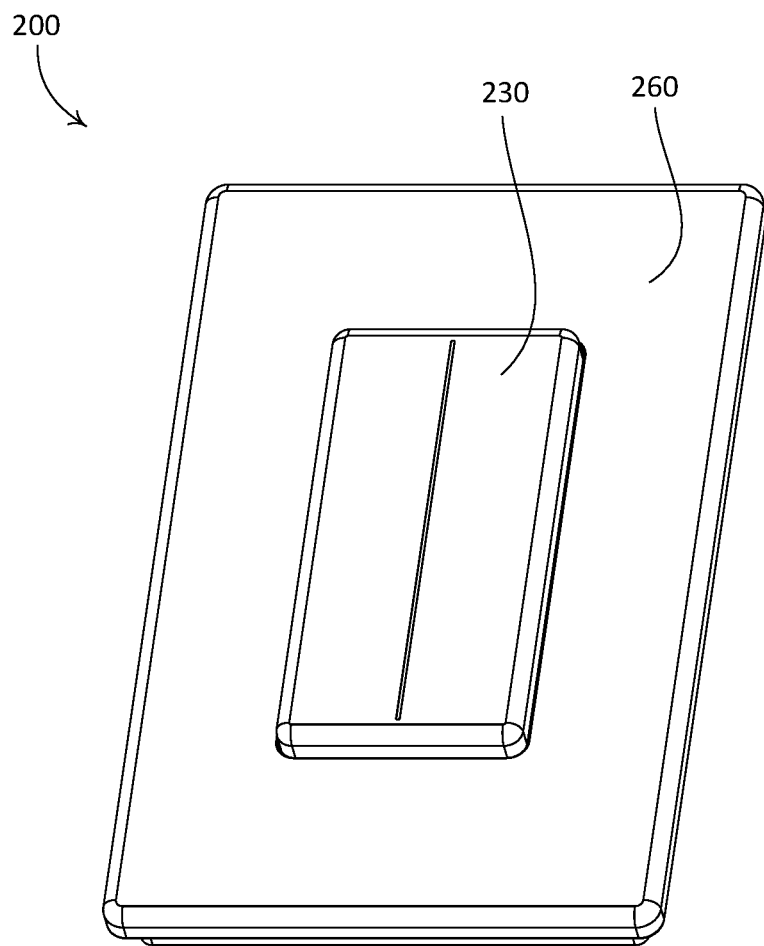
FIG. 2A is a perspective view of an example remote control device.
Figure 2B:
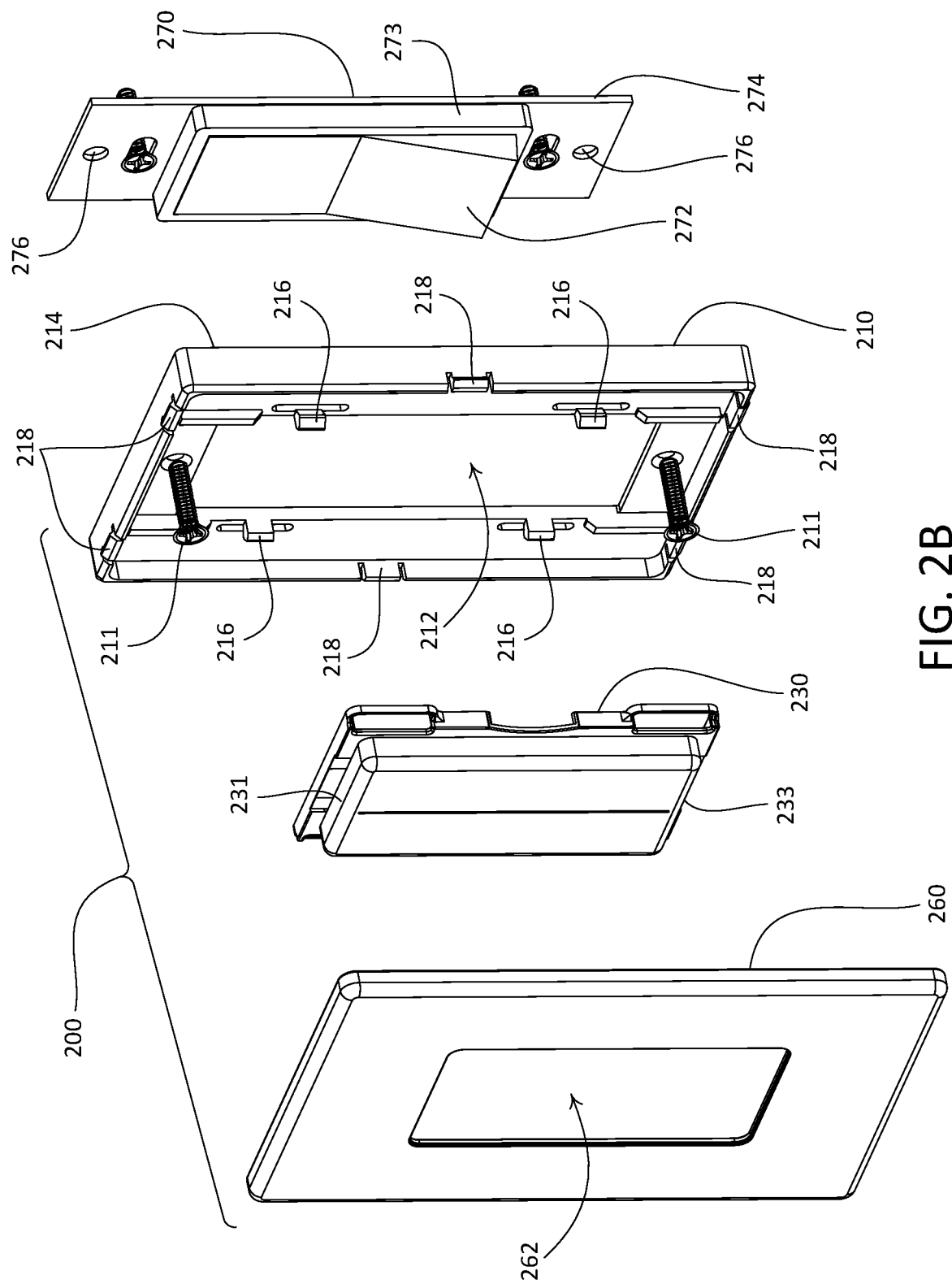
FIG. 2B is an exploded view of the example remote control device illustrated in FIG. 2A.

FIGS. 2A and 2B depict an example remote control device 200 that may be installed in a load control system, such as a lighting control system. The remote control device 200 (e.g., a battery-powered remote control device) that may be deployed, for example, as the remote control device 120 of the load control system 100 shown in FIG. 1. The load control system may include a mechanical switch 270 that may be in place prior to installation of the remote control device 200, for example pre-existing in the load control system. As shown, the mechanical switch 270 may be a standard decorator paddle switch. The load control system may further include one or more electrical loads, such as lighting loads. The mechanical switch 270 may be coupled in series electrical connection between an alternating current (AC) power source and the one or more electrical loads. The mechanical switch 270 may include an actuator 272 that may be actuated to turn on and/or turn off, the one or more electrical loads. The mechanical switch 270 may include a yoke 274 that enables mounting of the mechanical switch 270 to a structure. For example, the yoke 274 may be fastened to a single-gang wallbox that is installed in an opening of a wall.

The remote control device 200 may include an adapter 210, a control unit 230, and a faceplate 260. Prior to installation of the remote control device 200, a pre-existing faceplate (not shown) may be removed from the mechanical switch 270, for instance by removing faceplate screws (not shown) from corresponding faceplate screw holes 276 in the yoke 274. The adapter 210 and/or faceplate 260 may operate as a mounting structure for the control unit 230. The adapter 210 may be made of any suitable material, such as plastic. The adapter 210 may be configured to be attached to the yoke 274 of the mechanical switch 270. For example, the adapter 210 may be secured to the yoke 274 using fasteners, such as screws 211 that are received through openings 213 in the adapter 210 and installed into the faceplate screw holes 276 in the yoke 274. As shown, the adapter 210 may define an opening 212 that extends therethrough. The opening 212 may be configured to receive a portion of the mechanical switch 270 that may include, for example, the actuator 272 and a frame 273 that surrounds a perimeter of the actuator 272. The adapter 210 may define a rear surface 214 that is configured to abut a surface of a structure to which the mechanical switch 270 is installed, such as a wallboard surface that surrounds a wallbox in which the mechanical switch 270 is installed.

The adapter 210 may be configured to enable removable attachment of the control unit 230 to the adapter 210. For example, the adapter 210 may define one or more attachment members that are configured to engage with complementary features of the control unit 230. As shown, the adapter 210 may define one or more resilient snap fit connectors 216 that are configured to engage with complementary features of the control unit 230. The adapter 210 may be configured to enable removable attachment of the faceplate 260 to the adapter 210. For example, the adapter 210 may define one or more attachment members that are configured to engage with complementary features of the faceplate 260. As shown, the adapter 210 may define one or more resilient snap fit connectors 218 that are configured to engage with complementary features of the faceplate 260.

The faceplate may define a front surface 261 and an opposed rear surface 263. The front surface 261 may alternatively be referred to as an outer surface of the faceplate 260, and the rear surface 263 may alternatively be referred to as an inner surface of the faceplate 260. The faceplate 260 may define an opening 262 therethrough that is configured to receive a portion of the control unit 230, such that the control unit 230 protrudes proud of the faceplate 260 when the remote control device 200 is in an assembled configuration. As shown, the faceplate 260 may define recessed ledges 264 that are configured to engage with corresponding ones of the snap fit connectors 218 of the adapter 210, to releasably attach the faceplate 260 to the adapter 210. The faceplate 260 may be made of any suitable material, such as plastic.

Figure 3A:
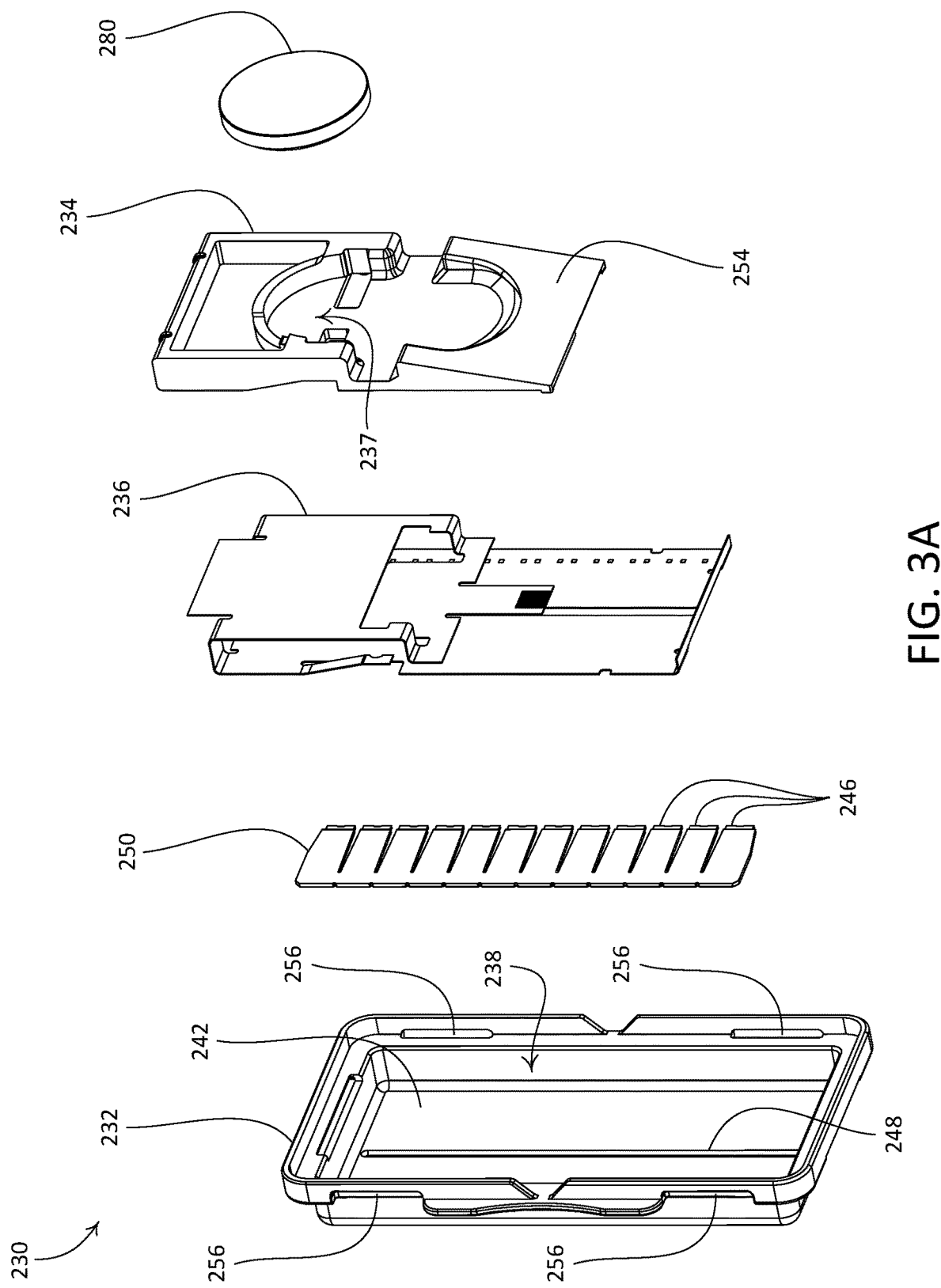
FIG. 3A is an exploded rear perspective view of a control unit component of the example remote control device illustrated in FIG. 2B.
Figure 3B:
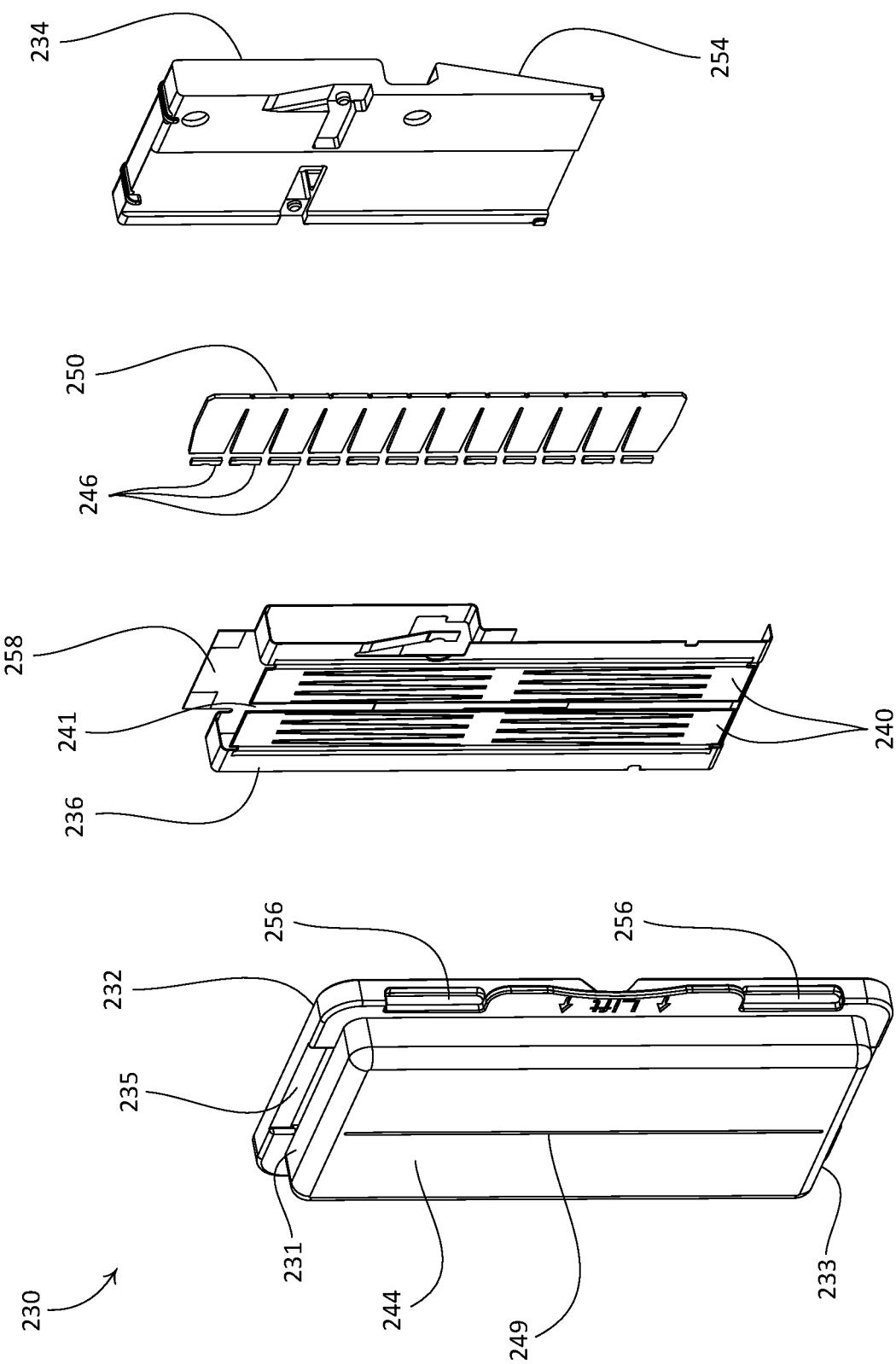
FIG. 3B is an exploded front perspective view of the control unit control unit component of the example remote control device illustrated in FIG. 2B.

As shown in FIGS. 3A and 3B, the control unit 230 may include a cover 232, an insert 234 that is configured to be received in the cover 232, and a flexible circuit board 236 that may be configured to be wrapped around a portion of the insert 234. The cover 232 and the insert 234 may be made of any suitable material, such as plastic. The illustrated control unit 230 is rectangular in shape and is elongate between a first end 231 and an opposed second end 233. It should be appreciated that the control unit 230 is not limited to the illustrated rectangular geometry, and that control unit may be configured with other suitable geometries. In accordance with the illustrated orientation of the control unit 230, the first end 231 may be referred to as an upper end of the control unit 230 and the second end 233 may be referred to as a lower end of the control unit 230. The first and second ends 231, 233 of the control unit 230 may also be referred to as first and second ends of the cover 232, respectively. The cover 232 may define a void 238 that is configured to receive the insert 234 with the flexible circuit board 236 wrapped around the insert 234 in an attached position. The cover 232 may define an inner surface 242 and an opposed outer surface 244. The outer surface 244 of the cover 232 may alternatively be referred to as a front surface of the cover 232, and more generally as an outer surface of the control unit 230.

The control unit 230 may include a touch sensitive circuit (e.g., a capacitive touch circuit) that is configured to receive (e.g., detect) inputs, such as gestures, from a user of the remote control device 220. For example, the flexible circuit board 236 may include one or more capacitive touch elements on a capacitive touch circuit 240 of the flexible circuit board 236. As shown, the capacitive touch circuit 240 faces the inner surface 242 of the cover 232 (e.g., behind the outer surface 244 of the control unit 230) when the flexible circuit board 236 is wrapped around the insert 234 and disposed in the void 238. The one or more capacitive touch elements on the capacitive touch circuit 240 may form multiple (e.g., two) capacitive touch channels or zones 240a, 240b that may be located on both sides of a central vertical axis of the capacitive touch circuit 240. The capacitive touch circuit 240 may be configured to detect touches (e.g., gestures applied on the outer surface 244) along an x axis, a y axis, or both an x and y axis. The capacitive touch circuit 240 may be further configured to detect gestures that are effectuated without any physical contact with the outer surface 244. For example, the capacitive touch circuit 240 may be capable of detecting a hovering finger in the proximity of the outer surface 244 based on changes occurred in the electromagnetic field near the capacitive surface 240. Since the capacitive touch circuit 240 resides behind the outer surface 244 and is capable of detect user inputs applied via the outer surface 244, the outer surface 244 may also regarded herein as a touch sensitive surface.

The control unit 230 may further include a control circuit (not shown) and a wireless communication circuit (not shown). The control circuit and the wireless communication circuit may be mounted to the flexible circuit board 236, for example. The control circuit may be in electrical communication with the capacitive touch circuit 240, and the wireless communication circuit may be in electrical communication with the control circuit. The flexible circuit board 236 may be configured to wrap around the insert 234 such that the capacitive touch circuit 240 is spaced from the control circuit, the wireless communication circuit, and/or other "noisy" circuitry of the flexible circuit board 236 along a direction that extends perpendicular to the outer surface 244 of the cover 232. This may improve operational efficiency of the capacitive touch circuit 240.

The control unit 230 may be battery-powered. For example, as shown, the insert 234 may define a battery compartment 237 that is configured to retain a battery, for instance the illustrated coin cell battery 280, such that the battery is placed in electrical communication with the flexible circuit board 236, for instance to power the capacitive touch circuit 240, the control circuit, the wireless communication circuit, and/or other circuitry of the control unit 230. Alternatively or additionally, the control unit 230 may be configured to derive power from a power source connected to the mechanical switch 270, such as source of AC power for example. The faceplate 260 may be configured to store one or more spare batteries 280, for example in a void defined between an inner surface of the faceplate 260 and the adapter 210.

The control unit 230 may be configured to translate one or more inputs applied via the capacitive touch circuit 240 into respective control data that may be used to control an electrical load of a load control system. For example, the control circuit may be configured to receive signals from the capacitive touch circuit 240 that correspond to inputs, such as point actuation and/or gestures (e.g., as described with reference to FIG. 1), applied to the capacitive touch circuit 240 by a user of the remote control device 200. The control circuit may be configured to interpret the signals into commands that the user desires the control unit 230 to cause to be executed.

As noted above, the control circuit may be configured to recognize a plurality of signals received from the capacitive touch circuit 240 that correspond to user inputs or gestures applied via the capacitive touch surface. The control unit 230 may be configured to provide a visual indication associated with inputs and/or gestures received by the capacitive touch circuit 240. For example, as shown, the control unit 230 may further include a plurality of light emitting diodes (LEDs) 246 that are configured to provide the visual indication. In accordance with the illustrated control unit 230, the plurality of LEDs 246 are arranged in a linear array that extends between the upper and lower ends 231, 233 of the control unit 230, and may be attached to the flexible circuit board 236 approximate to an outer edge thereof. The cover 232 may define an opening that allows light from one or more of the LEDs 246 to be emitted outward from an interior of the cover 232. For example, as shown, the cover 232 defines a narrow slot 248 that extends between the upper and lower ends 231, 233 of the cover 232. The cover 232 may include a light bar 249 that is disposed in the slot 248. The capacitive touch circuit 240 may define a gap 241, for example approximately midway between opposed sides of the flexible circuit board 236 or near a side thereof. The control unit may further include a light guide 250 that may be configured to diffuse light emitted from the LEDs 246 through the gap 241 at respective locations along the slot 248. The light guide 250 may comprise light guide film, for example. It should be appreciated that the control unit 230 is not limited to the illustrated array of LEDs 246 and/or the illustrated geometry of the slot 248.

The cover 232, the capacitive touch circuit 240, the plurality of LEDs 246, and the slot 248 may cooperate with one another to define a capacitive touch interface of the control unit 230, and more generally of the remote control device 200. The capacitive touch interface may be configured to provide a visual indication of a command issued by the remote control device 200. For example, the capacitive touch interface may be configured to, upon receiving a point actuation or gesture indicative of a command to change an amount of power delivered to an electrical load, such as a command to dim a lighting load of a lighting control system, indicate the amount of power delivered to the electrical load by temporarily illuminating a number of the plurality of LEDs 246 that corresponds with the desired amount of power (e.g., the desired dimming level of the lighting load). In such an example, the control circuit may be configured to cause the LEDs 246 to be illuminated simultaneously, to illuminate sequentially with some or little overlap before fading, or to otherwise illuminate as desired.

Figure 4:
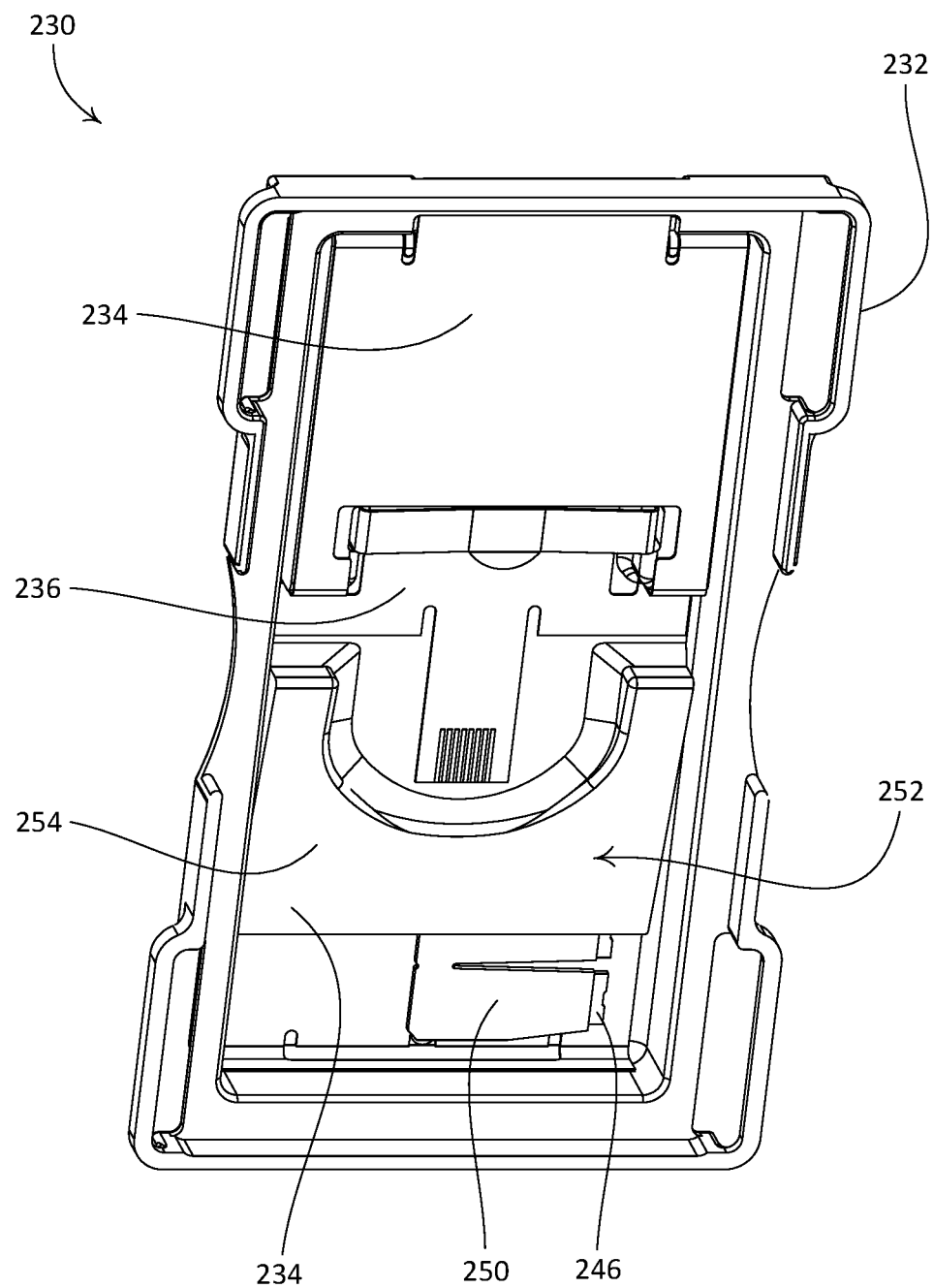
FIG. 4 is a rear perspective view of the control unit component illustrated in FIGS. 3A and 3B, in an assembled configuration.
Figure 5:
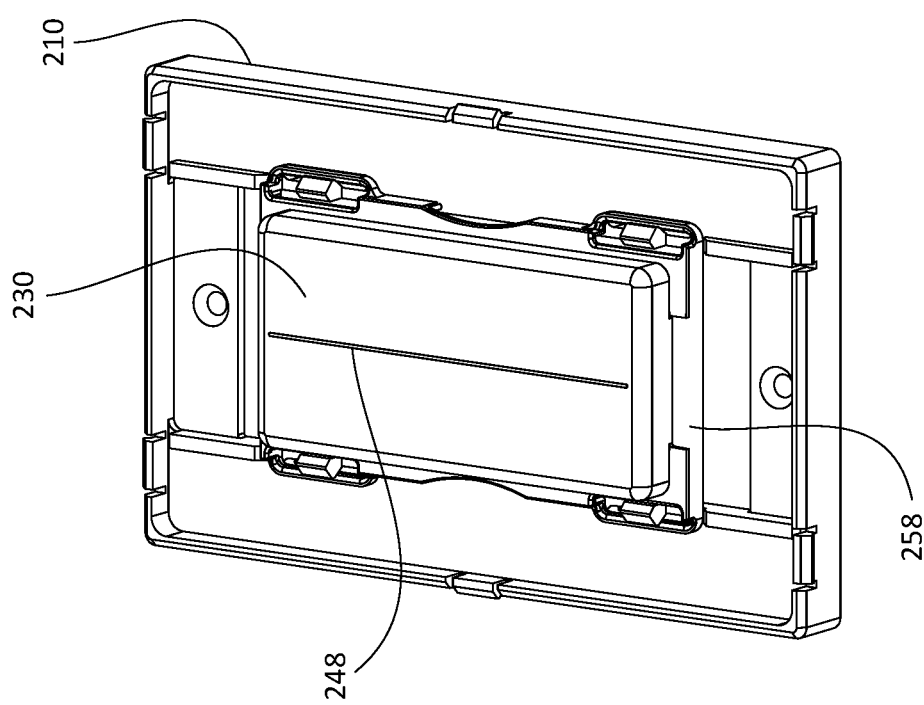
FIG. 5 is a front perspective view of an adapter component and the control unit component of the example remote control device illustrated in FIG. 2B.
Figure 7C:
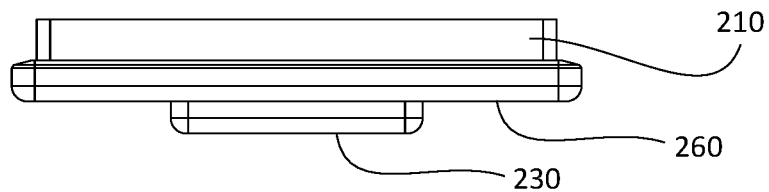
FIG. 7C is a top view of the example remote control device illustrated in FIG. 2A.
Figure 7A:
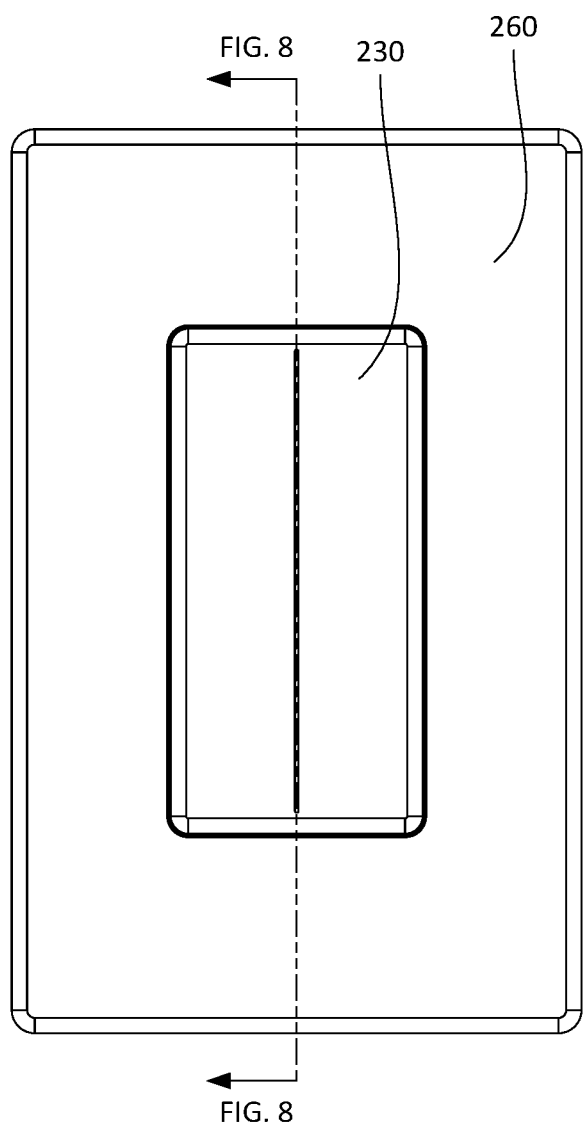
FIG. 7A is a front view of the example remote control device illustrated in FIG. 2A.
Figure 7B:
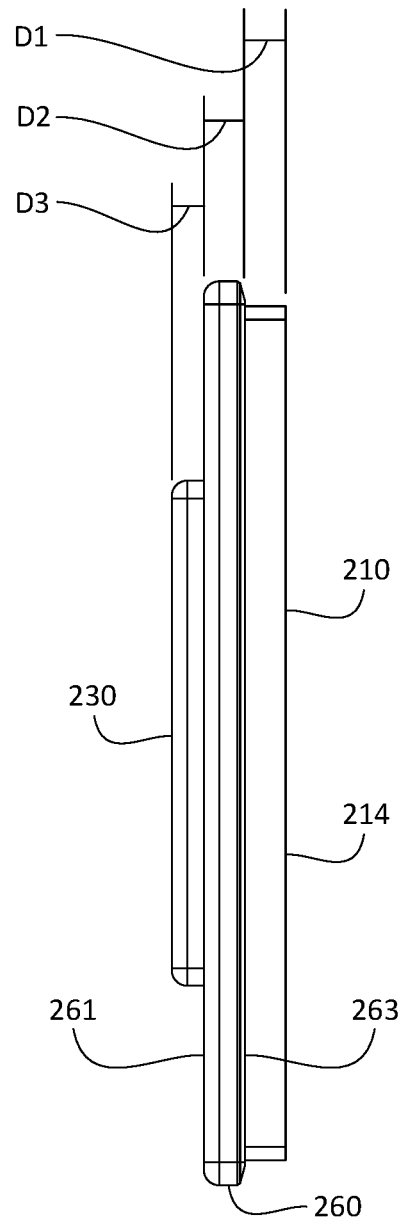
FIG. 7B is a side view of the example remote control device illustrated in FIG. 2A.
Figure 8:
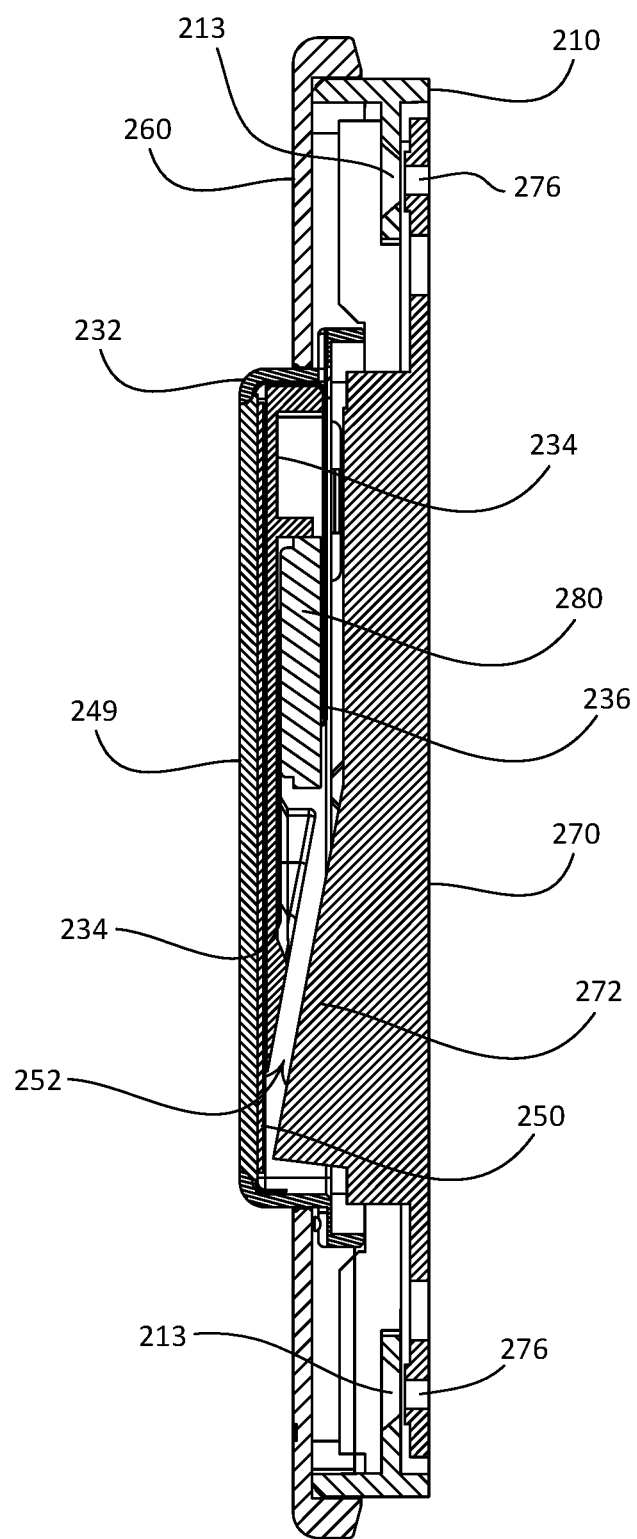
FIG. 8 is a side section view of the example remote control device illustrated in FIG. 2A.

The control unit 230 may be configured to be attached to the adapter 210 in multiple orientations, for example in accordance with a position of the actuator 272 of the mechanical switch 270. For example, the insert 234 may be configured to, when received in the void 238 in the cover 232, define a recess 252 (e.g., as shown in FIGS. 4 and 8) that is configured to receive a portion of the actuator 272 of the mechanical switch 270 when the control unit 230 is attached to the adapter 210. As shown, the insert 234 may define a sloped surface 254 that at least partially defines the recess 252. When the control unit 230 is attached to the adapter 210, the control unit 230 may be oriented such that the recess 252 is positioned over, and receives, a portion of the actuator 272 that protrudes from the mechanical switch 270. To illustrate, if the actuator 272 is in a first position, such that the lower portion of the actuator 272 protrudes, the control unit 230 may be oriented such that the recess 252 is positioned to receive the lower portion of the actuator 272. Alternatively, if the actuator 272 is in a second position, such that the upper portion of the actuator 272 protrudes, the control unit 230 may be oriented such that the recess 252 is positioned to receive the upper portion of the actuator 272. In this regard, the control unit 230 may be configured to be attached to the adapter 210 in at least first and second orientations. As shown, the cover 232 of the control unit 230 may define slots 256 that are configured to receive and engage with corresponding ones of the snap fit connectors 216 of the adapter 210, to releasably attach the control unit 230 to the adapter 210. FIG. 5 illustrates the adapter 210 with the control unit 230 attached thereto.

The control unit 230 may comprise an orientation sensing circuit (not shown), such that the control unit 230 is configured to determine an orientation of the control unit 230. For example, through the use of the orientation sensing circuit, the control circuit 230 may determine its orientation relative to the space where it is installed (e.g., based on gravity) and/or its orientation relative to another component, such as the adapter 210, the faceplate 260, the switch 270, etc. For example, the illustrated control unit 230 may be configured to determine whether the control unit 230 is attached to the adapter 210 in a first orientation in which the recess 252 is located closer to a lower end of the adapter 210, or is attached to the adapter 210 in a second orientation in which the recess 252 is located closer to an upper end of the adapter 210.

The control unit 230 may, for example, determine (e.g., automatically determine) the orientation of the control unit 230 relative to the adapter 210 upon the control unit 230 being mounted to the adapter 210. For example, the control unit may automatically determine the orientation of the control unit 230 relative to the adapter 210 upon the control unit 230 being mounted to the adapter 210 without any user input. Alternatively or additionally, the control unit 230 may determine the orientation of the control unit 230 relative to the adapter 210 each time the control unit 230 wakes up from an off or sleep state.

The orientation sensing circuit may comprise a switch (e.g., a portion of a switch or the entirety of a switch), such as one or more electrical contacts (e.g., an electrical contact pad 258), a tactile switch, a gravity switch, a mercury switch, a ball and LED sensor switch, and/or the like. Alternatively or additionally, the orientation sensing circuit may comprise an optocoupler (e.g., which may include an LED, such as an infra-red (IR) LED, and a photodiode), an inductive sensor, a photosensitive device (e.g., a photodiode), a hall-effect sensor circuit (e.g., or a reed switch), an accelerometer, a gyroscope, the wireless communication circuit of the remote control device 200, and/or other components of the control unit 230. Further, the orientation sensing circuit may be configured such that an orientation of the control unit 230 may be determined (e.g., specified) during a configuration process of the control unit 230, for instance when pairing the remote control device 200 to a load control system (e.g., as described with reference to FIGS. 35 and 36).

As noted above, the orientation sensing circuit may include a switch that includes an electrical contact. In some examples, the adapter 210 or the faceplate 260 may include a second contact that is used to close the switch. For example, the control unit 230 may determine the orientation of the control unit 230 with respect to the adapter 210 based on whether or not the first and second contacts are in electrical communication, where the contacts may be in electrical communication with one another when the control unit 230 is in a first orientation (e.g., the switch is closed and/or the switch is conductive), but not in electrical communication with one another when the control unit 230 is in a second orientation (e.g., the switch is open and/or the switch is non-conductive).

The orientation sensing circuit of the control unit 230 may include a gravity switch or a mercury switch. In such examples, the gravity switch or mercury switch may be oriented on the control unit 230 such that the gravity or mercury switch is configured to be in a closed position when the control unit 230 is connected to the adapter plate 210 in a first orientation, and in an open position when the control unit 230 is connected to the adapter plate 210 in a second orientation. Accordingly, the control unit 230 may be configured to determine the orientation of the control unit 230 with respect to the adapter 210 based on whether the gravity switch or mercury switch is in the open or closed position.

Figure 6:
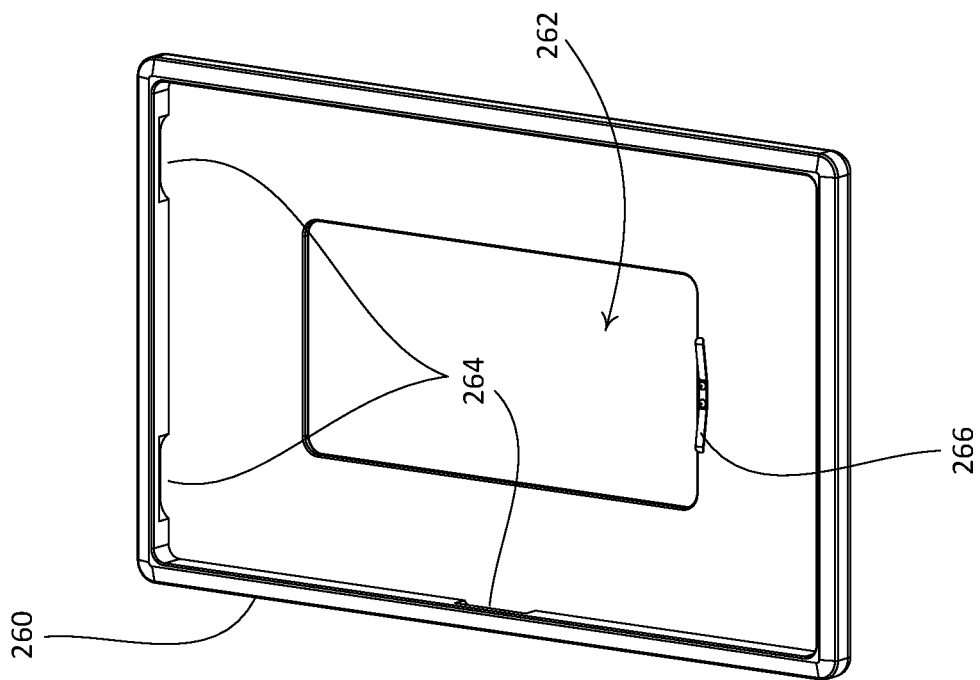
FIG. 6 is a rear perspective view of a faceplate component of the example remote control device illustrated in FIG. 2B.

For instance, with reference to FIGS. 5 and 6, the orientation sensing circuit may comprise a switch that includes an electrical contact pad 258, and the control unit 230 may be configured to determine the orientation of the control unit 230 with respect to the adapter 210 based on whether or not the electrical contact pad 258 is in electrical communication with a shorting member 266 of the faceplate 260. For example, as shown in FIG. 3B, the flexible circuit board 236 may define the electrical contact pad 258 that is configured to be received in a recess 235 defined by the cover 232, such that the electrical contact pad 258 is exposed. The faceplate 260 may include a shorting member 266 that is located along a lower edge of the opening 262. The faceplate 260 may define one or more markings (not shown) to ensure proper orientation of the faceplate 260, and thus the shorting member 266, when attaching the faceplate 260 to the adapter 210. The control circuit of the control unit 230 may be configured to determine whether the control unit 230 is in the first or second orientation based upon whether or not the shorting member 266 is placed into electrical communication with the electrical contact pad 258 when the faceplate 260 is attached to the adapter 210. In this regard, the control unit 230 may be configured to determine an orientation of the control unit 230 relative to the faceplate 260, and thereby an orientation of the control unit 230 relative to the adapter 210.

The orientation sensing circuit of the control unit 230 may include a tactile switch, and the faceplate 260 or the adapter 210 may include a protrusion (not shown). For example, if the adapter 210 includes the protrusion, then the protrusion may be configured to actuate the tactile switch when the control unit 230 is attached to the adapter 210 in the first orientation, but not actuate the tactile switch when the control unit 230 is attached to the adapter 210 in the second orientation. As such, the control unit 230 may be configured to determine its orientation with respect to the adapter 210. Similarly, if the faceplate includes the protrusion (e.g., and one or more markings, as noted above), then the control unit 230 may be configured to determine whether the control unit 230 is in the first or second orientation based upon whether or not the protrusion actuates the tactile switch when the faceplate 260 is attached to the adapter 210. In this regard, the control unit 230 may be configured to determine an orientation of the control unit 230 relative to the faceplate 260, and thereby an orientation of the control unit 230 relative to the adapter 210.

The orientation sensing circuit of the control unit 230 may include a ball and an LED sensor, which may operate as a switch. When the control unit 230 is attached to the adapter 210 in a first orientation, the ball may be configured to block the LED sensor, thereby closing the switch. Conversely, when the control unit 230 is attached to the adapter 210 in a second orientation, the ball may not block the LED sensor, and the switch may remain open. As such, the control unit 230 may be configured to determine whether the control unit 230 is attached to the adapter 210 in a first orientation or a second orientation based on whether or not the ball and LED sensor is in an open or closed position.

The orientation sensing circuit of the control unit 230 may include a photosensitive device, such as a photodiode, that is configured to detect light that is originates external from the remote control device 200 (e.g., ambient light) and/or internal to the remote control device 200 (e.g., light from the LEDs 246). For example, the remote control device 200 (e.g., the control unit 230, the adapter 210, and/or the faceplate 260) may include one or more of a blocking element (e.g., opaque material) or guiding element (e.g., a notch, channel, components made from translucent material, reflective components, etc.). If the remote control device 200 includes a blocking element, then the blocking element may block light (e.g., internal or external light) from reaching the photosensitive device when the control unit 230 is in the second orientation, but not block light when the control unit 230 is in the first orientation. Similarly, if the remote control device 200 includes a guiding element, then the guiding element may allow light (e.g., internal or external light) to reach the photosensitive device when the control unit 230 is in the first orientation, but not allow light to reach the photosensitive device when the control unit 230 is in the second orientation. Therefore, the control unit 230 may be configured to determine whether the control unit 230 is attached to the adapter 210 in a first orientation or a second orientation based on whether or not the photosensitive device detects light.

For example, the adapter 210 and/or faceplate 260 may include a notch or channel (not shown) that is configured to line up with the photosensitive device when the control unit 230 is attached to the adapter 210 in a first orientation, but not line up with the photosensitive device when the control unit 230 is attached to the adapter 210 in a second orientation. The notch or channel may define an opening through the adapter 210 or faceplate 260 to allow light (e.g., ambient light, light from the LEDs 246, light from an LED specific for this purpose, etc.) to pass through the adapter 210 or faceplate 260. According, the photosensitive device may be configured to detect light through the notch or channel when the control unit 230 is attached to the adapter 210 in the first orientation, but not detect light through the notch or channel when the control unit 230 is attached to the adapter 210 in the second orientation.

The orientation sensing circuit of the control unit 230 may include an inductive sensor that is configured to detect a presence of metal on the control unit 230, the adapter 210, and/or the faceplate 260. For example, the inductive sensor may be configured to detect the presence of metal on the control unit 230 (e.g., a trace of coil on a PCB of the control unit) when the control unit 230 is attached to the adapter 210 in a first orientation, but not detect the presence of metal on the control unit 230 when the control unit 230 is attached to the adapter 210 in a second orientation. For instance, the adapter 210 and/or the faceplate 260 may include a piece of metal on one end but not the other, such that the inductive sensor is configured to detect the presence of the metal residing on the adapter 210 or the faceplate 260 when the control unit 230 is attached to the adapter 210 in the first orientation, but not detect the presence of the metal when the control unit 230 is attached to the adapter 210 in the second orientation. In some examples, the adapter 210 may include a shielding element (e.g., a plastic flange) (not shown) that is situated between the inductive sensor and the metal of the control unit 230 when the control unit 230 is in the second orientation, but is not situated between the inductive sensor and the metal of the control unit 230 when the control unit 230 is in the first orientation.

The orientation sensing circuit of the control unit 230 may include a hall-effect sensor circuit, and the adapter 210 and/or faceplate 260 may include a magnet (not shown). When the magnet and hall-effect sensing circuit are aligned, the hall-effect sensing circuit may detect an electromagnetic field of the magnet and provide feedback to the control circuit of the control unit 230. For instance, the magnet and hall-effect sensor circuit may be aligned when the control unit 230 is attached to the adapter 210 in a first orientation, but not aligned when the control unit 230 is attached to the adapter 210 in a second orientation. Accordingly, the control unit 230 may be configured to determine the orientation of the control unit 230 with respect to the adapter 210 based on whether or not the control unit 230 receives a signal from the hall-effect sensing circuit indicating that magnet and hall-effect sensing circuit are aligned. In some examples, the hall-effect sensor circuit may include a multi-axis hall-effect sensor (e.g., a three-axis hall-effect sensor). The multi-axis hall-effect sensor may allow the orientation sensing circuit to detect orientations are a variety of degrees of angle, such as a 15° angle, a 30° angle, a 45° angle, a 60° angle, a 75° angle, etc.

The orientation sensing circuit of the control unit 230 may include an accelerometer, and the control unit 230 may be configured to determine the orientation of the control unit 230 with respect to the adapter 210 based on feedback from the accelerometer. For instance, the accelerometer may be configured to sense orientation based on a direction of weight change, which for example, may be different when the control unit 230 is attached to the adapter 210 in a first orientation than it is when the control unit 230 is attached to the adapter in a second orientation. Accordingly, the control unit 230 may be configured to determine the orientation of the control unit 230 with respect to the adapter 210 based on feedback from the accelerometer.

The orientation sensing circuit of the control unit 230 may include a manually operated switch. As such, the remote control device 200 may be configured to receive a user input controlling the orientation (e.g., setting or switching the orientation) of the control unit 230 with respect to the adapter 210 via the manual switch.

The orientation sensing circuit of the control unit 230 may include one or more of the control circuit of the remote control device 200, the flexible circuit board 236 (e.g., the touch response surface of the flexible circuit board 236), the wireless communication circuit of the remote control device 200, and/or other components of the control unit 230. For instance, the orientation sensing circuit may be configured such that the control circuit of the control unit 230 is configured to receive an indication of the orientation of the control unit 230 during a configuration mode of the control unit 230. For example, the control circuit may receive the indication of the orientation of the control unit 230 by way of a unique user input via the user interface of the control unit 230 and/or via an external device (e.g., a smartphone or tablet). In such examples, the control unit 230 may be placed into the configuration mode using a unique user input via the user interface of the control unit 230 and/or via an external device.

Once in the configuration mode, the control unit 230 may be configured to perform one or more advanced functions, such as orientation determination, pairing of the remote control device 200 to a load control system (e.g., pairing the remote control device 200 to one or more electrical loads, such as lighting loads), configuring control settings for one or more electrical loads (e.g., presets, scene settings, and/or the like), etc. For example, once in the configuration mode, the control unit 230 may be configured to receive the orientation of the control unit 230 from a mobile application residing on an external device. The external device may determine the orientation of the control unit 230 based on user input via the external device or based on feedback determined by the external device (e.g., via use of a camera of the external device, for example, as described with reference to FIG. 36), and the control unit 230 may receive information indication the orientation from the external device (e.g., via the wireless communication circuit of the control unit 230). For example, once in the orientation mode, the control unit 230 may receive a user input (e.g., gesture, point actuation, etc.) that indicates and sets the orientation of the control unit 230.

In some examples, the control unit 230 may be configured to be paired to the load control system and/or determine the orientation of the control unit 230 using a camera of an external device. For example, the control unit 230 may be configured to illuminate the LEDs 246 of the control unit 230 in a unique pattern to communicate an identification of the control unit (e.g., used for pairing the remote control device 200 to the load control system) to the camera of the external device and/or to communication the orientation of the control unit 230 to the camera of the external device. As such, the external device may be configured to determine the orientation of the control unit 230 using the camera of the external device, and the control unit 230 may be configured to receive the orientation of the control unit 230 from the external device via the communication circuit.

After the control unit 230 determines the orientation of the control unit 230 with respect to the adapter 210, the control unit 230 may translate a user input received via the user interface (e.g., the capacitive touch circuit) into control data for controlling one or more electrical loads based on the orientation of the control unit 230. That is, the control unit 230 may be configured to generate control data based on the orientation of the control unit 230. With knowledge of the orientation of the control unit 230, the control unit 230 can determine the relative location and/or direction of the user input with respect to the user (e.g., which is based on the orientation that the control unit 230 with respect to the adapter). For example, the control unit 230 can determine whether a user input is intended to turn an electrical load on or off, increase or decrease power delivered to the electrical load (e.g., an intensity of a lighting load), cycle through presets and/or scenes of the remote control device, and/or the like based on the orientation of the control unit 230.

The control circuit of the control unit 230 may be configured to cause the wireless communication circuit to transmit respective control signals (e.g., to one or more electrical loads) that include the control data that corresponds to interpreted user inputs received at the capacitive touch circuit 240. For example, the remote control device 200 may be operable to transmit wireless signals, for example radio frequency (RF) signals, to a load control device, one or more electrical loads, and/or a central processor of a load control system. The remote control device 200 may be associated with the load control device and the one or more electrical loads during a configuration procedure of the load control system. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The control circuit may provide an indication (e.g., a visual indication) of an amount of power delivered to the electrical load by the remote control device 200 based on the orientation of the control unit 230. For example, the control circuit may use determination of the orientation of the control unit 230 relative to the adapter 210 (e.g., and/or faceplate 260) to determine which end of the array of LEDs 246 should correspond to a high-end intensity (e.g., approximately 100% intensity) and which end of the array of LEDs 246 should correspond to a low-end intensity (e.g., approximately 1% intensity), for example, when displaying an indication of the amount of power delivered to an electrical load. The control unit 230 may be configured to, based on the determination of orientation, illuminate one or more of the LEDs 246 such that the high-end intensity corresponds to an upper end of the LED array and such that the low-end intensity corresponds to a lower end of the LED array. In this regard, the control unit 230 may ensure proper indication of the high-end and low-end intensities via the LEDs 246 regardless of whether the control unit 230 is mounted to the adapter 210 in the first orientation or the second orientation (e.g., based on whether the on position of the mechanical switch 270 corresponds to the actuator 272 operated to the up position or to the down position).

FIGS. 9-21 depict examples of a remote control device 300 (e.g., a battery-powered rotary remote control device) that may be deployed, for example, as the remote control device 120 of the load control system 100 shown in FIG. 1. The remote control device 300 may be configured to be mounted over a toggle actuator 304 of a standard light switch 302 (e.g., the toggle actuator 206 of the SPST maintained mechanical switch 204 shown in FIG. 2), for example, without removing a faceplate 306 that is mounted to the light switch 302 (e.g., via faceplate screws 308).

Figure 10:
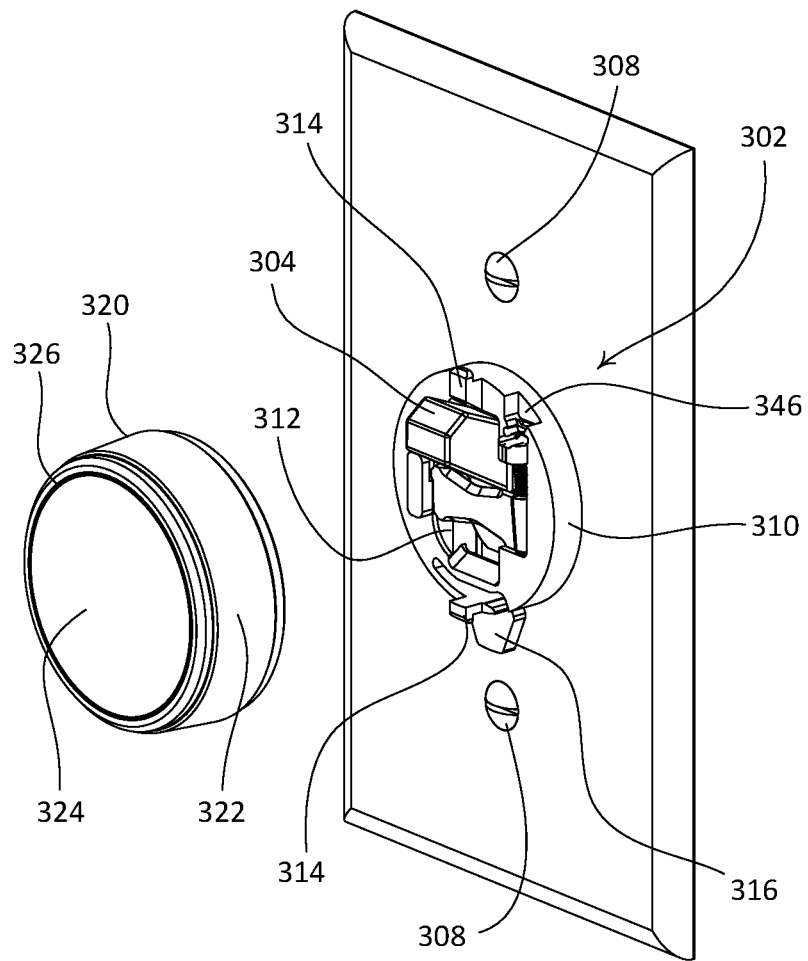
FIG. 10 is a front perspective view of the example retrofit remote control device illustrated in FIG. 9, with a control unit of the remote control device removed from a mounting structure of the remote control device.

The remote control device 300 may include a base portion 310 and a control unit 320 that may be attached to the base portion 310. The control unit 320 may include a rotating portion that is rotatable with respect to the base portion 310. For example, as shown, the control unit 320 may include an annular rotating portion 322 that is configured to be rotatable relative to the base portion 310 when the control unit 320 is attached to the base portion 310. The remote control device 300 may be configured such that the control unit 320 and the base portion 310 are removably attachable to one another. FIG. 10 depicts the remote control device 300 with the control unit 320 detached from the base portion 310.

The base portion 310 may be configured to be fixedly attached to the actuator of a mechanical switch, such as the toggle actuator 304 of the light switch 302, and may be configured to maintain the actuator in a current position, such as in the on position. For example, as shown the base portion 310 may include a base 311 that defines a toggle actuator opening 312 that extends therethrough and that is configured to receive at least a portion of the toggle actuator 304.

The remote control device 300 may be configured to enable releasable attachment of the control unit 320 to the base portion 310. As such, the base portion 310 may operate as a mounting structure for the control unit 320. The base portion 310 may include one or more engagement features that are configured to engage with complementary engagement features of the control unit 320. For example, as shown the base 311 of the base portion 310 may include resilient snap-fit connectors 314, and the control unit 320 may define corresponding recesses 315 that are configured to receive the snap-fit connectors 314. The base portion 310 may include a release mechanism that is operable to cause the control unit 320 to be released from an attached position relative to the base portion 310. As shown, the base 311 of the base portion 310 may include a release tab 316 that may be actuated (e.g., pushed) to release the control unit 320 from the base portion 310.

Figure 29:
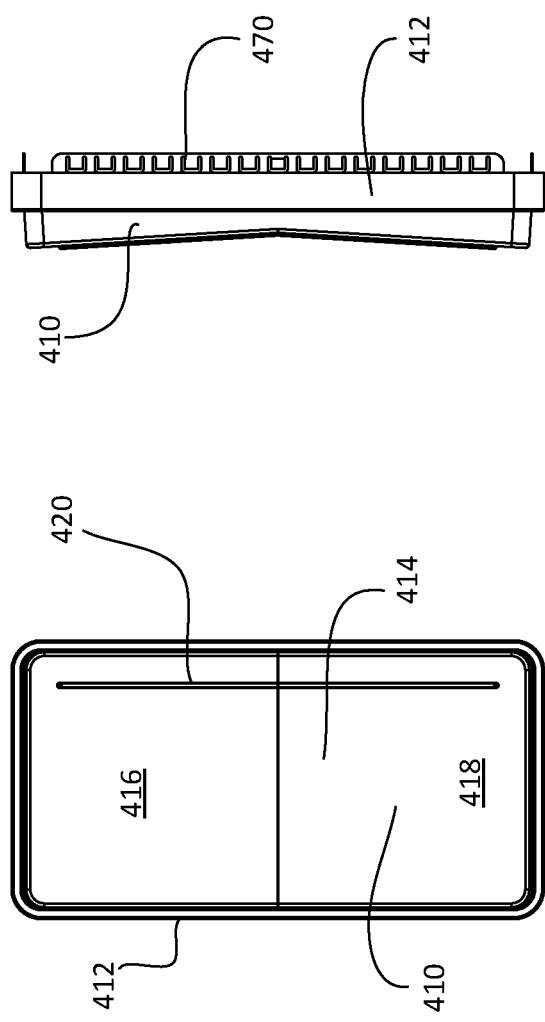
FIG. 29 is a right side view of the example remote control device illustrated in FIG. 22, with the remote control device unmounted from the light switch.
Figure 28:
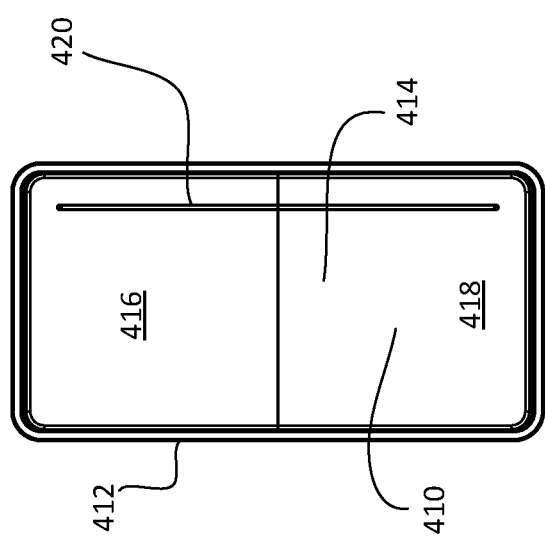
FIG. 28 is a front view of the example remote control device illustrated in FIG. 22, with the remote control device unmounted from the light switch.
Figure 30:
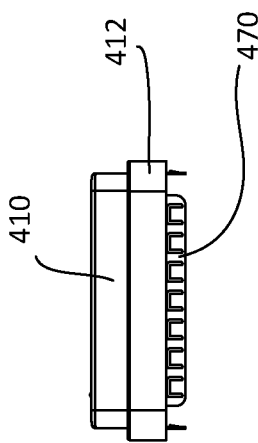
FIG. 30 is a bottom view of the example remote control device illustrated in FIG. 22, with the remote control device unmounted from the light switch.

As shown, the release tab 316 may be connected to the base 311 of the base portion 310 via a resilient, cantilevered spring arm 350, such that a gap 352 is defined between the base 311 and the spring arm 350. In operation, when the release tab 316 is pressed up towards the base 311, the spring arm 350 may deflect into the gap 352, allowing the lowermost snap-fit connector 314 adjacent to the release tab 316 to be removed from the corresponding lower recess 315 of the control unit 320, such that the control unit 320 is released from the base portion 310. When the control unit 320 is attached to the base portion 310, the uppermost snap-fit connector 314 may first be positioned in the corresponding upper recess 315 of the control unit 320. The lower portion of the control unit 320 may then be pressed towards the base 311, such that the spring arm 350 deflects into the gap 352 until the lower snap-fit connector 314 is received into the lower recess 315 of the control unit 320, at which point the spring arm 350 may resiliently return to a rest position (e.g., as shown in FIGS. 10 and 29).

The base portion 310 may be mounted to the toggle actuator 304 of the light switch 302 when the toggle actuator is in an up position (e.g., a "switched up" position as shown in FIG. 10), or alternatively may be mounted to the toggle actuator 304 when the toggle actuator 304 is in a down position (e.g., a "switched down" position that is opposite the position of the toggle actuator 304 shown in FIG. 10). To illustrate, in an example installation in which a single remote control device 300 is installed over a single-pole switch, the up position of the toggle actuator typically corresponds to "on" such that power is delivered to a connected electrical load but the down position of the toggle actuator may correspond to "on" (e.g., if the switch is incorrectly installed upside down). In another example installation in which a single remote control device 300 is installed over a 3-way switch, either the up or down position of the toggle actuator may correspond to "on" such that power is delivered to the electrical load (e.g., depending on how the installation is wired). In still another example installation in which two remote control devices 300 are installed over respective 3-way switches, the up position of the toggle actuator may correspond to "on" for the first 3-way switch of the installation and the down position of the toggle actuator may correspond to "on" for the second 3-way switch of the installation (e.g., depending on how the installation is wired).

Figure 9:
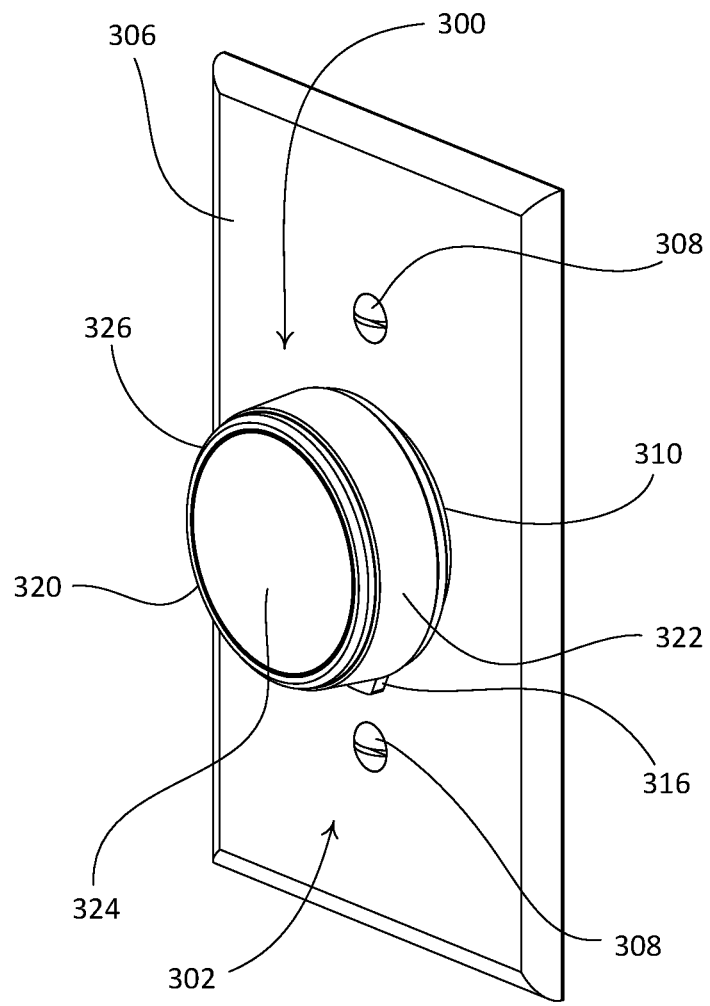
FIG. 9 is a front perspective view of another example retrofit remote control device.

When the control unit 320 is coupled to the base portion 310 as shown in FIG. 9, the rotating portion 322 may be rotatable in opposed directions about the base portion 310 (e.g., in the clockwise or counter-clockwise directions). The base portion 310 may be configured to be mounted over the toggle actuator 304 of the switch 302 such that the rotational movement of the rotating portion 322 may not change the operational state of the toggle actuator 304 (e.g., the toggle actuator 304 may remain in the on position to maintain functionality of the remote control device 300).

The control unit 320 may comprise an actuation portion 324. The actuation portion 324 may in turn comprise a part or an entirety of a front surface of the control unit 320. For example, the control unit 320 may have a circular surface within an opening defined by the rotating portion 322. The actuation portion 324 may comprise a part of the circular surface (e.g., a central area of the circular surface) or approximately the entire circular surface. In an example, the actuation portion 324 may be configured to move towards the light switch 302 to actuate a mechanical switch (not shown) inside the control unit 320 as will be described in greater detail below. The actuation portion 324 may return to an idle position (e.g., as shown in FIG. 5) after being actuated.

In some examples, the front surface of the actuation portion 324 may be a touch sensitive surface (e.g., a capacitive touch surface). The actuation portion 324 may include a touch sensitive circuit (e.g., a capacitive touch circuit) adjacent to the rear surface of the actuation portion (e.g., on a printed circuit board (PCB) 364 of the control unit 320). The touch sensitive circuit may be actuated in response to a touch of the touch sensitive surface of the actuation portion 324. For example, the actuation portion 324 may include a capacitive touch circuit (e.g., the capacitive touch circuit 240 of the control unit 230) that may be responsive to user inputs via the capacitive touch surface on the front surface of the actuation portion 324. For example, the control unit 320 may be configured to detect point actuations and/or gestures via the touch sensitive circuit, for example, as described herein (e.g., with reference to FIG. 1).

Figure 11C:
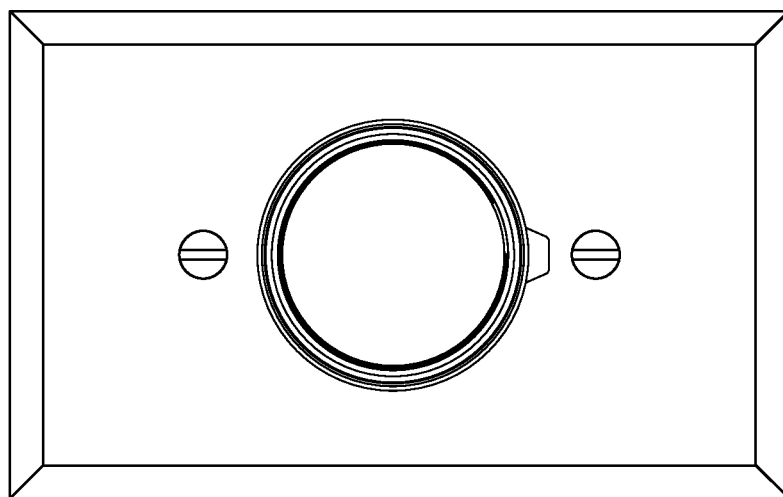
FIGS. 11A-11C show front views of the example remote control unit depicted in FIG. 9 when a light bar is illuminated to provide a single indication of the intensity of a lighting load.
Figure 11B:
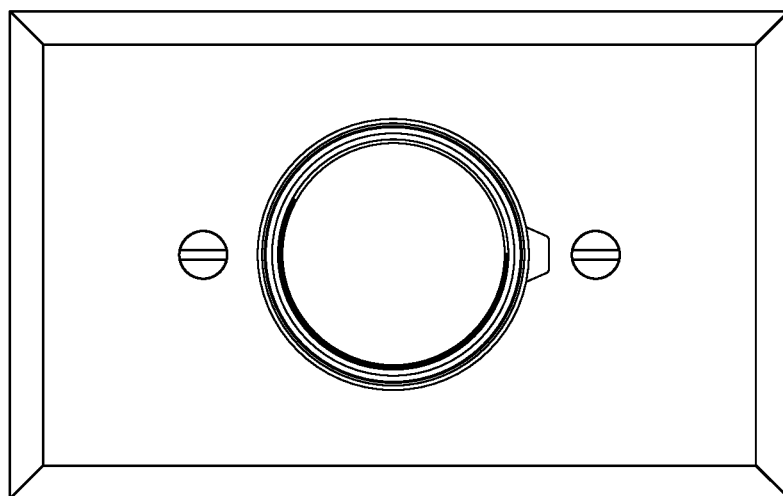
Figure 11A:
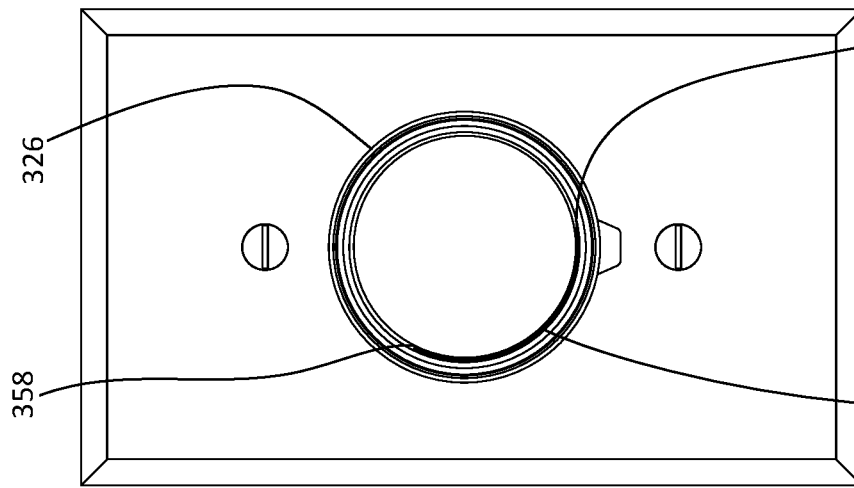

The control unit 320 may include a light bar 326. The light bar 326 may be arranged at least partially around the peripheral of the actuation portion 324 of control unit 320, for example, in circular or semi-circular geometry. FIGS. 11A-11C show front views of the remote control device 300 when the light bar 326 is illuminated to provide an indication of the intensity of the lighting load. For example, an illuminated portion 354 of the light bar may begin at a starting point 356 (e.g., at the bottom of the light bar 326 as shown in FIG. 11A). The illuminated portion 354 may end at an ending point 358 (e.g., an endpoint) that may indicate the present intensity of the lighting load. More generally, the length of the illuminated portion 354 may increase (e.g., wrap around the light bar 326 in the clockwise direction as shown in FIGS. 11A-11C) or decrease (e.g., contract along the light bar 326 in the counterclockwise direction as shown in FIGS. 11A-11C), and length of the illuminated portion 354 may indicate the present intensity of the lighting load. For example, the light bar 326 may be illuminated to indicate the present intensity of the lighting load is approximately 30% as shown in FIG. 11A, approximately 60% as shown in FIG. 11B, and approximately 90% as shown in FIG. 11C. When the lighting load is at a full intensity (e.g., approximately full intensity), the entire light bar 326 may be illuminated.

The light bar 326 may be located, for example, between the rotating portion 322 and the actuation portion 324. As shown, the light bar 326 may define a full circle geometry as shown in FIG. 9. The light bar 326 may be attached to a periphery of the actuation portion 324, and may move with the actuation portion 324 when the actuation portion 324 is actuated. The remote control device 300 may provide feedback via the light bar 326, for instance while the rotating portion 322 is being rotated and/or after the remote control device 300 is actuated (e.g., the rotating portion 322 is rotated and/or the actuation portion 324 is actuated). The feedback may indicate, for example, that the remote control device 300 is transmitting one or more RF signals 108. To illustrate, the light bar 326 may be illuminated for a few seconds (e.g., 1-2 seconds) after the remote control device 300 is actuated, and then may be turned off (e.g., to conserve battery life). The light bar 326 may be illuminated to different intensities, for example depending on whether the rotating portion 322 is being rotated to raise or lower the intensity of the lighting load. The light bar 326 may be illuminated to provide feedback of an actual intensity of a lighting load being controlled by the remote control device 300 (e.g., the controllable light source 110).

As described herein, the rotating portion 322 of the remote control device 300 may be rotated in opposed directions to increase or decrease the intensity of the lighting load (e.g., after the actuation portion 324 has been actuated). As the rotating portion 322 is being rotated, the light bar 326 may be illuminated and the length of the illuminated portion 354 may be adjusted as shown in FIGS. 11A-11C to indicate the actual intensity of the lighting load. When the actuation portion 324 is actuated to turn the lighting load on, the light bar 326 may be illuminated to quickly increase the length of the illuminated portion 354, e.g., from the starting point 356 to the ending point 358 that corresponds to the present target intensity for the lighting load. The present target intensity may be, for example, a preset intensity or a previous intensity to which the lighting load was turned on. Either or both of the preset intensity and the previous intensity may be stored by the remote control device 300 in memory. When the actuation portion 324 is actuated to turn the lighting load off, the light bar 326 may be illuminated to quick decrease the length of the illuminated portion 354 from the ending point 358 that corresponds to the present intensity of the lighting load to the starting point 356. Prior to decreasing the length of the illuminated portion 354, the remote control device 300 may be configured to store the present intensity of the lighting load in memory (e.g., such that the length of the illuminated portion 354 may be set accordingly when the lighting load is subsequently turned back on).

Figure 12:
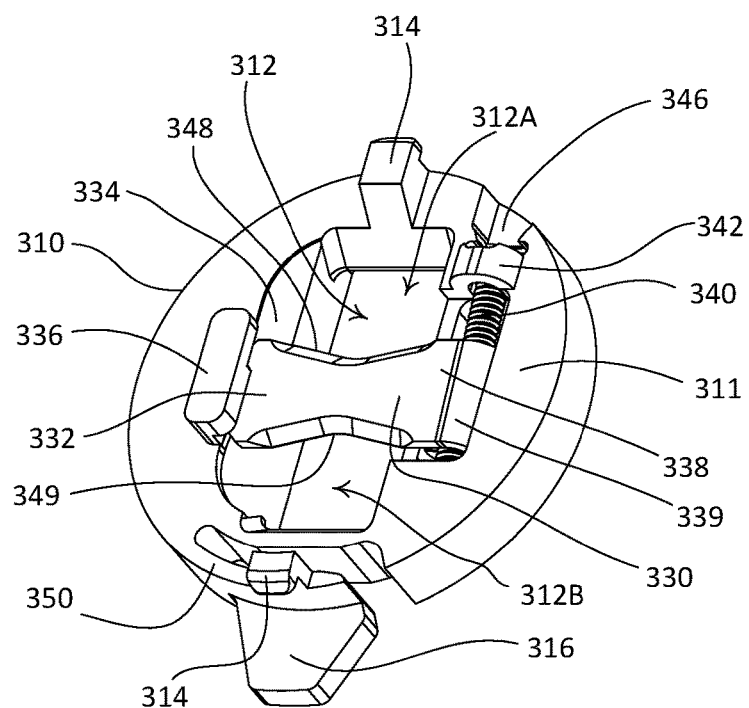
FIG. 12 is a front perspective view of the mounting structure of the example retrofit remote control device illustrated in FIG. 9.

FIG. 12 is an enlarged front perspective view of the base portion 310. The base portion 310 may include an engagement mechanism that is configured to engage the toggle actuator 304, for example when the toggle actuator 304 is received in the toggle actuator opening 312. The engagement mechanism may be configured to engage the toggle actuator 304 such that the base portion 310 is secured in position relative to the toggle actuator 304. For example, the engagement mechanism may include a bar 330. The bar 330 may be operably coupled to the base 311, and may be configured to be moveable, for instance translatable, relative to the base 311. The bar 330 may be configured to be translated within the toggle actuator opening 312 such that the bar 330 engages with the toggle actuator 304, thereby fixedly attaching the mounting structure in position relative to the toggle actuator 304 of the light switch 302 when the toggle actuator 304 is in the up position or the down position. As shown, the bar 330 may extend across the toggle actuator opening 312 of the base 311, such that the base 311 defines a first opening 312A to receive the toggle actuator 304 when the toggle actuator 304 is in the up position and a second opening 312B to receive the toggle actuator 304 when the toggle actuator 304 is in the down position. In accordance with the illustrated orientation of the mounting structure, the first opening 312A may be referred to as an upper opening of the base 311 and the second opening 312B may be referred to as a lower opening of the base 311.

The illustrated bar 330 defines a first end 332 and an opposed second end 338. The first end 332 of the bar 330 may be configured to slide within a channel 334 defined by the base 311. As shown, the base 311 may define a flange 336 that is configured to retain the first end 332 of the bar 330 in the channel 334. The second end 338 of the bar may define a threaded sleeve 339 that is configured to receive a screw 340. The base 311 may be configured to capture the screw 340 such that the screw 340 is freely rotatable relative to the base 311. For example, the base 311 may define a collar 342 that retains a first non-threaded portion of a shaft of the screw 340, a recess 345 that is configured to capture a head 344 of the screw 340, and an aperture (not shown) that is configured to support a tip portion (not shown) of the screw 340. In this regard, the base 311 may be configured to support opposed ends of the screw 340 such that the screw 340 may be rotated relative to the base 311 without causing translation of the screw 340 relative to the base 311. As shown, the base 311 may define a recess 346 that is configured to allow a tool, such as a screwdriver, to access the head 344 of the screw 340 to rotate the screw. The base 311 may be configured to support the screw 340 such that the screw 340 is angled slightly with respect to the faceplate 306 (e.g., approximately 5°). This may make it easier for a user to access the head 344 of the screw with a screwdriver. Rotating the screw 340 in a first direction (e.g., clockwise) may cause the bar 330 to translate upward along the screw 340 such that the bar 330 contacts the toggle actuator 304 of the light switch 302, for instance when the toggle actuator is in the up position. Rotating the screw 340 in a second direction (e.g., counter-clockwise) may cause the bar 330 to translate downward along the screw 340 such that the bar 330 contacts the toggle actuator 304, for instance when the toggle actuator is in the down position.

The bar 330 may be configured to mechanically grip the toggle actuator 304. For example, as shown, the bar 330 may define have an upper edge 348 that is configured to bite into a corresponding lower surface of the toggle actuator 304 when the toggle actuator is in the up position, and may define a lower edge 349 that is configured to bite into a corresponding upper surface of the toggle actuator 304 when the toggle actuator is in the down position. The bar 330 may be made of any suitable material, such as metal.

When the bar 330 is contacting (e.g., gripping) the toggle actuator 304 of the light switch 302 in either the up position or the down position, the base 311, and thus the base portion 310, may be secured in a fixed position relative to the toggle actuator 304, and the toggle actuator 304 may be prevented from being switched to the off position. In this regard, a user of the remote control device 300 may be unable to inadvertently switch the light switch 302 off when the remote control device 300 is mounted over the light switch 302. It should be appreciated that the bar 330 allows for installation of the base portion to the switch 302 when the toggle actuator 304 is in the up position or the down position while keeping the release tab 316 on the bottom (e.g., facing downward).

Figure 13:
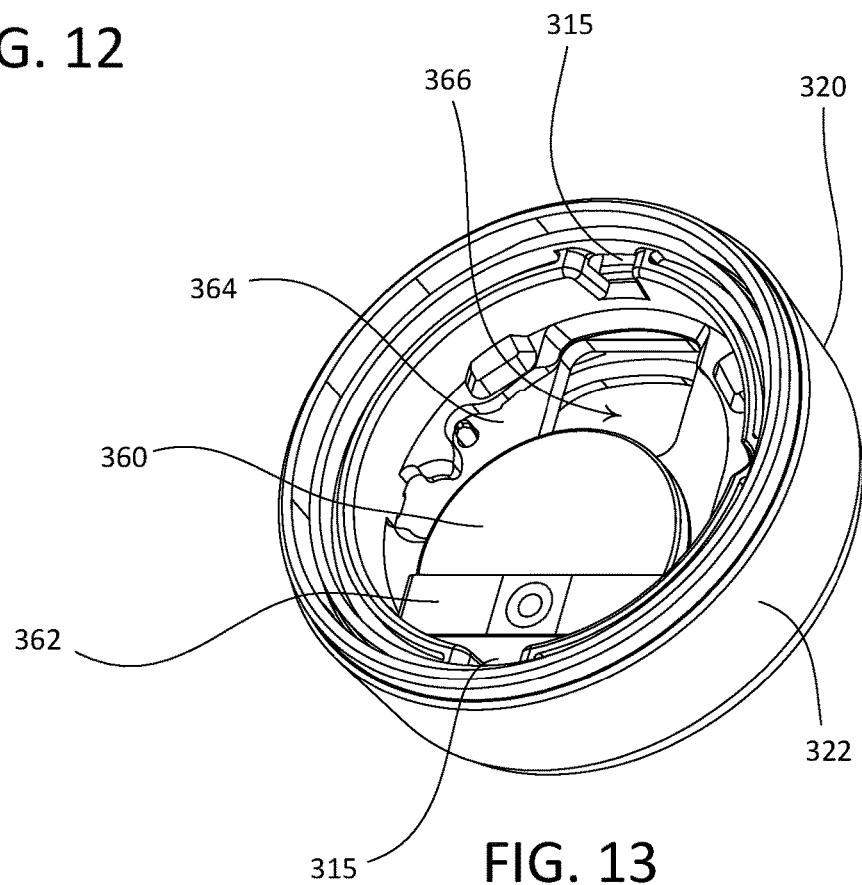
FIG. 13 is a rear perspective view of the control unit of the example retrofit remote control device illustrated in FIG. 9.

The control unit 320 may be detached from the base portion 310 (e.g., as shown in FIG. 10), for instance to access one or more batteries 360 that may be used to power the control unit 320. FIG. 13 is an enlarged rear perspective view of the control unit 320. For example, the control unit 320 may include a single battery 360 as shown in FIG. 13. The control unit 320 may be configured such that the battery 360 is located in space within the control unit 320 that is not occupied by the toggle actuator 304. The control unit 320 may include a battery retention strap 362 that may be configured to hold the battery 360 in place between the battery retention strap 362 and a printed circuit board (PCB) 364 of the control unit 320. The battery retention strap 362 may be configured to operate as a first electrical contact for the battery 360. A second electrical contact may be located on a rear-facing surface of the PCB 364. In an example of removing the battery 360 from the control unit 320, the control unit 320 may be detached from the base portion 310, for instance as described herein, and the battery 360 may be slid out from between the battery retention strap 362 and the PCB 364. The PCB 364 may define an actuator opening 366 that extends therethrough and that may be configured to receive at least a portion of the toggle actuator 304 of the light switch 302 when the control unit 320 is mounted to the base portion 310.

When the control unit 320 is attached to the base portion 310 (e.g., as shown in FIG. 9), the rotating portion 322 may be rotatable in opposed directions about the base portion 310. The base portion 310 may be configured to be mounted over the toggle actuator 304 of the light switch 202 such that the application of rotational movement to the rotating portion 322 does not actuate the toggle actuator 304. The control unit 320 may include an actuation portion 324, which may be operated separately from or in concert with the rotating portion 322. As shown, the actuation portion 324 may include a circular surface within an opening 370 defined by the rotating portion 322. In an example implementation, the actuation portion 324 may be configured to move inward towards the light switch 302 to actuate a mechanical switch located inside the control unit 320, for instance as described herein. The actuation portion 324 may be configured to return to an idle or rest position (e.g., as shown in FIG. 9) after being actuated. In this regard, the actuation portion 324 may be configured to operate as a toggle control of the control unit 320.

The remote control device 300 may be configured to transmit one or more wireless communication signals (e.g., RF signals 108) to one or more control devices (e.g., the control devices of the load control system 100, such as the controllable light source 110). The remote control device 300 may include a wireless communication circuit, for example an RF transceiver or transmitter (not shown), via which one or more wireless communication signals may be sent and/or received. The control unit 320 may be configured to transmit digital messages (e.g., including commands) in response to operation of the rotating portion 322 and/or the actuation portion 324. The digital messages may be transmitted to one or more devices associated with the remote control device 300, such as the controllable light source 110. For example, the control unit 320 may be configured to transmit a command via one or more RF signals 108 to raise the intensity of the controllable light source 110 in response to a clockwise rotation of the rotating portion 322 and a command to lower the intensity of the controllable light source in response to a counterclockwise rotation of the rotating portion 322. Further, the control unit 320 may be configured to transmit a command via one or more RF signals 108 based on a point actuation or gesture detected via the touch sensitive element.

The control unit 320 may be configured to transmit a command to toggle the controllable light source 110 (e.g., from off to on or vice versa) in response to an actuation of the actuation portion 324. In addition, the control unit 320 may be configured to transmit a command to turn the controllable light source 110 on in response to an actuation of the actuation portion 324 (e.g., if the control unit 320 knows that the controllable light source 110 is presently off). The control unit 320 may be configured to transmit a command to turn the controllable light source 110 off in response to an actuation of the actuation portion 324 (e.g., if the control unit 320 knows that the controllable light source 110 is presently on).

The remote control device 300 may be configured to detect a low battery condition and provide an indication of the condition such that a user may be alerted to replace the battery 360. For example, the remote control device 300 may be configured to provide an indication of a low-battery condition in a similar manner as the remote control device 200 discussed above.

Figure 14:
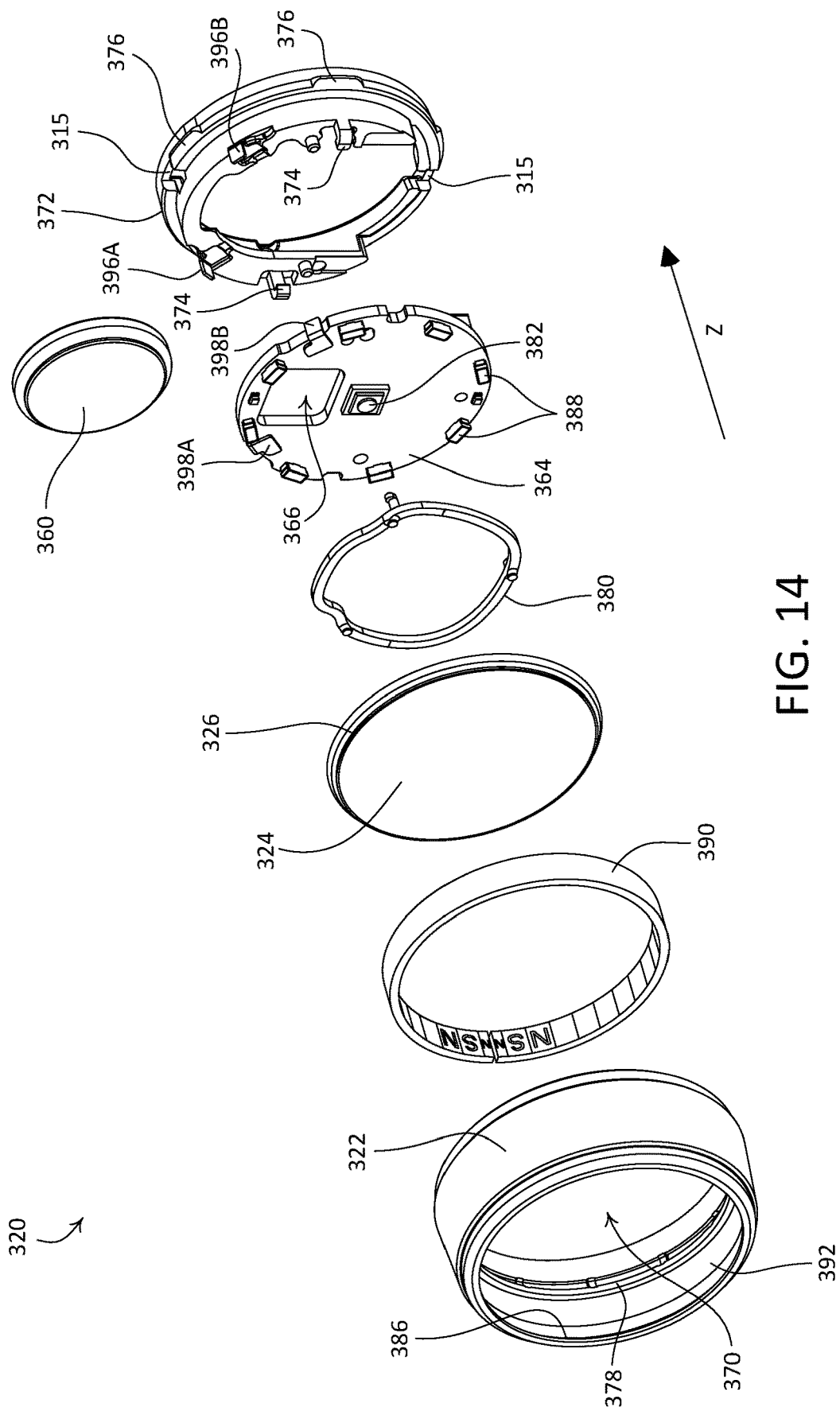
FIG. 14 is a front-facing exploded view of the control unit of the example retrofit remote control device illustrated in FIG. 9.
Figure 15:
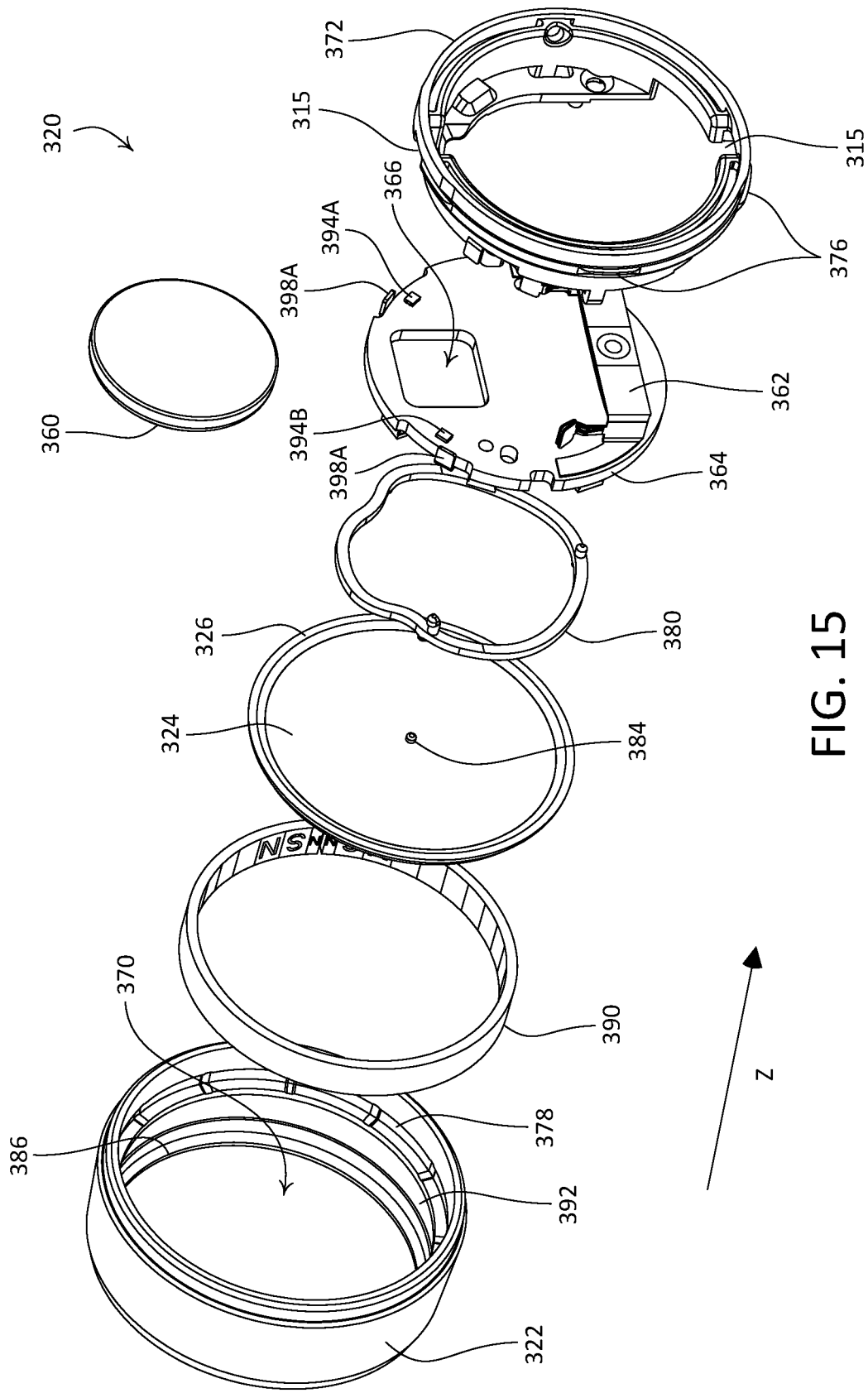
FIG. 15 is a rear-facing exploded view of the control unit of the example retrofit remote control device illustrated in FIG. 9.

As shown in FIGS. 14 and 15, the light bar 326 may be attached to the actuation portion 324 around a periphery of the actuation portion 324. The actuation portion 324 may be received within the opening 370 of the rotating portion 322 and may float freely in the opening 370 and/or rotate with the rotating portion 322. When the actuation portion 324 is received within the opening 370 of the rotating portion 322, the light bar 326 may be located between the actuation portion 324 and the rotating portion 322 such that the light bar 326 is visible to a user of the remote control device 300.

The PCB 364 may include a mechanical tactile switch 382 that may be mounted to a front-facing surface of the PCB 364. A control circuit (not shown) of the control unit 320 may be mounted to the PCB 364, for example to the one or both of the front-facing and rear-facing surfaces. As shown, the control unit 320 may include a plurality of light-emitting diodes (LEDs) 388 arranged around a perimeter of the PCB 364. The LEDs 388 may be configured to illuminate the light bar 326.

The control unit 320 may include a carrier 372 that is configured to carry one or more components of the control unit 320, such as the PCB 364. For example, as shown the PCB 364 may be attached to the carrier 372 via snap-fit connectors 374. The carrier 372 may include a plurality of tabs 376 arranged around a circumference of the carrier 372. The tabs 376 may be configured to be received within corresponding channels 378 defined by the rotating portion 322, to thereby couple the rotating portion 322 to the carrier 372 and allow for rotation of the rotating portion 322 around the carrier 372. As shown, the carrier 372 may define the recesses 315. When the control unit 320 is connected to the base portion 310, the snap-fit connectors 314 of the base portion 310 may be received in the recesses 315 of the carrier 372. The carrier 372 and the PCB 364 may remain fixed in position relative to the base portion 310 as the rotating portion 322 is rotated around the carrier 372. When the control unit 320 is attached to the base portion 310, a portion of the toggle actuator 304 of the light switch 302 may be received in the actuator opening 366 of the PCB 364, such that the rotating portion 322 rotates about the toggle actuator 304 when operated.

The control unit 320 may include a resilient return spring 380 that may be located between the actuation portion 324 and the PCB 364. The return spring 380 may be configured to be attached to the PCB 364. As shown in FIG. 15, the actuation portion 324 may define a projection 384 that extends rearward from an inner surface of the actuation portion 324. When a force is applied to the actuation portion 324 (e.g., when the actuation portion 324 is pressed by a user of the remote control device 300), the actuation portion 324, and thus the light bar 326, may move in the direction Z until the projection 384 actuates the mechanical tactile switch 382. The return spring 380 may compress under application of the force. When application of the force is ceased (e.g., the user no longer presses the actuation portion 324), the return spring 380 may decompress, thereby to biasing the actuation portion 324 forward such that the actuation portion 324 abuts a rim 386 of the rotating portion 322. In this regard, the return spring 380 may operate to return the actuation portion 324 from an activated (e.g., pressed) position to a rest position.

The control unit 320 may include a magnetic strip 390 that may be disposed along an inner surface 392 of the rotating portion 322. The magnetic strip 390 may extend around an inner circumference of the rotating portion 322. The control unit 320 may include one or more rotational sensors 394A, 394B that may be mounted on the PCB 364. For example, the rotational sensors 394A, 394B may each comprise a Hall Effect sensor integrated circuit. The magnetic strip 390 may include a plurality of alternating positive and negative sections, and the rotational sensors 394A, 394B may be operable to detect passing of the positive and negative sections of the magnetic strip 390 as the rotating portion 322 is rotated about the carrier 372. The control circuit of the control unit 320 may be configured to determine a rotational speed and/or direction of rotation of the rotating portion 322 in response to the rotational sensors 394A, 394B. Each rotational sensor 394A, 394B may be located adjacent to one or more magnetic flux pipe structures 396A, 396B, 398A, 398B. Each magnetic flux pipe structure 396A, 396B, 398A, 398B may be configured to conduct and direct respective magnetic fields generated by the magnetic strip 390 toward corresponding rotational sensors 394A, 394B. As shown, the magnetic flux pipe structures 396A, 396B may be connected to the carrier 372 and the magnetic flux pipe structures 398A, 398B may be mounted to the PCB 364. Although described with reference to a magnetic strip 390, the control unit 320 may include a magnetic ring.

The control unit 320 may be attached to the base portion 310 in a plurality of orientations. As such, the control unit 320 may comprise an orientation sensing circuit (not shown in FIGS. 9-15), such that the control unit 320 is configured to determine an orientation of the control unit 320. For example, through the use of the orientation sensing circuit, the control circuit 320 may determine its orientation relative to the space where it is installed (e.g., based on gravity) and/or its orientation relative to another component, such as the base portion 310, light switch 302, etc. For example, the control unit 320 may be configured to determine whether the control unit 320 is attached to the base portion 310 in a first orientation in which the actuator opening 366 of the PCB 364 of the control unit 320 is aligned with the first opening 312A of the base 311 of the base portion 310, or is attached to the base portion 310 in a second orientation in which the actuator opening 366 is aligned with the second opening 312B of the base portion 310.

The control unit 320 may, for example, determine (e.g., automatically determine) the orientation of the control unit 320 relative to the base portion 310 upon the control unit 320 being mounted to the base portion 310. For example, the control unit may automatically determine the orientation of the control unit 320 relative to the base portion 310 upon the control unit 320 being mounted to the base portion 310 without any user input. Alternatively or additionally, the control unit 320 may determine the orientation of the control unit 320 relative to the base portion 310 each time the control unit 320 wakes up from an off or sleep state (e.g., upon detecting a user actuation via the touch sensitive element and/or receiving a signal from an external device).

The orientation sensing circuit may comprise a switch (e.g., a portion of a switch or the entirety of a switch), such as one or more electrical contacts, a tactile switch, a gravity switch, a mercury switch, a ball and LED sensor switch, and/or the like. Alternatively or additionally, the orientation sensing circuit may comprise an optocoupler (e.g., which may include an LED, such as an infra-red (IR) LED, and a photodiode), an inductive sensor, a photosensitive device (e.g., a photodiode), a hall-effect sensor circuit (e.g., or a reed switch), an accelerometer, a gyroscope, the wireless communication circuit of the remote control device 300, and/or other components of the control unit 320. Further, the orientation sensing circuit may be configured such that an orientation of the control unit 320 may be determined (e.g., specified) during a configuration process of the control unit 320, for instance when pairing the remote control device 300 to a load control system (e.g., as described with reference to FIGS. 35 and 36).

As noted above, the orientation sensing circuit of the control unit 320 may include a gravity switch or a mercury switch. In such examples, the gravity switch or mercury switch may be configured to be in a closed position when the control unit 320 is connected to the adapter plate 310 in the first orientation, and in an open position when the control unit 320 is connected to the adapter plate 310 in the second orientation. Accordingly, the control unit 320 may be configured to determine the orientation of the control unit 320 with respect to the base portion 310 based on whether the gravity switch or mercury switch is in the open or closed position.

Figure 16:
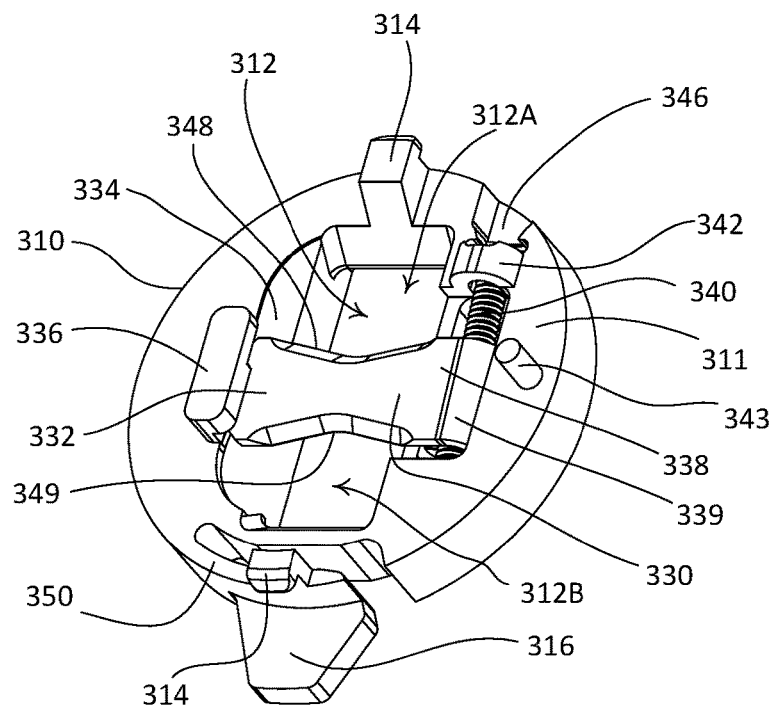
FIG. 16 is a front perspective view of the mounting structure of the example retrofit remote control device illustrated in FIG. 9 comprising a protrusion and a tactile switch.
Figure 17:
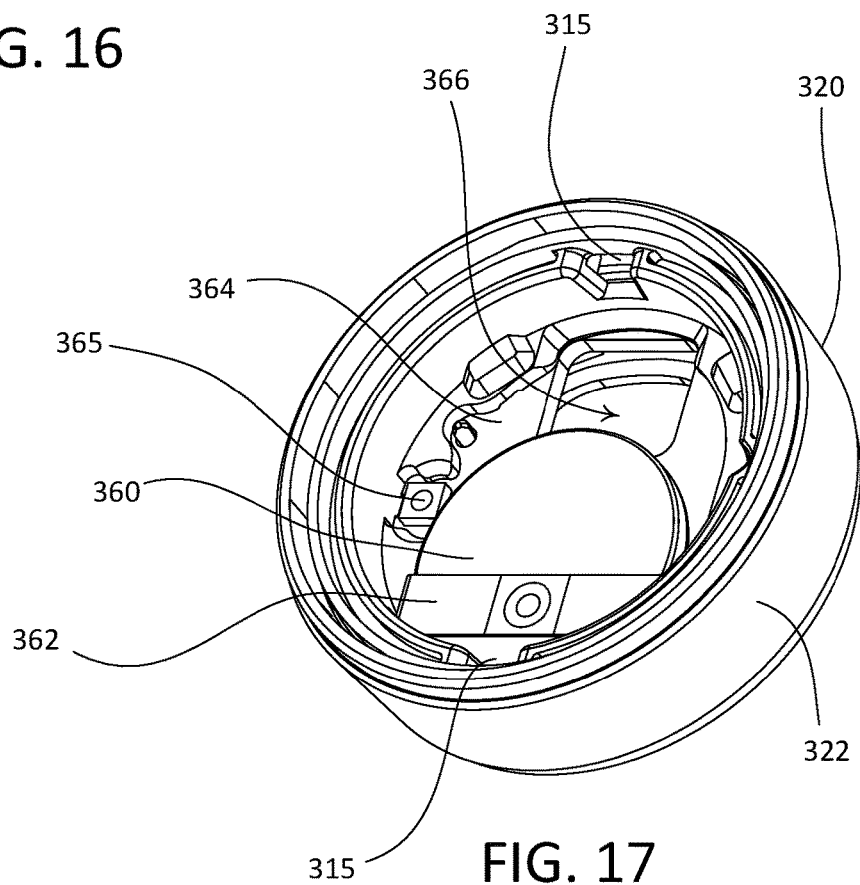
FIG. 17 is a rear perspective view of the control unit of the example retrofit remote control device illustrated in FIG. 9 comprising a protrusion and a tactile switch.

FIGS. 16 and 17 are perspective views of the base portion 310 of the remote control device 300 with the inclusion of a protrusion 343 and a tactile switch 365. The orientation sensing circuit of the control unit 320 may include the tactile switch 365, and the base portion 310 may include the protrusion 343. The protrusion 343 may be configured to actuate the tactile switch 365 when the control unit 320 is attached to the base portion 310 in the first orientation, but not actuate the tactile switch 365 when the control unit 320 is attached to the base portion 310 in the second orientation. As such, the control unit 320 may be configured to determine its orientation with respect to the base portion 310 based on whether or not the tactile switch 365 is actuated.

Figure 18:
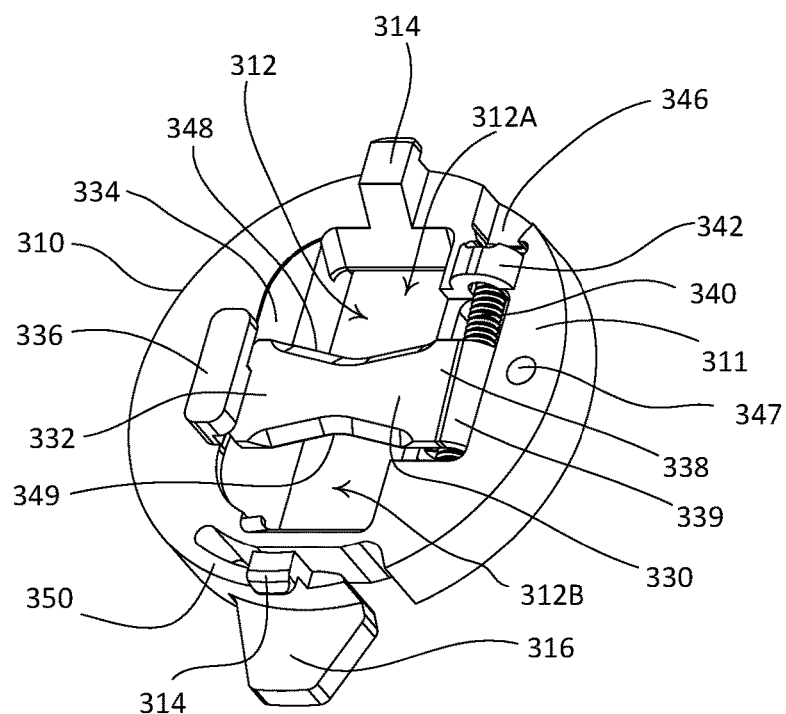
FIG. 18 is a front perspective view of the mounting structure of the example retrofit remote control device illustrated in FIG. 9 comprising a magnet and hall-effect sensor circuit.
Figure 19:
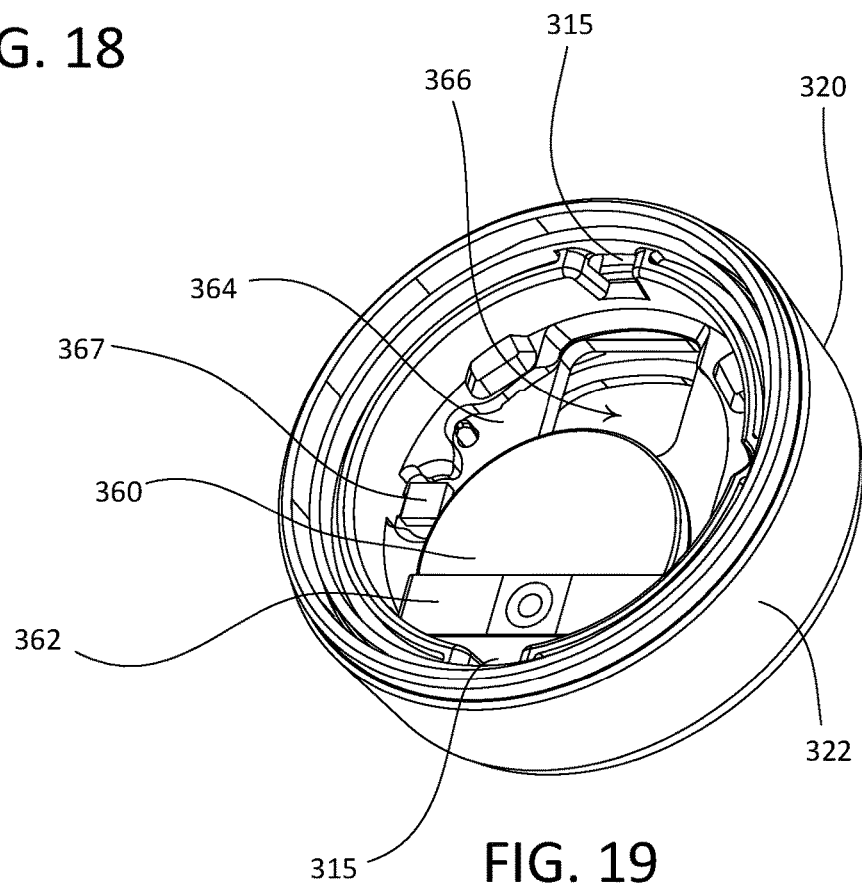
FIG. 19 is a rear perspective view of the control unit of the example retrofit remote control device illustrated in FIG. 9 comprising a magnet and hall-effect sensor circuit.

FIGS. 18 and 19 are perspective views of the base portion 310 of the remote control device 300 with the inclusion of a magnet 347 and a hall-effect sensor circuit 367. The orientation sensing circuit of the control unit 320 may include the hall-effect sensor circuit 367, and the base portion 310 may include the magnet 347. When the magnet 347 and hall-effect sensing circuit 367 are aligned, the hall-effect sensing circuit 367 may detect an electromagnetic field of the magnet 347 and provide feedback to the control circuit of the control unit 320. For instance, the magnet 347 and hall-effect sensor circuit 367 may be aligned when the control unit 320 is attached to the base portion 310 in a first orientation, but not aligned when the control unit 320 is attached to the base portion 310 in a second orientation. Accordingly, the control unit 320 may be configured to determine the orientation of the control unit 320 with respect to the base portion 310 based on whether or not the control unit 320 receives a signal from the hall-effect sensing circuit 367 indicating that the magnet 347 and hall-effect sensing circuit 367 are aligned. In some examples, the hall-effect sensor circuit may include a multi-axis hall-effect sensor (e.g., a three-axis hall-effect sensor). The multi-axis hall-effect sensor may allow the orientation sensing circuit to detect orientations are a variety of degrees of angle, such as a 15° angle, a 30° angle, a 45° angle, a 60° angle, a 75° angle, etc.

The orientation sensing circuit of the control unit 320 may include a photosensitive device, such as a photodiode, that is configured to detect light that is originates external to the remote control device 300 (e.g., ambient light) and/or internal to the remote control device 300 (e.g., light from the LEDs 388). For example, the remote control device 300 (e.g., the control unit 320 and/or the base portion 310) may include one or more of a blocking element (e.g., opaque material) or guiding element (e.g., a notch, channel, a component made from a translucent material, a reflective component, etc.). If the remote control device 300 includes a blocking element, then the blocking element may block light (e.g., internal or external light) from reaching the photosensitive device when the control unit 320 is in the second orientation, but not block light when the control unit 320 is in the first orientation (e.g., allow light to reach the photosensitive device). Similarly, if the remote control device 300 includes a guiding element, then the guiding element may allow light (e.g., internal or external light) to reach the photosensitive device when the control unit 320 is in the first orientation, but not allow light to reach the photosensitive device when the control unit 320 is in the second orientation. Therefore, the control unit 320 may be configured to determine whether the control unit 320 is attached to the base portion 310 in a first orientation or a second orientation based on whether or not the photosensitive device detects light.

Figure 20:
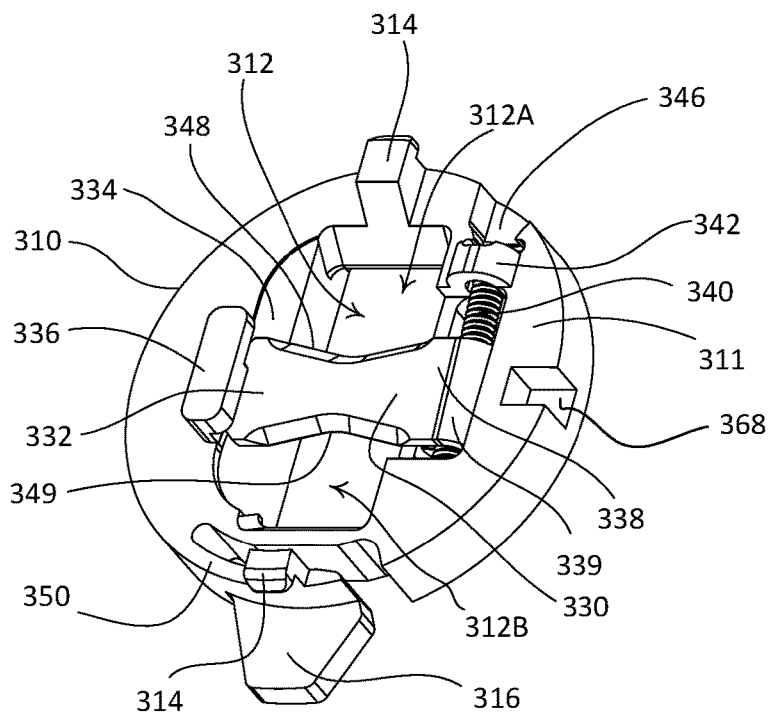
FIG. 20 is a front perspective view of the mounting structure of the example retrofit remote control device illustrated in FIG. 9 comprising a photodiode.
Figure 21:
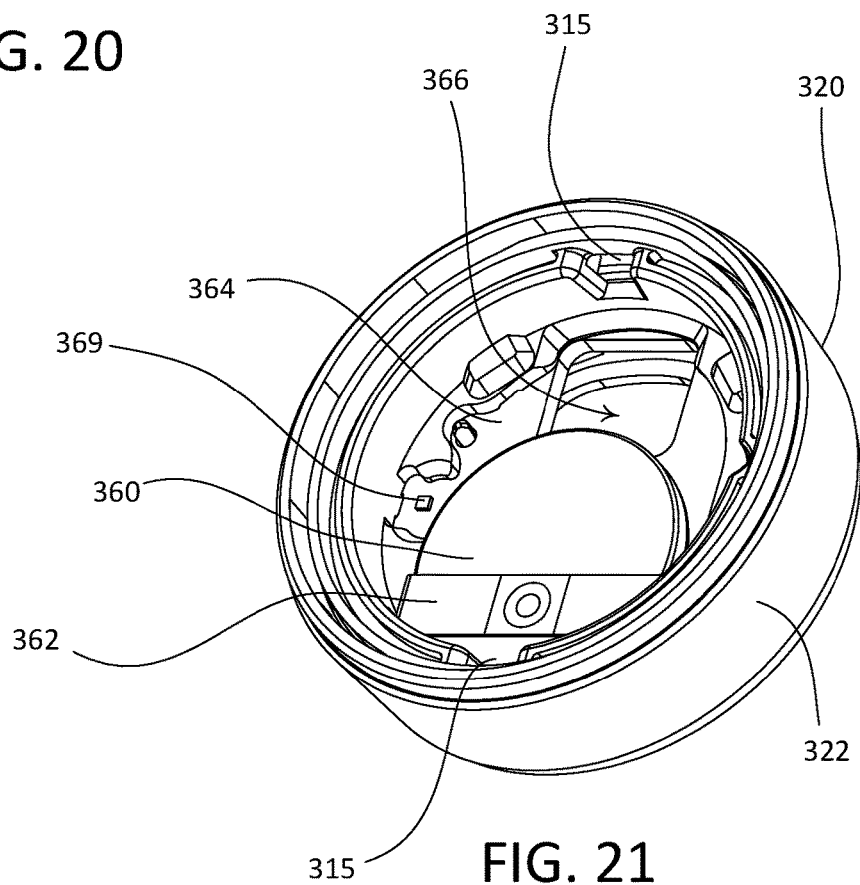
FIG. 21 is a rear perspective view of the control unit of the example retrofit remote control device illustrated in FIG. 9 comprising a photodiode.

FIGS. 20 and 21 are perspective views of the control unit 320 and the base portion 310 of the remote control device 300 with the inclusion of a photosensitive device 369 (e.g., a photodiode) and a notch 368 (e.g., or channel). The orientation sensing circuit of the control unit 320 may include the photosensitive device 369, and the base portion 310 and/or faceplate 360 may include the notch 368. The photosensitive device 369 and the notch 368 are configured to align when the control unit 320 is attached to the base portion 310 in the first orientation, but not align when the control unit 310 is attached to the base portion 310 in the second orientation. The notch 368 may define an opening through the base portion 310 to allow light (e.g., ambient light) to pass through the base portion 310 to the photosensitive device 369. Accordingly, the photosensitive device 369 may be configured to detect light through the notch 368 when the control unit 320 is attached to the base portion 310 in the first orientation, but not detect light through the notch 368 when the control unit 310 is attached to the base portion 310 in the second orientation. Therefore, the control unit 310 may be configured to determine whether the control unit 320 is attached to the base portion 310 in a first orientation or a second orientation based on whether or not the photosensitive device 369 detects light. Alternatively or additionally, the photosensitive device 369 may be configured to detect light (e.g., light from the LEDs 388, light from another LED specific for this purpose, etc.) that does not pass through the notch 368 (e.g., passes through another notch or channel, through a component made of translucent material, etc.).

As noted above, the orientation sensing circuit of the control unit 320 may include a switch that includes an electrical contact. In some examples, the base portion 310 may include a second contact that is used to close the switch. For example, the control unit 320 may determine the orientation of the control unit 320 with respect to the base portion 310 based on whether or not the first and second contacts are in electrical communication, where the contacts may be in electrical communication with one another when the control unit 320 is in the first orientation (e.g., the switch is closed and/or the switch is conductive), but not in electrical communication with one another when the control unit 320 is in the second orientation (e.g., the switch is open and/or the switch is non-conductive). For example, the first and second electrical contacts may be similar to the electrical contact pad and shorting member described with reference to FIGS. 2-8.

The orientation sensing circuit of the control unit 320 may include a ball and an LED sensor (not shown), which may operate as a switch. When the control unit 320 is attached to the base portion 310 in the first orientation, the ball may be configured to block the LED sensor, thereby closing the switch. Conversely, when the control unit 320 is attached to the base portion 310 in the second orientation, the ball may not block the LED sensor, and the switch may remain open. As such, the control unit 310 may be configured to determine whether the control unit 320 is attached to the base portion 310 in the first orientation or the second orientation based on whether the ball and LED sensor is in an open or closed position.

The orientation sensing circuit of the control unit 320 may include an inductive sensor that is configured to detect a presence of metal on the control unit 320 or the base portion 310. For example, the inductive sensor may be configured to detect the presence of metal on the control unit 320 (e.g., a trace of coil on a PCB of the control unit) when the control unit 320 is attached to the base portion 310 in the first orientation, but not detect the presence of metal on the control unit 320 when the control unit 320 is attached to the base portion 310 in the second orientation. For instance, the base portion 310 may include a piece of metal on one end/side but not the other, such that the inductive sensor is configured to detect the presence of the metal residing on the base portion 310 when the control unit 320 is attached to the base portion 310 in the first orientation, but not detect the presence of the metal when the control unit 320 is attached to the base portion 310 in the second orientation. In some examples, the base portion 310 may include a shielding element (e.g., a plastic flange) (not shown) that is situated between the inductive sensor and the metal of the control unit 320 when the control unit 320 is in the second orientation, but is not situated between the inductive sensor and the metal of the control unit 320 when the control unit 320 is in the first orientation.

The orientation sensing circuit of the control unit 320 may include an accelerometer (not shown), and the control unit 320 may be configured to determine the orientation of the control unit 320 with respect to the base portion 310 based on feedback from the accelerometer. For instance, the accelerometer may be configured to sense orientation based on a direction of weight change, which for example, may be different when the control unit 320 is attached to the base portion 310 in the first orientation than it is when the control unit 320 is attached to the adapter in the second orientation. Accordingly, the control unit 320 may be configured to determine the orientation of the control unit 320 with respect to the base portion 310 based on feedback from the accelerometer.

The orientation sensing circuit of the control unit 320 may include a manually operated switch. As such, the remote control device 300 may be configured to receive a user input controlling the orientation (e.g., setting or switching the orientation) of the control unit 320 with respect to the base portion 310 via the manually operated switch.

The orientation sensing circuit of the control unit 320 may include one or more of the control circuit of the remote control device 300, the PCB 364 (e.g., the touch sensitive element of the PCB 364), the wireless communication circuit of the remote control device 300, and/or other components of the control unit 320. For instance, the orientation sensing circuit may be configured such that the control circuit of the control unit 320 is configured to receive an indication of the orientation of the control unit 320 during a configuration mode of the control unit 320. For example, the control circuit may receive the indication of the orientation of the control unit 320 by way of a unique user input via the user interface of the control unit 320 and/or via an external device (e.g., a smartphone or tablet). In such examples, the control unit 320 may be placed into the configuration mode using a unique user input via the user interface of the control unit 320 and/or via an external device.

Once in the configuration mode, the control unit 320 may be configured to perform one or more advanced functions, such as orientation determination, pairing of the remote control device 300 to a load control system (e.g., pairing the remote control device 300 to one or more electrical loads, such as lighting loads), configuring control settings for one or more electrical loads (e.g., presets, scene settings, and/or the like), etc. For example, once in the configuration mode, the control unit 320 may be configured to receive the orientation of the control unit 320 from a mobile application residing on an external device. The external device may determine the orientation of the control unit 320 based on user input via the external device or based on feedback determined by the external device (e.g., via use of a camera of the external device, for example, as described with reference to FIG. 36), and the control unit 320 may receive information indication the orientation from the external device (e.g., via the wireless communication circuit of the control unit 320). For example, once in the orientation mode, the control unit 320 may receive a user input (e.g., gesture, point actuation, etc.) that indicates and sets the orientation of the control unit 320.

In some examples, the control unit 320 may be configured to be paired to the load control system and/or determine the orientation of the control unit 320 using a camera of an external device. For example, the control unit 320 may be configured to illuminate the LEDs 388 of the control unit 320 in a unique pattern to communicate an identification of the control unit (e.g., used for pairing the remote control device 300 to the load control system) to the camera of the external device and/or to communication the orientation of the control unit 320 to the camera of the external device. As such, the external device may be configured to determine the orientation of the control unit 320 using the camera of the external device, and the control unit 320 may be configured to receive the orientation of the control unit 320 from the external device via the communication circuit.

After the control unit 320 determines the orientation of the control unit 320 with respect to the base portion 310, the control unit 320 may translate a user input received via the user interface (e.g., the capacitive touch circuit) into control data for controlling for one or more electrical loads based on the orientation of the control unit 320. That is, the control unit 320 may be configured to generate control data based on the orientation of the control unit 320. With knowledge of the orientation of the control unit 320, the control unit 320 can determine the relative location and/or direction of the user input with respect to the user (e.g., which is based on the orientation that the control unit 320 with respect to the adapter). For example, the control unit 320 can determine whether a user input is intended to turn an electrical load on or off, increase or decrease power delivered to the electrical load (e.g., an intensity of a lighting load), cycle through presets and/or scenes of the remote control device, and/or the like based on the orientation of the control unit 320. The user interface of the control unit 320 may be symmetric, for example, about a horizontal axis and/or a vertical axis.

The control circuit of the control unit 320 may be configured to cause the wireless communication circuit to transmit respective control signals that include the generated control data that corresponds to interpreted user inputs received at the touch sensitive surface. For example, the remote control device 300 may be operable to transmit wireless signals, for example radio frequency (RF) signals, to a load control device, one or more electrical loads, and/or a central processor of a load control system. The remote control device 300 may be associated with the load control device and the one or more electrical loads during a configuration procedure of the load control system. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The control circuit may provide an indication (e.g., a visual indication) of an amount of power delivered to the electrical load by the remote control device 300 based on the orientation of the control unit 320. For example, the control circuit may use determination of the orientation of the control unit 320 relative to the base portion 310 to determine which location of the light bar should correspond to a high-end intensity (e.g., approximately 100% intensity) and which location of the light bar should correspond to a low-end intensity (e.g., approximately 1% intensity), for example, when displaying an indication of the amount of power delivered to an electrical load. The control unit 320 may be configured to, based on the determination of orientation, illuminate one or more of the LEDs 388 such that the high-end intensity corresponds to the ending point 358 of the light bar and such that the low-end intensity corresponds to the starting point 356 of the light bar. In this regard, the control unit 320 may ensure proper indication of the high-end and low-end intensities via the LEDs 388 regardless of whether the control unit 320 is mounted to the base portion 310 in the first orientation or the second orientation.

FIGS. 22-31 depict another example remote control device 400 (e.g., a battery-powered remote control device) that may be deployed as the remote control device 120 of the load control system 100 shown in FIG. 1. The remote control device 400 may be configured to be mounted over a paddle actuator of a standard light switch, such as the paddle actuator 404 of a standard decorator paddle style light switch 402 shown in FIG. 22. As shown, the paddle actuator 404 may be surrounded by a bezel portion 405. The light switch 402 may include a faceplate 406. The faceplate 406 may define an opening 408 (e.g., a decorator-type opening) that extends therethrough. The faceplate 406 may be mounted via faceplate screws 409, for instance to a yoke of the switch 402. The standard light switch 402 may be coupled in series electrical connection between an alternating current (AC) power source and one or more electrical loads.

As shown, the remote control device 400 may include a base portion 412 and an actuation portion 410 that is configured to be mounted to the base portion 412. As such, and although not shown, the actuation portion 410 may be releasably attachable to the base portion 412, such that the base portion 412 acts as the mounting structure for the actuation portion 410, for example. Alternatively, the actuation portion 410 may be monolithic with the base portion 412. The actuation portion 410 may include an actuator 411. The actuator 411 may comprise a front surface 414 that defines a user interface of the actuation portion 410. As shown, the actuator 411 may be configured such that the front surface 414 includes an upper portion 416 and a lower portion 418. The actuation portion 410 may include a light bar 420 that is configured to visibly display information at the front surface 414. The user interface of the actuator 411 may be symmetric, for example, about a horizontal axis and/or a vertical axis.

Figure 25:
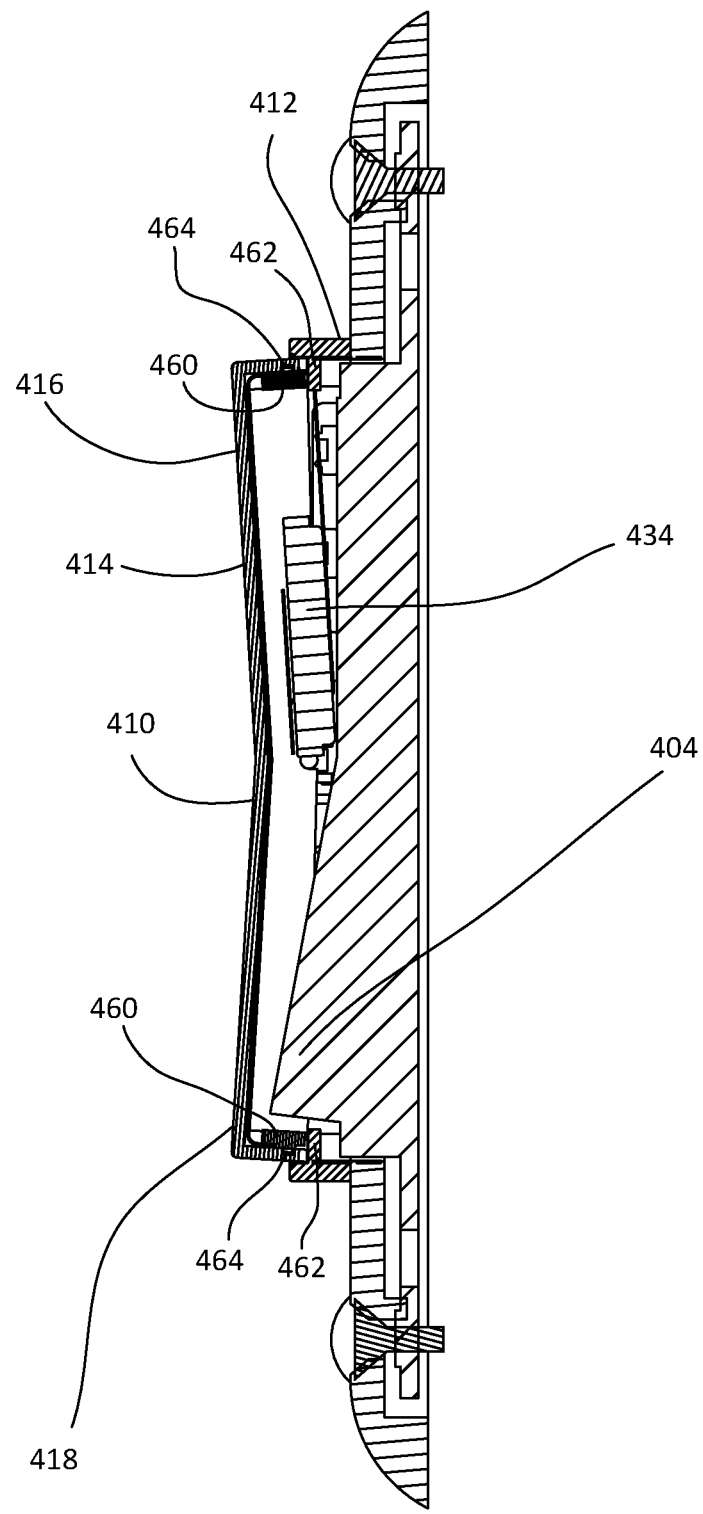
FIG. 25 is a right side sectional view of the example remote control device illustrated in FIG. 22.
Figure 26:
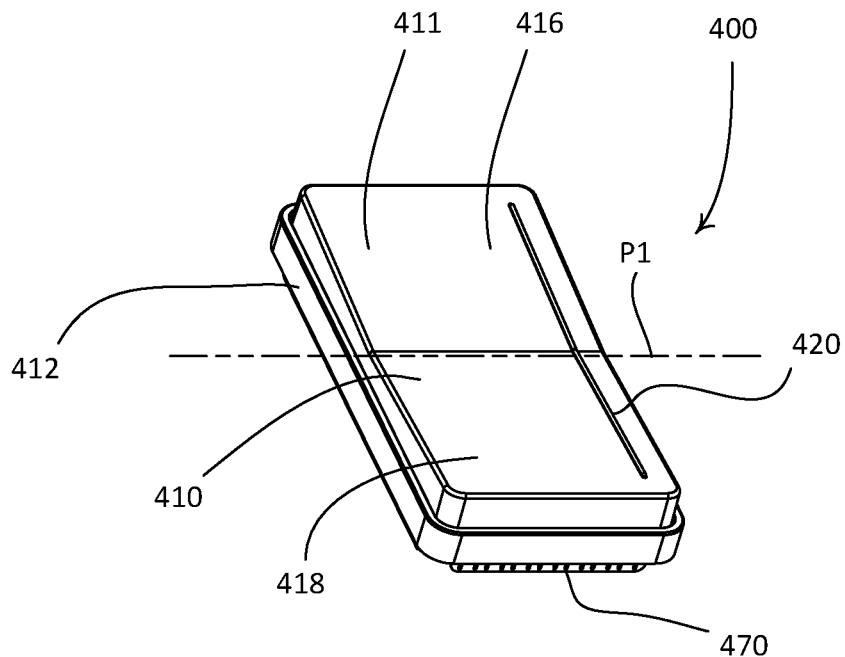
FIG. 26 is a front perspective view of the example remote control device illustrated in FIG. 22, with the remote control device unmounted from a light switch.

The actuation portion 410 may be configured for mechanical actuation of the actuator 411. For example, the actuator 411 may be supported about a pivot axis P1 that extends laterally between the upper and lower portions 416, 418. The actuation portion 410 may include mechanical switches 460 (e.g., as shown in FIG. 25) disposed in respective interior portions of the actuator 411 that correspond to the upper and lower portions 416, 418 of the front surface 414. Actuations of the upper portion 416 of the front surface 414, for example via the application of a force to the upper portion 416 (e.g., resulting from a finger press) may cause the actuator 411 to rotate about the pivot axis P1 such that the upper portion 416 moves inward towards the base portion 412 and actuates a corresponding mechanical switch 460. Actuations of the lower portion 418 of the front surface 414, for example via the application of a force to the lower portion 418 (e.g., resulting from a finger press) may cause the actuator 411 to rotate about the pivot axis P1 such that the lower portion 418 moves inward towards the base portion 412 and actuates a corresponding mechanical switch 460. The actuation portion 410 may be configured such that actuations of actuator 411 are tactile actuations. For instance, actuations of the actuator 411 may provide tactile feedback to a user of the remote control device 400. The actuator 411 may be configured to resiliently reset to a rest position after actuations of the upper and lower portions 416, 418.

The remote control device 400 may transmit commands to one or more controllable electrical loads (e.g., one or more lighting loads that are associated with the remote control device 400) in response to actuations applied to the actuation portion 410, for instance via the actuator 411. For example, the remote control device 400 may transmit commands to turn on one or more associated lighting loads in response to actuations applied to the upper portion 416 of the front surface 414, and may transmit commands to turn off one or more lighting loads in response to actuations applied to the lower portion 418 of the front surface 414 (e.g., when the remote control device 400 is in the first orientation). In accordance with an example implementation, the remote control device 400 may be configured to transmit commands in response to receiving predetermined actuations at the actuation portion (e.g., via the actuator 411). For example, the remote control device 400 may be configured to transmit a command to turn one or more associated lighting loads on to full (e.g., 100% intensity) in response to a double tap applied to the upper portion 416 of the front surface 414 (e.g., two actuations applied to the upper portion 416 in quick succession). The remote control device 400 may be configured to transmit a command to perform a relative adjustment of intensity (e.g., relative to a starting intensity) in response to respective press and hold actuations applied to the upper and/or lower portions 416, 418 of the front surface 414. For example, the remote control device 400 may the respective intensities of one or more associated lighting loads to continually be adjusted (e.g., relative to corresponding starting intensities) while one of the upper or lower portions 416, 418 is continuously actuated.

The front surface 414 of the actuator 411 may further be configured as a touch sensitive surface (e.g., which may include or define a capacitive touch surface). The touch sensitive surface may extend into portions of both the upper and lower surfaces 416, 418 of the front surface 414. For example, the actuation portion 410 may include a capacitive touch circuit (e.g., the capacitive touch circuit 240 of the control unit 230) that may be responsive to user inputs via the capacitive touch surface on the front surface 414 of the actuator 411. This may allow the actuation portion 410 (e.g., the actuator 411) to receive and recognize actuations (e.g., touches) of the front surface 414 that are not tactile actuations, for instance that do not cause the actuator 411 to move at all or to move such that the respective mechanical switches 460 that correspond to the upper and lower portions 416, 418 are not actuated. The remote control device 400 may be configured such that such actuations of the front surface 414 of the actuator 411 do not provide tactile feedback. For example, such actuations of the front surface 414 (e.g., adjacent the light bar 420) may cause the remote control device 400 to transmit commands to adjust the intensity of a lighting load that is associated with the remote control device 400. Examples of such actuations are point actuations and gestures, for example, as described herein (e.g., with reference to FIG. 1).

To illustrate, the remote control device 400 may be configured such that when a user of the remote control device 400 touches the light bar 420 at a location along a length of the light bar 420, the lighting load be set to an intensity that is dependent upon the location of the actuation along the light bar 420. The remote control device 400 may be configured such that when a user slides a finger along the light bar 420, the intensity of an associated lighting load may be raised or lowered according to the position of the finger along the length of the light bar 420. In response to a touch received on the front surface 414 (e.g., adjacent the light bar 420) the light bar 420 may be configured to illuminate along a length that extends from the bottom of the light bar 420 to a position along the length of the light bar 420. The length of such an illumination (e.g., as defined by an amount of the light bar 420 that is illuminated) may correspond to and be indicative of an intensity of an associated lighting load that results from the actuation.

The remote control device 400 may be configured to, if more than one actuation is received via the actuator 411 within a short interval of time (e.g., at substantially the same time), determine which actuation should be responded to, for example by transmitting a command, and which actuation or actuations may be ignored. To illustrate, a user of the remote control device 400 may press the front surface 414 at a location proximate to the light bar 420, with sufficient force such that the actuator 411 pivots about the pivot axis and activates a corresponding one of the mechanical switches 460. Such an operation of the actuator 411 may comprise multiple actuations of the actuation portion 410. For instance, the location of the press of the front surface 414 along the light bar 420 may correspond to an indication of a desired intensity level of an associated lighting load, while the actuation of the mechanical switch 460 may be correspond to an indication by the user to turn on the lighting load to a last-known intensity. The remote control device 400 may be configured to in response to such actuations, ignore the capacitive touch input indication of intensity, and to transmit a command to the associated lighting load to turn on at the last-known intensity. It should be appreciated that the above is merely one illustration of how the remote control device 400 may be configured to respond to multiple such multi-part actuations of the actuation portion 410.

In accordance with the illustrated actuator 411, the upper portion 416 and the lower portion 418 of the front surface 414 define respective planar surfaces that are angularly offset relative to each other. In this regard, the touch-responsive portion of the front surface 414 of the actuator 411 may define and operate as a non-planar slider control of the remote control device 400. However, it should be appreciated that the actuator 411 is not limited to the illustrated geometry defining the upper and lower portions 416, 418. For example, the actuator may be configured to define a front surface having any suitable touch-responsive geometry, for instance such as a curved or wave-shaped touch sensitive surface.

FIGS. 26-31 depict the example remote control device 400, with the remote control device 400 unmounted from the light switch 402. The action portion 410 may include a carrier 430. For example, the carrier 430 that may be configured to be attached to a rear surface of the actuation portion 410. The carrier 430 may support a flexible printed circuit board (PCB) 432 on which a control unit (not shown) and/or a wireless communication circuit (not shown) may be mounted. The control unit may be in electrical communication with the capacitive touch circuit, and the wireless communication circuit may be in electrical communication with the control unit. The flexible PCB 432 may be configured such that the capacitive touch circuit is spaced from the control unit, the wireless communication circuit, and/or other "noisy" circuitry of the flexible PCB 432. This may improve operational efficiency of the capacitive touch circuit.

The remote control device 400 may include a battery 434 for powering the control unit. The battery 434 may be received within a battery opening 436 defined by the carrier 430. The remote control device 400 may include a plurality of light-emitting diodes (LEDs) that may be mounted to the PCB 432. The LEDs may be arranged to illuminate the light bar 420. For example, the LEDs may be arranged in a linear array.

The actuator 411 may be pivotally coupled to, or supported by, the base portion 412. For example, as shown the base portion 412 may define cylindrical protrusions 440 that extend outward from opposed sidewalls 442 of the base portion 412. The protrusions 440 may be received within openings 444 that extend into rear surfaces of corresponding sidewalls 446 of the actuator 411. The protrusions 440 may define the pivot axis P1 about which the actuator 411 may pivot. As shown, each protrusion 440 may be held in place within a corresponding opening 444 by a respective hinge plate (e.g., thin metal hinge plates). Each hinge plate may be connected to the rear surface of a respective sidewall 446, for example via heat stakes. The hinge plates may be thin to maximize a distance between the hinge plate and the bezel portion 405 of the light switch 402.

The flexible PCB 432 may be located immediately behind the front surface 414 of the actuation portion 410 and may include the capacitive touch circuit. For example, the flexible PCB 432 may include capacitive touch traces such that the front surface 414 defines a capacitive touch surface. Actuations applied to the upper and lower portions 416, 418 of the front surface 414 of the actuation portion 410 may also provide tactile feedback, for instance as described herein. The remote control device 400 may include one or more mechanical tactile switches 460 (e.g., side-actuating tactile switches) that may be mounted to and electrically coupled to the flexible PCB 432. For example, the remote control device 400 may include a first mechanical tactile switch 460 that is mounted so as to be activated by an actuation applied to the upper portion 416 of the front surface 414 and a second mechanical tactile switch 460 that is mounted so as to be activated by an actuation applied to the lower portion 418 of the front surface 414. The mechanical tactile switches 460 may be positioned such that respective actuation portions of the mechanical tactile switches 460 are positioned proximate to corresponding contact surfaces 462 defined by the base portion 412. Each mechanical tactile switch 460 may include a foot 464 that is captively retained in a corresponding opening of the actuator 411.

The flexible PCB 432 may bend towards the locations in which the mechanical tactile switches 460 are located. In accordance with the illustrated configuration, when a force is applied to the lower portion 418 of the front surface 414 that causes the lower portion 418 to pivot inward about the pivot axis P1 towards the base portion 412, the actuation portion of the corresponding mechanical tactile switch 460 may make contact with the contact surface 462, thereby causing activation of the mechanical tactile switch 460. The mechanical tactile switch 460 may operate to return the actuator 411 to a rest position. Return of the actuator 411 to the rest position may provide tactile feedback indicative of activation of the mechanical tactile switch 460. The mechanical tactile switch 460 may be electrically coupled to the control unit on the flexible PCB 432, such that the control unit is responsive to the actuation of the mechanical tactile switch 460.

The mechanical tactile switches 460 may not be electrically coupled to the flexible PCB 432 and may operate merely to provide tactile feedback responsive to actuations of the actuator 411. In such an implementation, the control unit (e.g., via the capacitive touch circuit) may be responsive to the capacitive touch surface of the front surface 414 to determine a location of an actuation, for instance to determine whether the upper portion 416 or the lower portion 418 of the front surface 414 was actuated. Further, the mechanical tactile switches 460 may be coupled to the base portion 412 rather than the actuator 411 for providing tactile feedback.

The actuation portion 324 of the remote control device 300 shown in FIGS. 9-21 may be configured to pivot about a pivot axis to allow for actuations of upper and lower portions (e.g., to turn the controlled electrical load(s) on and off, respectively). The remote control device 300 may include mechanical tactile switches to provide tactile feedback in response to actuations of the upper and lower portions of the actuation portion 324. In addition, the remote control device 300 may be configured to raise and lower the intensity of the controlled lighting load in response to actuations of the upper and lower portions, respectively. As noted herein, the actuation portion may include a touch-sensitive circuit (e.g., a capacitive touch circuit) for receiving actuations (e.g., point actuations, gestures, etc.).

Figure 22:
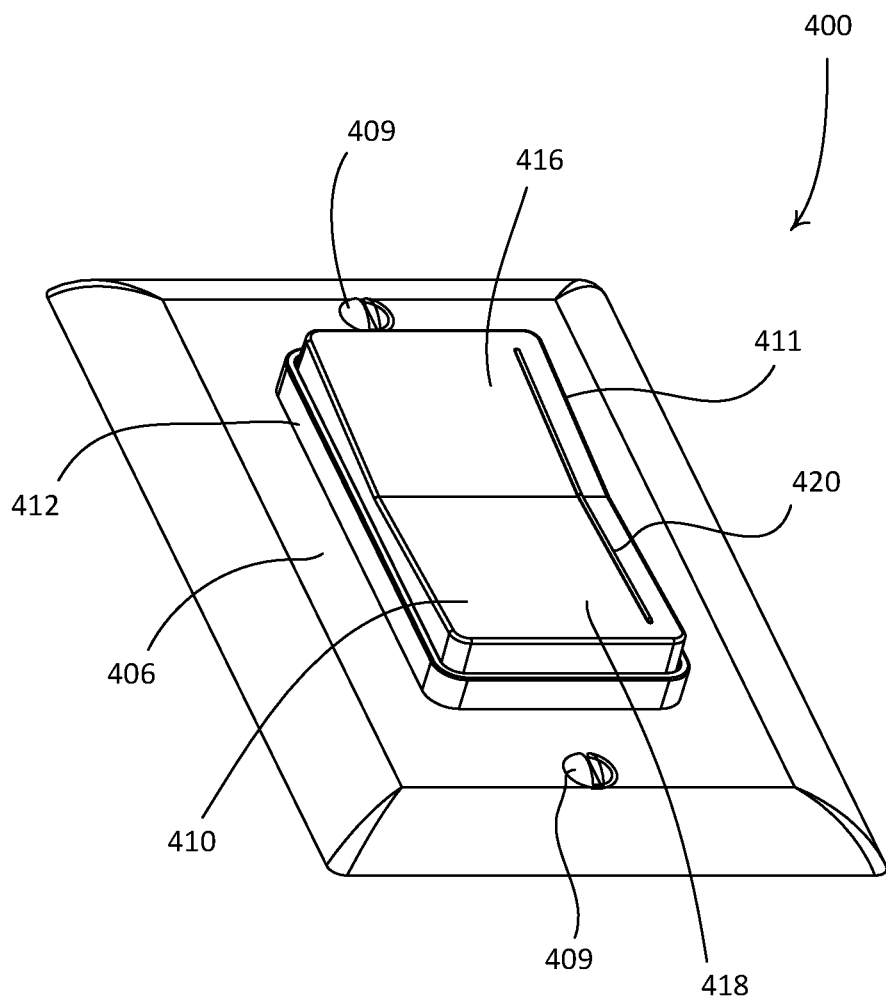
FIG. 22 is a perspective view of another example remote control device.
Figure 24:
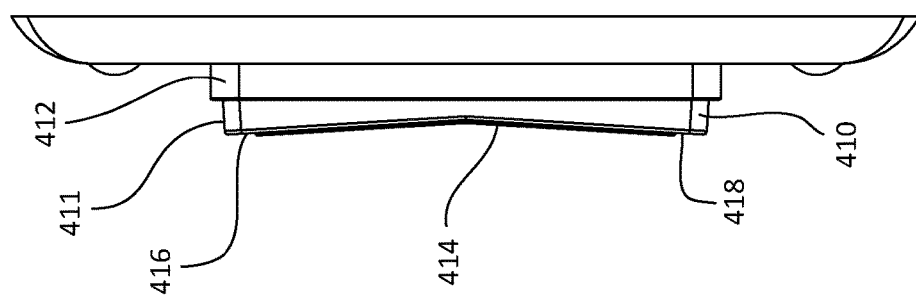
FIG. 24 is a right side view of the example remote control device illustrated in FIG. 22.
Figure 23:
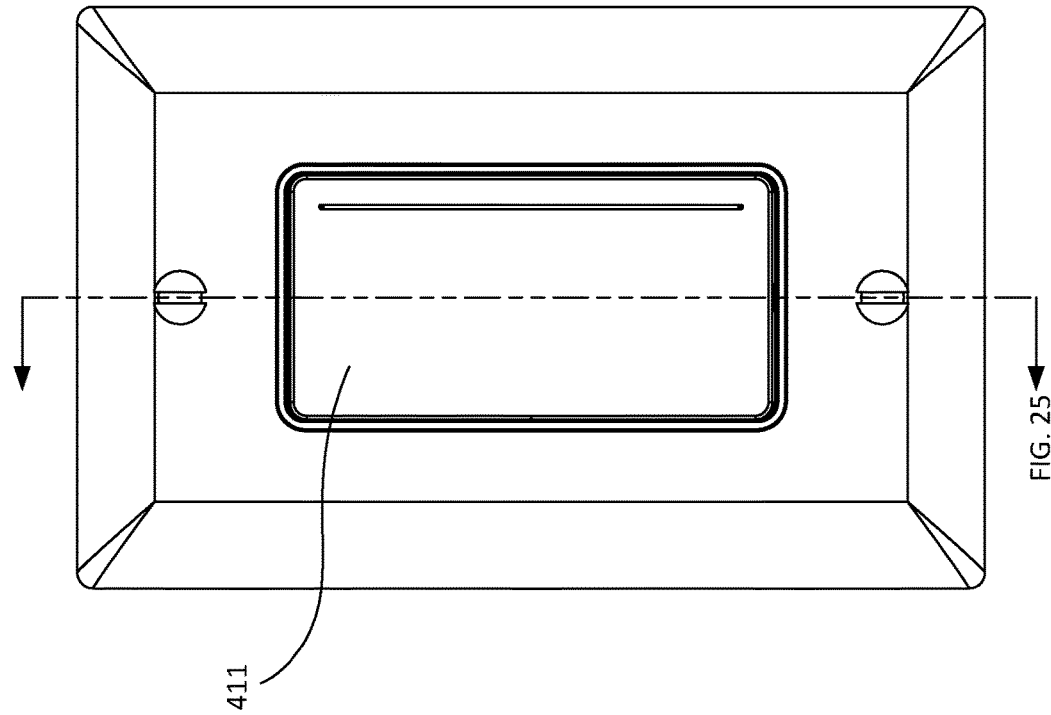
FIG. 23 is a front view of the example remote control device illustrated in FIG. 22.

The remote control device 400 may include a mounting structure that is configured to enable attachment of the remote control device 400 to a standard light switch, such as the standard decorator style light switch 402 shown in FIG. 22. For example, the remote control device 400 may include a mounting structure that enables attachment of the remote control device 400 to the light switch 402. The base portion 412 may, for example, operate as a mounting structure for the remote control device 400. For instance, the base portion 412 that includes a plurality of extensions 470 (e.g., thin flat planar extensions) that protrude outward from the base portion 412 and enable attachment of the remote control device 400 to the light switch 402. The actuation portion 410 may be configured to be attached to the base portion 412, for example, after the base portion 412 is attached to the light switch 402. As such, and although not shown, the base portion 412 may be detachable from the actuation portion 410. Alternatively, the actuation portion 410 may be monolithic with the base portion 412, for example, such that the actuation portion 410 and base portion 412 are configured to be attached to the light switch 402 as a singular unit.

The extensions 470 may be configured to be disposed into a gap 472 defined between the bezel portion 405 and the opening 408 of the faceplate 406 of the light switch 402. The extensions 470 may operate to maintain the remote control device 400 in a mounted position relative to the light switch 402, for example such that the base portion 412 abuts corresponding portions of the faceplate 406. Each extension 470 may be configured to allow insertion of the extension 470 into the gap 472 and to resist removal of the extensions from the gap 472 once the remote control device 400 is secured in a mounted position relative to the light switch. For example, as shown each extension 470 may define a plurality of barbs 474. The barbs 474 may be configured as spring-style barbs that are configured to deflect and slide along structure of the faceplate 406 as the extensions 470 are inserted into the gap 472 along a first direction, and to bite into surrounding structure of the faceplate 406 when pulled in an opposed second direction to hinder removal of the remote control device 400 from the light switch 402.

Figure 27:
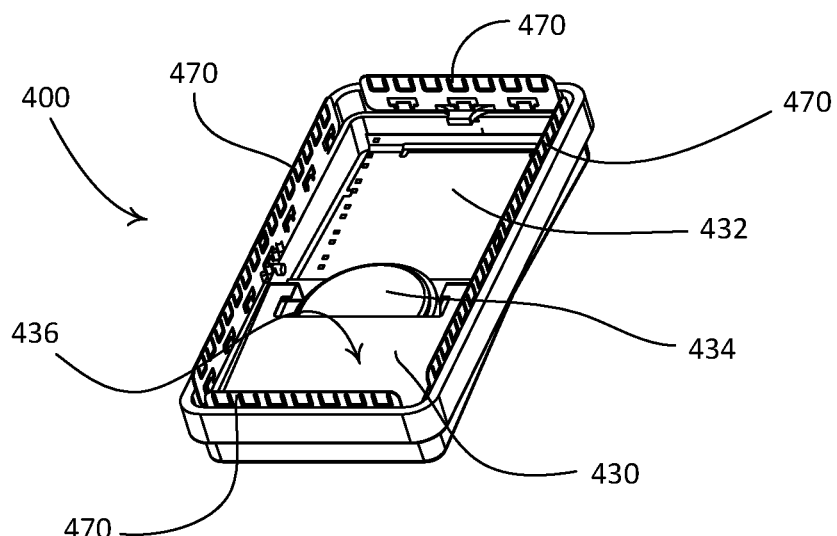
FIG. 27 is a rear perspective view of the example remote control device illustrated in FIG. 22, with the remote control device unmounted from the light switch.
Figure 31:
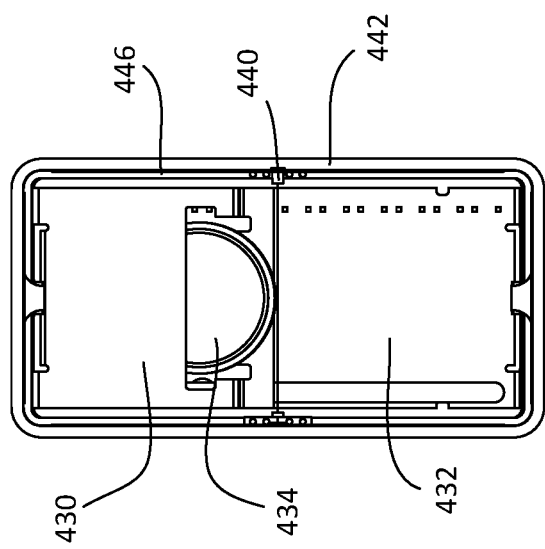
FIG. 31 is a rear view of the example remote control device illustrated in FIG. 22, with the remote control device unmounted from the light switch.

As shown in FIG. 27, the base portion 412 may include extensions 470 that extend along each side of the base portion 412. However, it should be appreciated that the remote control device 400 is not limited to the illustrated number or configurations of extensions 470. For example, the mounting structure of the remote control device 400 may include extensions 470 along two sides (e.g., opposing sides) of the base portion 412, or may include extensions 470 along three sides of the base portion 412. The remote control device 300 shown in FIGS. 9-21 may be provided with extensions (e.g., similarly configured to extensions 470) that are configured to be disposed into a gap between the faceplate 306 and the toggle actuator 304.

The actuation portion 410 may comprise an orientation sensing circuit (not shown), such that the control unit of the remote control device 400 is configured to determine an orientation of the actuation portion 410. For example, through the use of the orientation sensing circuit, the actuation portion 410 may determine its orientation relative to the space where it is installed (e.g., based on gravity) and/or its orientation relative to another component, such as the base portion 412, the light switch 402 etc. For example, the remote control device 400 may be configured to determine whether the actuation portion 410 is attached to the base portion 412 in a first orientation in which the upper portion 416 of the actuator 410 is located closer to an upper end of the light switch 402 (e.g., as shown in FIGS. 22-31), or is attached to the base portion 412 in a second orientation in which the upper portion 416 of the actuator 410 is located closer to a lower end of the light switch 402.

The remote control device 400 may, for example, determine (e.g., automatically determine) the orientation of the actuation portion 410 relative to the base portion 412 upon the remote control device 400 being mounted to the light switch 402. For example, the remote control device 400 may automatically determine the orientation of the actuation portion 410 relative to the base portion 412 upon the remote control device 400 being mounted to the light switch 402 without any user input. Alternatively or additionally, the remote control device 400 may determine the orientation of the actuation portion 410 relative to the base portion 412 each time the remote control device 400 wakes up from an off or sleep state.

The orientation sensing circuit may comprise a switch (e.g., a portion of a switch or the entirety of a switch), such as one or more the electrical contacts, a tactile switch, a gravity switch, a mercury switch, a ball and LED sensor switch, and/or the like. Alternatively or additionally, the orientation sensing circuit may comprise an optocoupler, an inductive sensor, a photosensitive device (e.g., a photodiode), a hall-effect sensor circuit (e.g., or a reed switch), an accelerometer, a gyroscope, the wireless communication circuit of the remote control device 400, and/or other components of the remote control device 400. Further, the orientation sensing circuit may be configured such that an orientation of the remote control device 400 may be determined (e.g., specified) during a configuration process of the remote control device 400, for instance when pairing the remote control device 400 to a load control system (e.g., as described with reference to FIGS. 35 and 36).

As noted above, the orientation sensing circuit may include a switch that includes an electrical contact. In some examples, the base portion 412 may include a second contact that is used to close the switch. For example, the control unit may determine the orientation of the actuation portion 410 with respect to the base portion 412 based on whether or not the first and second contacts are in electrical communication, where the contacts may be in electrical communication with one another when the actuation portion is attached to the base portion 412 in a first orientation (e.g., the switch is closed and/or the switch is conductive), but not in electrical communication with one another when the actuation portion 410 is attached to the base portion 412 in a second orientation (e.g., the switch is open and/or the switch is non-conductive).

The orientation sensing circuit of the remote control device 400 may include a gravity switch or a mercury switch. In such examples, the gravity switch or mercury switch may be configured to be in a closed position when the remote control device 400 is connected to the light switch 402 in a first orientation, and in an open position when the remote control device 400 is connected to the light switch 402 in a second orientation. Accordingly, the remote control device 400 may be configured to determine the orientation of the remote control device 400 with respect to the light switch 402 based on whether the gravity switch or mercury switch is in the open or closed position.

The orientation sensing circuit may include a tactile switch, and the base portion 412 may include a protrusion (not shown). For example, if the base portion 412 includes the protrusion, then the protrusion may be configured to actuate the tactile switch when the actuation portion 410 is attached to the base portion 412 in the first orientation, but not actuate the tactile switch when the actuation portion 410 is attached to the base portion 412 in the second orientation. As such, the control unit may be configured to determine the orientation of the actuation portion 410 with respect to the base portion 412.

The orientation sensing circuit of the remote control device 400 may include a ball and an LED sensor, which may operate as a switch. When the actuation portion 410 is attached to the base portion 412 in the first orientation, the ball may be configured to block the LED sensor, thereby closing the switch. Conversely, when the actuation portion 410 is attached to the base portion 412 in the second orientation, the ball may not block the LED sensor, and the switch may remain open. As such, the remote control device 400 may be configured to determine whether the actuation portion 410 is attached to the base portion 412 in the first orientation or the second orientation based on whether or not the ball and LED sensor is in an open or closed position.

The orientation sensing circuit may include an inductive sensor that is configured to detect a presence of metal on the actuation portion 410 and/or the base portion 412. For example, the inductive sensor may be configured to detect the presence of metal on the actuation portion 410 (e.g., a trace of coil on the PCB 432) when the actuation portion 410 is attached to the base portion 412 in the first orientation, but not detect the presence of metal on the action portion 410 when the actuation portion 410 is attached to the base portion 412 in the second orientation. For instance, the base portion 412 may include a piece of metal on one end but not the other, such that the inductive sensor is configured to detect the presence of the metal residing on the base portion 412 when the actuation portion 410 is attached to the base portion 412 in the first orientation, but not detect the presence of the metal when the actuation portion 410 is attached to the base portion 412 in the second orientation. In some examples, the base portion 412 may include a shielding element (e.g., a plastic flange) (not shown) that is situated between the inductive sensor and the metal of the actuation portion 410 when the actuation portion 410 is attached in the second orientation, but is not situated between the inductive sensor and the metal of the actuation portion 410 when the actuation portion 410 is attached in the first orientation.

The orientation sensing circuit of the actuation portion 410 may include a photosensitive device, such as a photodiode, that is configured to detect light that originates external to the remote control device 400 (e.g., ambient light) and/or internal to the remote control device 400 (e.g., light from the LEDs of the remote control device 400). For example, the remote control device 400 (e.g., the actuation portion 410 and/or the base portion 412) may include one or more of a blocking element (e.g., opaque material) or guiding element (e.g., a notch, channel, components made from a translucent material, a reflective component, etc.). If the remote control device 400 includes a blocking element, then the blocking element may block light (e.g., internal or external light) from reaching the photosensitive device when the actuation portion 410 is in the second orientation, but not block light when the actuation portion 410 is in the first orientation. Similarly, if the remote control device 400 includes a guiding element, then the guiding element may allow light (e.g., internal or external light) to reach the photosensitive device when the actuation portion 410 is in the first orientation, but not allow light to reach the photosensitive device when the actuation portion 410 is in the second orientation. Therefore, the actuation portion 410 may be configured to determine whether the actuation portion 410 is attached to the base portion 412 in a first orientation or a second orientation based on whether or not the photosensitive device detects light.

For example, the adapter 410 may include a notch or channel (not shown) that is configured to line up with the photosensitive device when the actuation portion 410 is attached to the base portion 412 in a first orientation, but not line up with the photosensitive device when the actuation portion 410 is attached to the base portion 412 in a second orientation. The notch or channel may define an opening through the base portion 412 to allow light (e.g., ambient light, light from the LEDs 246, light from an LED specific for this purpose, etc.) to pass through the base portion 412. According, the photosensitive device may be configured to detect light through the notch or channel when the actuation portion 410 is attached to the base portion 412 in the first orientation, but not detect light through the notch or channel when the actuation portion 410 is attached to the base portion 412 in the second orientation.

The orientation sensing circuit may include a hall-effect sensor circuit, and the base portion 412 may include a magnet (not shown). When the magnet and hall-effect sensing circuit are aligned, the hall-effect sensing circuit may detect an electromagnetic field of the magnet and provide feedback to the control unit. For instance, the magnet and hall-effect sensor circuit may be aligned when actuation portion 410 is attached to the base portion 412 in the first orientation, but not aligned when the actuation portion 410 is attached to the base portion 412 in the second orientation. Accordingly, the remote control device 400 may be configured to determine the orientation of the actuation portion 410 is attached to the base portion 412 based on whether or not the control unit receives a signal from the hall-effect sensing circuit indicating that magnet and hall-effect sensing circuit are aligned. In some examples, the hall-effect sensor circuit may include a multi-axis hall-effect sensor (e.g., a three-axis hall-effect sensor). The multi-axis hall-effect sensor may allow the orientation sensing circuit to detect orientations are a variety of degrees of angle, such as a 15° angle, a 30° angle, a 45° angle, a 60° angle, a 75° angle, etc.

The orientation sensing circuit of the remote control device 400 may include an accelerometer, and the remote control device 400 may be configured to determine the orientation of the remote control device 400 with respect to the light switch 402 based on feedback from the accelerometer. For instance, the accelerometer may be configured to sense orientation based on a direction of weight change, which for example, may be different when the remote control device 400 is attached to the light switch 402 in a first orientation than it is when the remote control device 400 is attached to the adapter in a second orientation. Accordingly, the remote control device 400 may be configured to determine the orientation of the remote control device 400 with respect to the light switch 402 based on feedback from the accelerometer.

The orientation sensing circuit of the remote control device 400 may include a manually operated switch. As such, the remote control device 400 may be configured to receive a user input controlling the orientation (e.g., setting or switching the orientation) of the remote control device 400 with respect to the light switch 402 via the manual switch.

The orientation sensing circuit of the remote control device 400 may include one or more of the control unit of the remote control device 400, the PCB 432 (e.g., via the touch response surface), the wireless communication circuit of the remote control device 400, and/or other components of the remote control device 400. For instance, the orientation sensing circuit may be configured such that the control unit of the remote control device 400 is configured to receive an indication of the orientation of the remote control device 400 during a configuration mode of the remote control device 400. For example, the control unit may receive the indication of the orientation of the remote control device 400 by way of a unique user input via the user interface of the remote control device 400 and/or via an external device (e.g., a smartphone or tablet). In such examples, the remote control device 400 may be placed into the configuration mode using a unique user input via the user interface of the remote control device 400 and/or via an external device.

Once in the configuration mode, the remote control device 400 may be configured to perform one or more advanced functions, such as orientation determination, pairing of the remote control device 400 to a load control system (e.g., pairing the remote control device 400 to one or more electrical loads, such as lighting loads), configuring control settings for one or more electrical loads (e.g., presets, scene settings, and/or the like), etc. For example, once in the configuration mode, the remote control device 400 may be configured to receive the orientation of the remote control device 400 from a mobile application residing on an external device. The external device may determine the orientation of the remote control device 400 based on user input via the external device or based on feedback determined by the external device (e.g., via use of a camera of the external device, for example, as described with reference to FIG. 36), and the remote control device 400 may receive information indication the orientation from the external device (e.g., via the wireless communication circuit of the remote control device 400). For example, once in the orientation mode, the remote control device 400 may receive a user input (e.g., gesture, point actuation, etc.) that indicates and sets the orientation of the remote control device 400.

In some examples, the remote control device 400 may be configured to be paired to the load control system and/or determine the orientation of the remote control device 400 using a camera of an external device. For example, the remote control device 400 may be configured to illuminate the LEDs of the remote control device 400 in a unique pattern to communicate an identification of the control unit (e.g., used for pairing the remote control device 400 to the load control system) to the camera of the external device and/or to communication the orientation of the remote control device 400 to the camera of the external device. As such, the external device may be configured to determine the orientation of the remote control device 400 using the camera of the external device, and the remote control device 400 may be configured to receive the orientation of the remote control device 400 from the external device via the communication circuit.

After the remote control device 400 determines the orientation of the remote control device 400 with respect to the light switch 402, the remote control device 400 may translate a user input received via the user interface (e.g., the capacitive touch circuit) into control data for one or more electrical loads based on the orientation of the remote control device 400. That is, the remote control device 400 may be configured to generate control data based on the orientation of the remote control device 400. With knowledge of the orientation of the remote control device 400, the remote control device 400 can determine the relative location and/or direction of the user input with respect to the user (e.g., which is based on the orientation that the remote control device 400 with respect to the adapter). For example, the remote control device 400 can determine whether a user input is intended to turn an electrical load on or off, increase or decrease power delivered to the electrical load (e.g., an intensity of a lighting load), cycle through presets and/or scenes of the remote control device, and/or the like based on the orientation of the remote control device 400.

The control unit of the remote control device 400 may be configured to cause the wireless communication circuit to transmit respective control signals that include the control data that corresponds to interpreted user inputs received at the capacitive touch circuit. For example, the remote control device 400 may be operable to transmit wireless signals, for example RF signals, to a load control device, one or more electrical loads, and/or a central processor of a load control system. The remote control device 400 may be associated with the load control device and the one or more electrical loads during a configuration procedure of the load control system. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The control unit may provide an indication (e.g., a visual indication) of an amount of power delivered to the electrical load by the remote control device 400 based on the orientation of the remote control device 400. For example, the control unit may use determination of the orientation of the remote control device 400 relative to the light switch 402 to determine which end of the array of LEDs should correspond to a high-end intensity (e.g., approximately 100% intensity) and which end of the array of LEDs should correspond to a low-end intensity (e.g., approximately 1% intensity), for example, when displaying an indication of the amount of power delivered to an electrical load. The remote control device 400 may be configured to, based on the determination of orientation, illuminate one or more of the LEDs such that the high-end intensity corresponds to an upper end of the LED array and such that the low-end intensity corresponds to a lower end of the LED array. In this regard, the remote control device 400 may ensure proper indication of the high-end and low-end intensities via the LEDs regardless of whether the remote control device 400 is mounted to the light switch 402 in the first orientation or the second orientation (e.g., based on whether the on position of the light switch 402 corresponds to the paddle actuator 404 being placed in the up position or to the down position).

Any of the remote control devices described herein may be created as an integrated, monolithic unit. For example, the adapter 210, the control unit 230, and the faceplate 260 may be a single integrated unit of the remote control device 200; the base portion 310 and the control unit 320 may be a single integrated unit of the remote control device 300; and the base portion 412 and actuation portion 410 may be a single integrate unit of the remote control device 400. In such embodiments, the remote control device may be configured to determine its relative orientation with respect to the light switch and/or the faceplate. For example, the remote control device may be configured to be attached to light switch through the use of a plurality of extensions (e.g., thin flat planar extensions) that protrude outward from the remote control device (e.g., similar to the extensions 470). Accordingly, after the remote control device is attached to the light switch, the remote control device may be configured to determine its relative orientation with respect to the light switch and/or the faceplate, and, for example, generate control data and/or provide feedback based on the orientation of the remote control device. In such instances, the remote control device may include an orientation sensing circuit that includes any of the devices described herein, such as an accelerometer, gravity switches, gyroscopes, etc.

Any of the remote control devices described herein (e.g., the remote control devices 200, 300, and/or 400) may be configured to be mounted on surfaces and/or devices other than a standard wall-switch. For example, the remote control device may be configured to be mounted to a tabletop pedestal. In such instances, the remote control device may be oriented in a plurality of orientations, where for example, some of which may be at varying angles (e.g., at a 45° angle, 60° angle, etc.) with respect to the floor. The control unit of the remote control device may be configured to determine the orientation of the remote control device via an orientation sensing circuit, for example, as described herein (e.g., via an accelerometer, a multi-axis sensor, etc.). For example, the control unit may be configured to detect that the remote control device is attached to the pedestal and then determine its orientation. The orientation may be an orientation that would never occur in a wall/switch installation (e.g., at a 45° angle). For example, when the remote control device is installed in a wall/switch installation, the remote control device (e.g., the front surface of the remote control device) may be oriented at approximately 90° angle with respect to the floor (e.g., regardless of whether the "top" of the remote control device is facing up or down). When the remote control device is attached to a pedestal, for example, the remote control device (e.g., the front surface of the remote control device) may be oriented at a different angle with respect to the floor (e.g., at a 15° angle, a 30° angle, a 45° angle, a 60° angle, a 75° angle, etc. with respect to the floor). Accordingly, the remote control device may be configured to be attached to multiple surfaces and/or pedestals each characterized by different mounting orientations (e.g., mounting angles), and be configured to determine its orientation (e.g., with respect to the floor). An example of a tabletop pedestal for a remote control device is described in greater detail in commonly-assigned U.S. Patent Publication No. 2011/0266122, published Nov. 3, 2011, entitled "Operating Buttons With Disappearing Triangular Indicia," the entire disclosure of which is hereby incorporated by reference.

In some examples, the control unit may be configured to determine the orientation of the device (e.g., and in turn the mounting condition), and be configured to change the functionality of the remote control device accordingly. For example, the remote control device may be configured to adjust its responses (e.g., control data) and/or feedback for one or more inputs based on the orientation of the remote control device. In this regards, the remote control device may be configured to operate differently based on how or what the remote control device is mounted, for example, without requiring user configuration. For example, the remote control device may be configured to operate in a first mode (e.g., a wall-mount mode) to control a signal electrical load if the control circuit determines that the remote control device is mounted in a first orientation (e.g., at a 90° angle, for example, on a wall or switch), and be configured to operate in a second mode (e.g., a pedestal mode) to control multiple electrical loads (e.g., send a broadcast message) if the control circuit determines that the remote control device is mounted in a second orientation (e.g., at a 45° angle, for example, on a tabletop pedestal).

Figure 32:
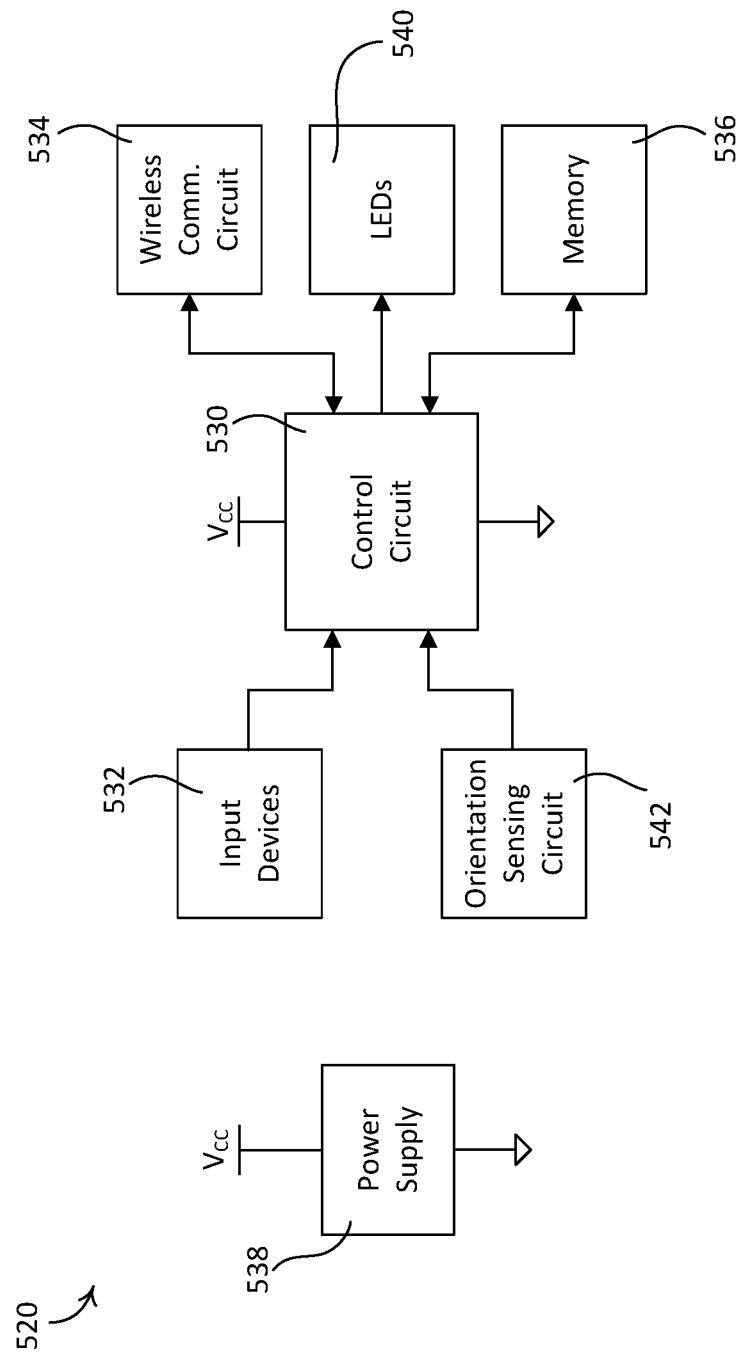
FIG. 32 is a simplified equivalent schematic diagram of an example control unit for the example remote control device.

FIG. 32 is a simplified schematic diagram of an example control unit 520 for a remote control device (e.g., the control unit of the remote control device 120 shown in FIG. 1, the control unit 230 of the remote control device 200 shown in FIGS. 2-8, the control unit 320 of the remote control device 300 shown in FIGS. 9-21, the control unit of the remote control device 400 shown in FIGS. 22-31, etc.). The control unit 520 may include a control circuit 530, one or more input devices 532, a wireless communication circuit 534, a memory 536, a battery 538, one or more LEDs 540, and an orientation sensing circuit 542. The orientation sensing circuit 542 may include any of the orientation sensing circuits described herein. The input devices 532 may include an actuator, a rotating portion (e.g., a rotary knob), and/or a touch sensitive circuit (e.g., a capacitive touch circuit, for example, the capacitive touch circuit 240), for example, as described herein. The input devices 532 may be configured to translate a received user input (e.g., a force applied to the actuator(s), a force and/or time of user contact with the touch sensitive surface, a rotational speed and/or direction of a rotary knob, etc.) into input signals, and provide the input signals to the control circuit 530.

The control circuit 530 may include one or more of a processor (e.g., a microprocessor), a microcontroller, a programmable logic device (PLD), a field programmable gate array (FPGA), an application specific integrated circuit (ASIC), or any suitable controller or processing device. The control circuit 530 may be operatively coupled to one or more components of the control unit 520. The control circuit 530 may be configured to receive user inputs, generate control data, transmit control signals that include the control data, control the LEDs 540, etc. For example, the control circuit 530 may be configured to translate the input signals received from the input devices 532 into control data for transmission to one or more external electrical loads via the wireless communication circuit 534. The wireless communication circuit 534 may include a transmitter and/or receiver (e.g., a transceiver), such as a wireless RF transceiver, and one or more antennas. The control circuit 530 may be configured to receive, among other things, pairing information, its relative orientation, feedback from one or more electrical loads via the wireless communication circuit 534, and/or inputs from one or more remote input devices (e.g., the remote control device 130). The control circuit 530 may control the one or more of the LEDs 540 to illuminate to provide feedback to the user. The LEDs 540 may be configured to illuminate a light bar and/or to serve as indicators of various conditions.

The memory 536 may be configured to store one or more operating parameters of the remote control device. The memory 536 may be communicatively coupled to the control circuit 530 for the storage and/or retrieval of, for example, operational settings, such as, current control settings of one or more electrical loads, pairing and/or identification of one or more electrical loads, the orientation of the control unit 520, etc. The memory 536 may be implemented as an external integrated circuit (IC) or as an internal circuit of the control circuit 530. The power supply 538 (e.g., a battery) may store and supply a direct-current (DC) supply voltage $V_{CC}$ for powering the control circuit 530 and the other low-voltage circuitry of the remote control device.

Figure 33:
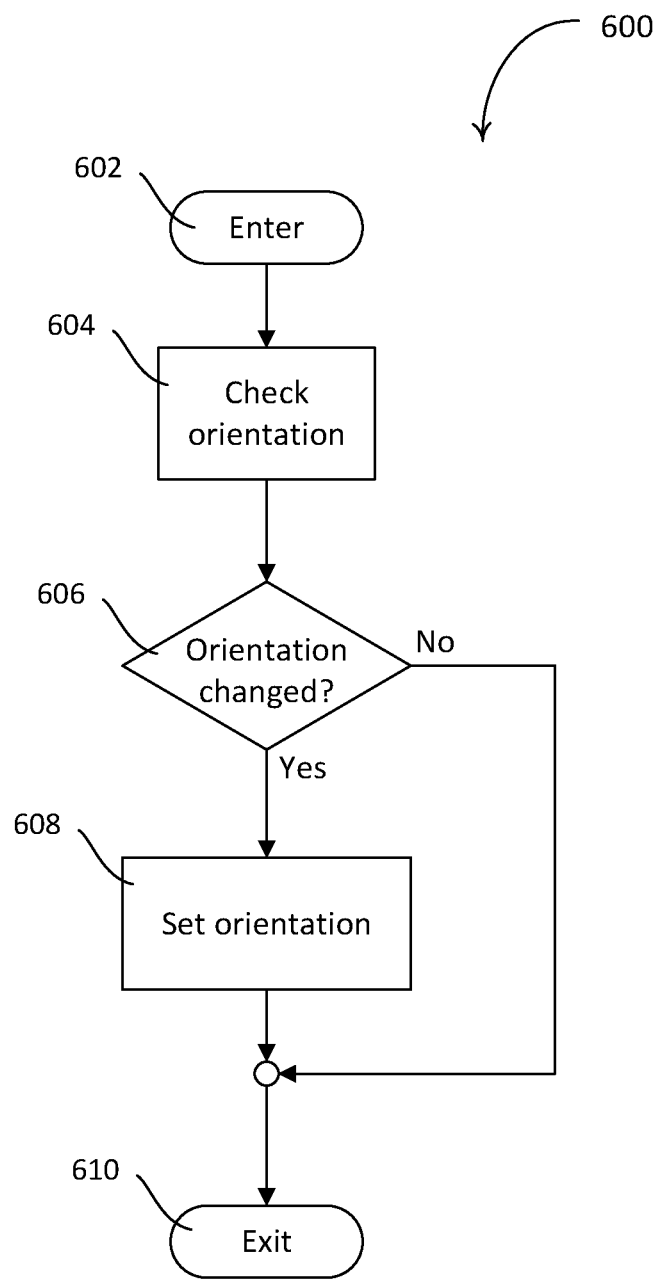
FIG. 33 is a flowchart of an example of an orientation detection procedure that may be performed by a remote control device.

FIG. 33 is a flowchart of an example of an orientation detection procedure 600 that may be performed by a remote control device (e.g., by a control unit of the remote control device). For example, the orientation detection procedure 600 may be performed by any of the remote control devices described herein, such as the remote control device 100, 200, 300, or 400. The orientation detection procedure 600 may begin at 602. At 602, the remote control device may wake up, for example, from a low power state, such as a sleep state or an off state (e.g., one or more components of the control unit may be off or in a lower battery consumption state). The remote control device may wake up, for example, after receiving a user input via an input device, receiving a signal via a wireless communication circuit, and/or the like. At 604, the remote control device may check its orientation. For example, the control unit and/or actuation portion of the remote control device may be configured to determine its orientation, for example, with respect to a mounting structure of the remote control device (e.g., a base portion) and/or in response to an orientation sensing circuit, for example, as described herein.

At 606, the remote control device determines whether its orientation has changed since it was last awake. For example, the remote control device may determine whether its current orientation matches with the orientation it has saved in memory. If the remote control device determines that its orientation did not change at 606, then the remote control device may exit the orientation detection procedure 600 at 610. If the remote control device determines that its orientation did change at 606 (e.g., or is being set for the first time), then the remote control device may configure itself to its current orientation at 608. For example, the remote control device may translate a user input received via a user interface of the remote control device into control data for controlling for one or more electrical loads based on the orientation of the remote control device, and/or the remote control device may provide an indication (e.g., a visual indication) of an amount of power delivered to the electrical load by the remote control device based on the orientation of the remote control device.

Figure 34:
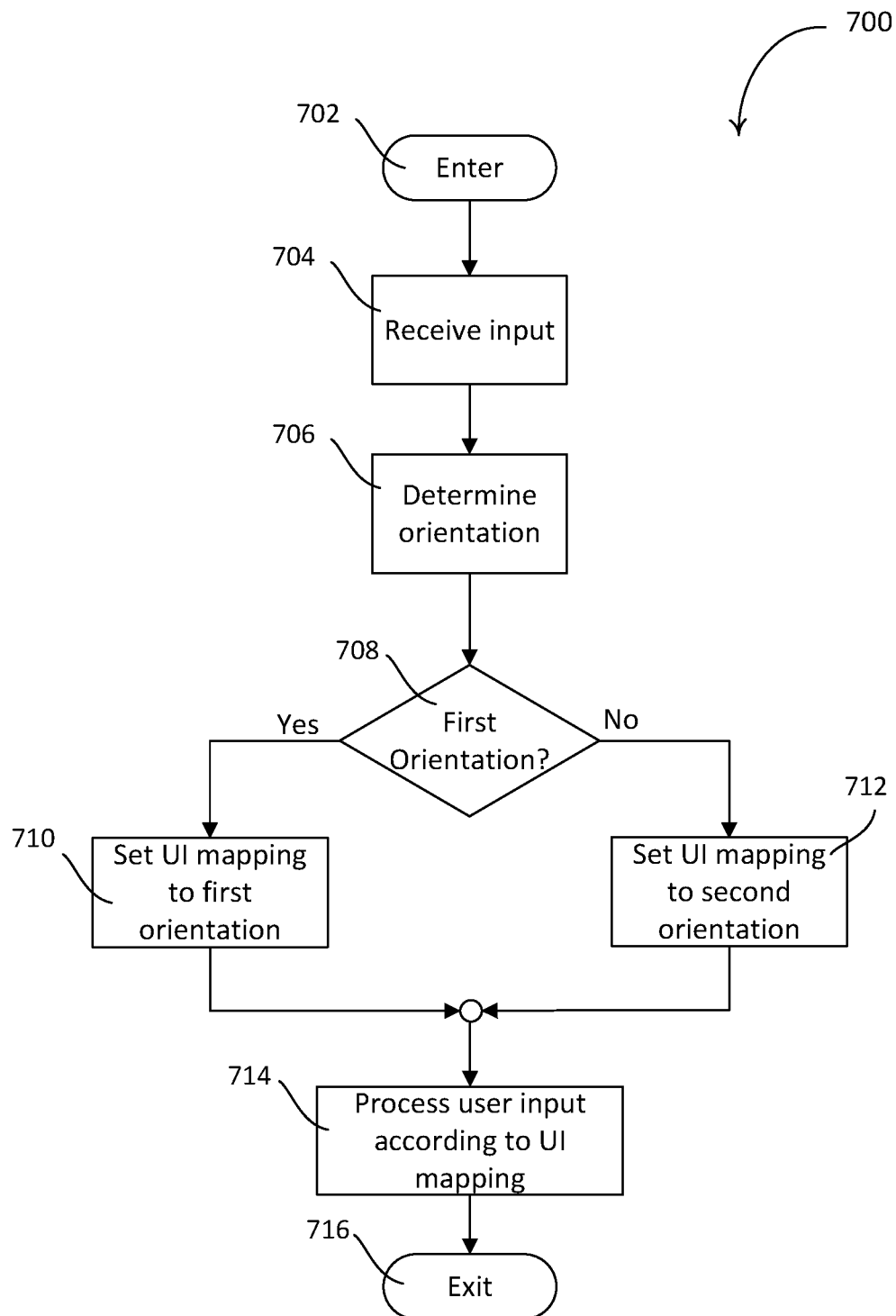
FIG. 34 is a flowchart of an example of an orientation user interface mapping procedure that may be performed by a remote control device.

FIG. 34 is a flowchart of an example of an orientation user interface mapping procedure 700 that may be performed by a remote control device (e.g., by a control unit of the remote control device). For example, the orientation user interface mapping procedure 700 may be performed by any of the remote control devices described herein, such as the remote control device 100, 200, 300, or 400. The orientation user interface mapping procedure 700 may start at 702. At 704, the remote control device may receive a user input, for example, as described herein. For example, the remote control device may receive a user input via a touch sensitive circuit (e.g., a gesture via a capacitive touch circuit), an actuation of an actuator, a rotation of a rotary knob, etc.

At 706, the remote control device may determine its orientation. For example, the control unit and/or actuation portion of the remote control device may be configured to determine its orientation, for example, with respect to a mounting structure of the remote control device (e.g., a base portion) and/or in response to an orientation sensing circuit, for example, as described herein. The remote control device may determine its orientation by determining its orientation via an orientation sensing circuit or by retrieving it from memory.

At 708, the remote control device may determine whether its orientation is the first orientation. If the remote control device determines that its orientation is the first orientation at 708, then the remote control device may set its user interface mapping (e.g., an association of its visual indicators (e.g., LEDs)) to the first orientation. For example, the remote control device may determine which location of the LEDs (e.g., end of the array of LEDs) corresponds to a high-end intensity and which location of the LEDs corresponds to a low-end intensity, for example, when displaying an indication of the amount of power delivered to an electrical load. In this regard, the remote control device may ensure proper indication of the high-end and low-end intensities via the LEDs regardless of whether the remote control device is in the first orientation or the second orientation. Similarly, if the remote control device determines that its orientation is the second orientation at 708, then the remote control device may set its user interface mapping (e.g., an association of its visual indicators (e.g., LEDs)) to the second orientation.

After setting its user interface mapping to the first or second orientation, the remote control device may process the user input received at 704 according to the set user interface mapping at 714. For example, the remote control device may determine whether the user input is an on or off command, a raise or lower command, etc. based on the user interface mapping and generate control data accordingly. The remote control device may then send one or more control signals that include the control data to the electrical load for controlling the electrical load. Thereafter, the remote control device may exit the orientation user interface mapping procedure 700 at 716. Although described with reference to two orientations (a first orientation and a second orientation), it should be appreciated that the orientation user interface mapping procedure 700 may include a plurality of orientation to associated user interface mappings.

Figure 35:
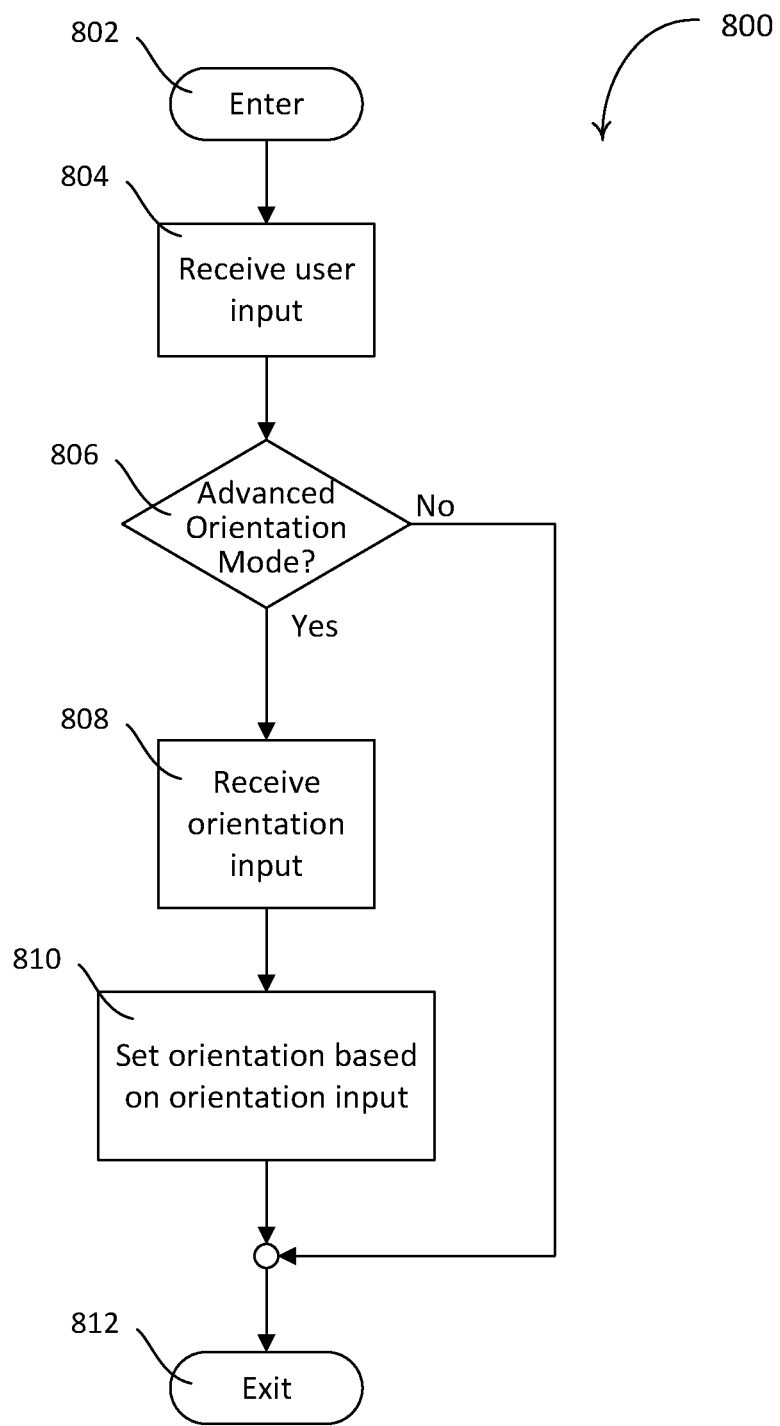
FIG. 35 is a flowchart of an example of an orientation detection procedure that may be performed by a remote control device.

FIG. 35 is a flowchart of an example of an orientation detection procedure 800 that may be performed by a remote control device (e.g., by a control unit of the remote control device). For example, the orientation detection procedure 800 may be performed by any of the remote control devices described herein, such as the remote control device 100, 200, 300, or 400. The orientation detection procedure 800 may begin at 802. At 804, the remote control device may receive a user input via an input device of the remote control device and/or receive a user input via a communication circuit of the remote control device from an external device (e.g., a smart phone or tablet, another remote control device, a system controller, etc.). At 806, the remote control device may determine whether the user input corresponds to an advanced orientation mode. If the remote control device determines that the user input does not correspond to the advanced orientation mode at 806, then the remote control device may exit the orientation detection procedure 800 at 812 (e.g., and, for example, process the user input according to an orientation user interface mapping procedure, such as the orientation user interface mapping procedure 700).

If the remote control device determines that the user input does correspond to the advanced orientation mode at 806, then the remote control device may enter the advanced orientation mode. The association of user input to the advanced orientation mode may be stored in memory of the remote control device. The user input may, for example, be a specific actuation of an actuator of the remote control device (e.g., a triple tap of the bottom actuator), a specific gesture as determined by a touch sensitive surface of the remote control device, a specific rotation of a rotary knob of the remote control device, etc.

At 808, the remote control device may receive an input relating to the orientation of the remote control device. The orientation of the remote control device may refer to the orientation of the control unit and/or actuation portion of the remote control device with respect to a mounting structure of the remote control device (e.g., a base portion), for example, as described herein. The remote control device may receive the orientation input via an input device of the remote control device and/or via a communication circuit of the remote control device from an external device (e.g., a smart phone or tablet, another remote control device, a system controller, etc.). In some examples, the orientation input may also be used by the remote control device to pair the remote control device with one or more electrical loads. Moreover, it should be noted that in some instances the user input received at 804 may be used to enter the advanced orientation mode and as an indication of the orientation of the remote control device. In such instances, the remote control device does not receive another orientation specific input.

At 810, the remote control device may set its orientation based on the orientation input. For example, the remote control device may set its control data mapping and/or user interface mapping based on the orientation of the remote control device. In that regards, the remote control device may translate a user input received via a user interface of the remote control device into control data for one or more electrical loads based on the orientation of the remote control device, and/or the remote control device may provide an indication (e.g., a visual indication) of an amount of power delivered to the electrical load by the remote control device based on the orientation of the remote control device, for example, as described herein. Thereafter, the remote control device may transmit control signals that include the control data to the one or more electrical loads.

Figure 36:
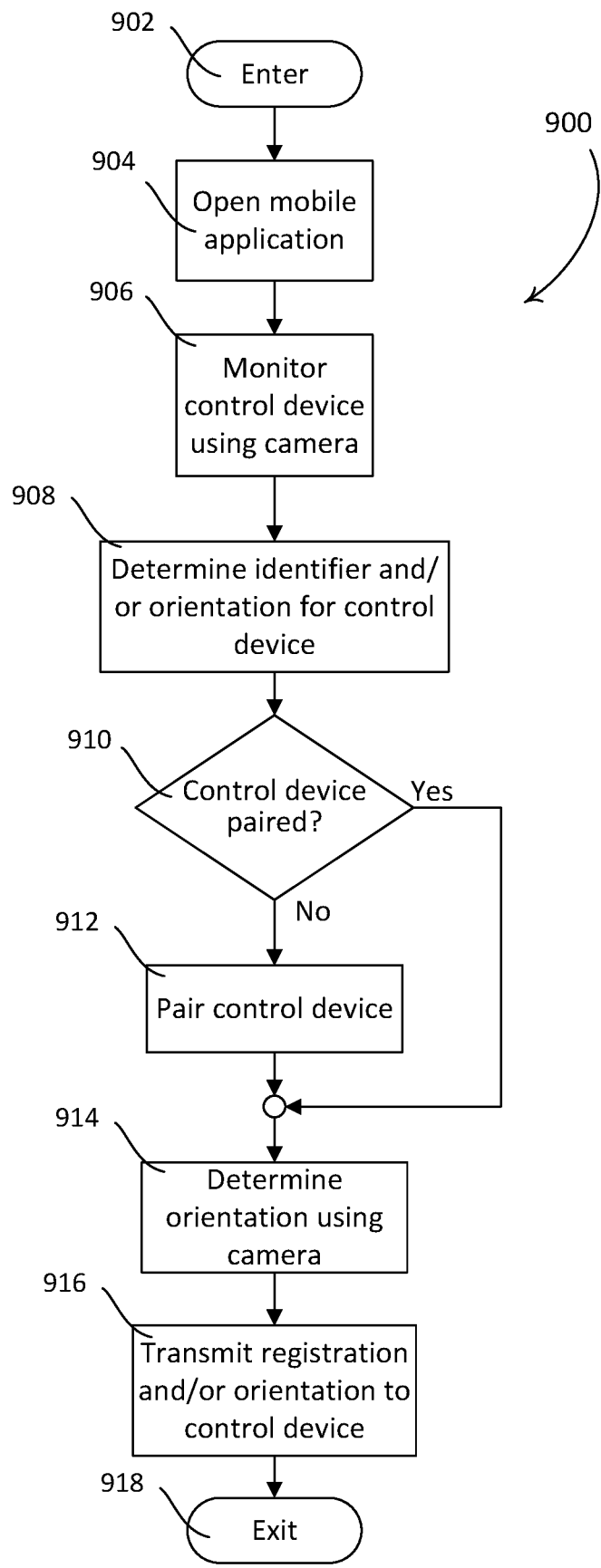
FIG. 36 is a flowchart of an example of an orientation detection procedure that may be performed by a remote control device and an external device.

FIG. 36 is a flowchart of an example of an orientation detection procedure 900 that may be performed by a remote control device (e.g., by a control unit of the remote control device) and an external device (e.g., via a mobile application residing on the external device). For example, the orientation detection procedure 900 may be performed by any of the remote control devices described herein, such as the remote control device 100, 200, 300, or 400. The external device may, for example, be a smartphone, tablet, other mobile device, and/or the like. The orientation detection procedure 900 may begin at 902. At 904, a user may open a mobile application associated with the remote control device on an external device, such as a smartphone or tablet, for example.

At 906, the mobile application may monitor the remote control device using a camera of the external device. For example, the mobile application may access the camera to record or take a picture of the remote control device. The remote control device may be configured to receive an initiation message from the mobile application or via a user input device of the remote control device that configures the remote control device to illuminate one or more visual indicators (e.g., LEDs) in a unique sequence or pattern. It should be appreciated that the illumination of the visual indicators may be done at a rate that is imperceptible to the human eye. In some instances, the remote control device may illuminate the visual indicators in a pattern (e.g., generic pattern) associated associating the remote control device to the control system, and in between the illuminations of the pattern, the remote control device may flash (e.g., at a higher rate) a unique sequence or pattern. The unique sequence or pattern of the visual indicators may be associated with a unique identifier of the remote control device (e.g., a serial number of the remote control device) and/or an orientation of the remote control device. For example, the mobile application may be configured to determine which LEDs are illuminating (e.g., top or bottom, left or right, etc.) to determine the orientation of the remote control device, and/or may be configured to interpret the unique sequence or pattern of the blinking of the LEDs to determine the unique identifier of the remote control device (e.g., short blinks=0, long blinks=1).

At 908, the mobile application may determine the unique identifier and/or orientation of the remote control device by recording the visual indicators of the remote control device using the camera of the external device. At 910, the mobile application may determine whether the remote control device is paired with the load control system using the unique identifier of the remote control device. If the mobile application determines that the remote control device is not paired with the load control system at 910, then the mobile application may pair the remote control device with the load control system at 912. For example, the mobile application may generate a registration message to pair the remote control device. Further, the mobile application may send a digital message to a system controller and/or one or more electrical loads of the load control system to pair the remote control device.

If the mobile application determines that the remote control device is not paired with the load control system at 910 and/or if the mobile application pairs the remote control device to the load control system at 912, the mobile application may determine the orientation of the remote control device at 914 using the camera. For example, the mobile application may determine orientation of the remote control device by recording the visual indicators of the remote control device using the camera of the external device, and determining the orientation of the remote control device based on sequence or pattern that the visual indicators were illuminated.

At 916, the mobile application may transmit a digital message to the remote control device that includes the registration information needed to pair the remote control device and/or the orientation of the remote control device. The remote control device may receive the digital message and finalize the pairing process (e.g., save the addresses of the electrical loads, register itself with the load control system, etc.) and/or set its orientation. In this regards and as noted above, the remote control device may translate a user input received via a user interface of the remote control device into control data for one or more electrical loads based on the orientation of the remote control device, and/or the remote control device may provide an indication (e.g., a visual indication) of an amount of power delivered to the electrical load by the remote control device based on the orientation of the remote control device, for example, as described herein. Moreover, once paired, the remote control device may be configured to transmit control signals that include the control data used to control one or more electrical loads of the load control system.

Figure 37A:
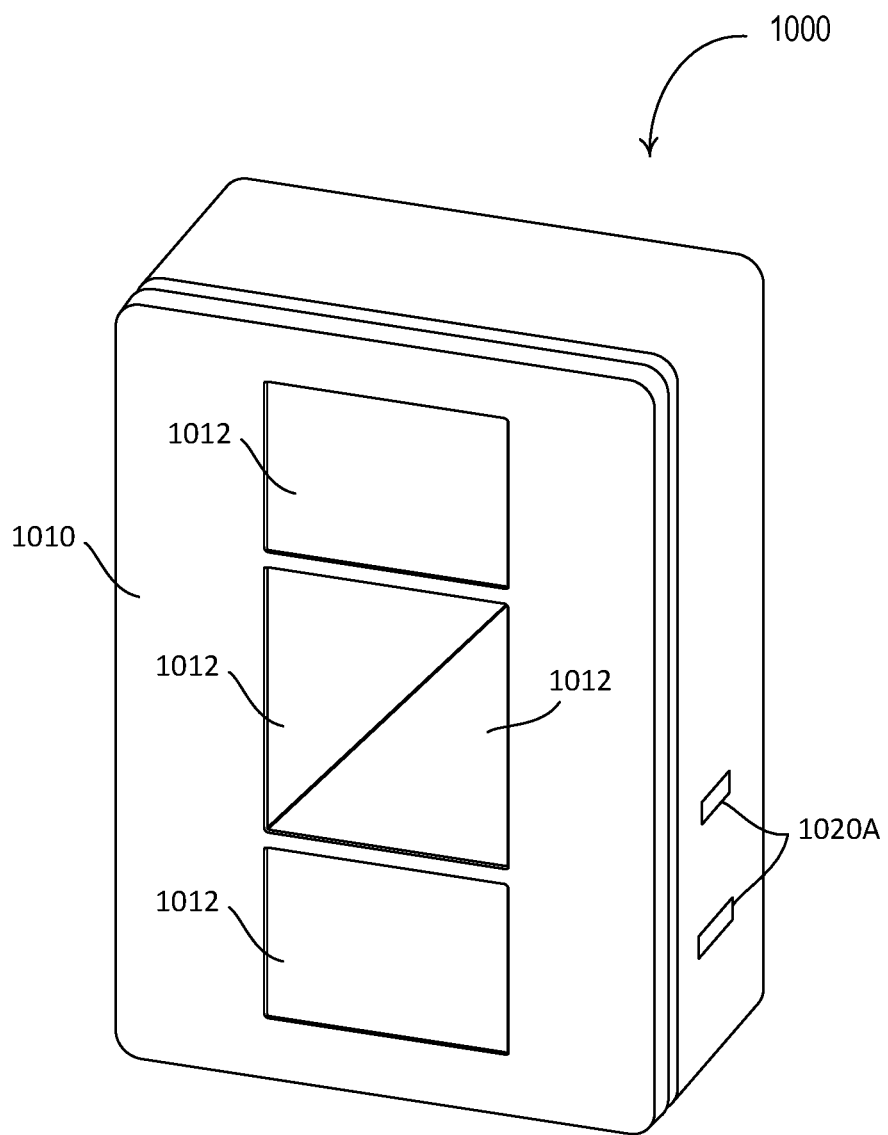
FIG. 37A is a right perspective view of an example control device.
Figure 37B:
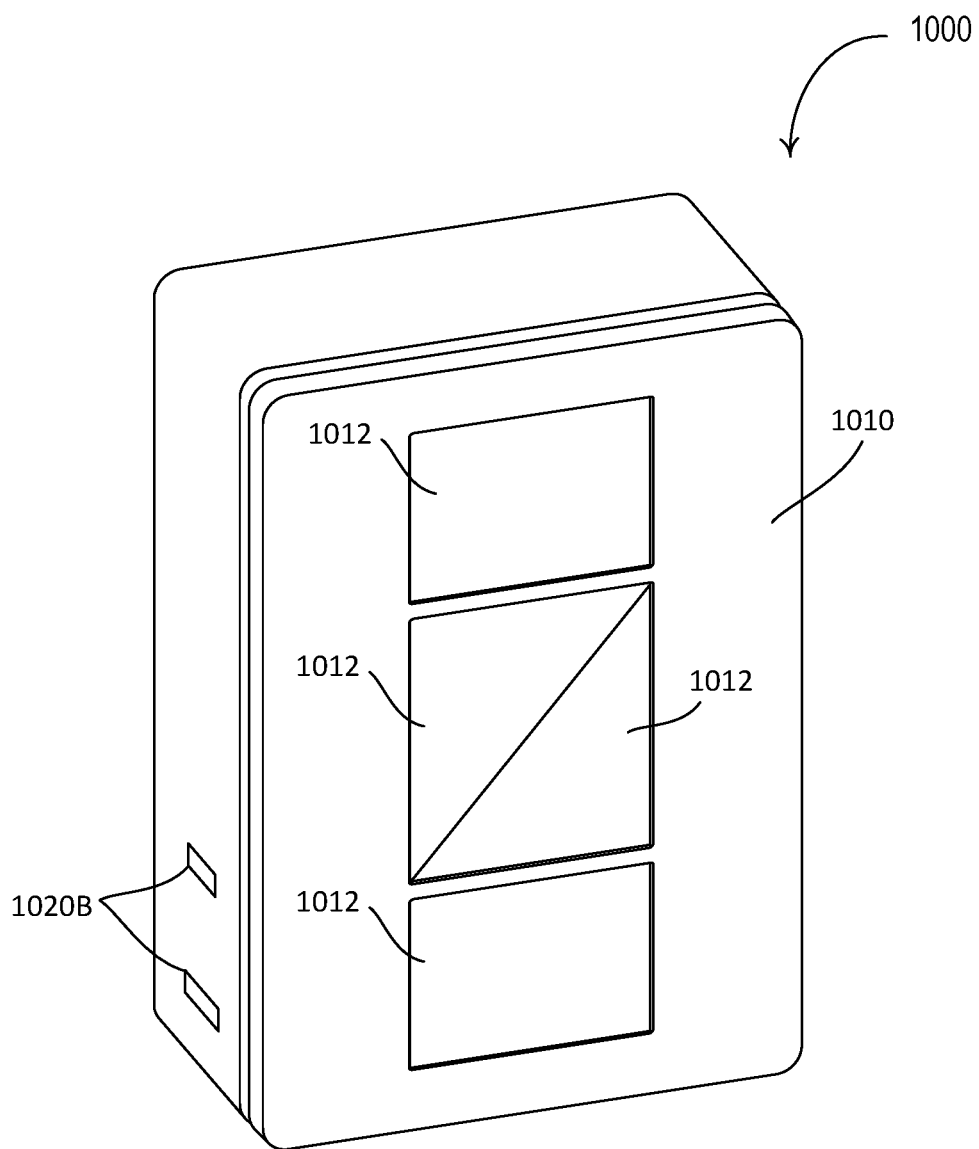
FIG. 37B is left perspective view of the example control device illustrated in FIG. 37A.
Figure 37C:
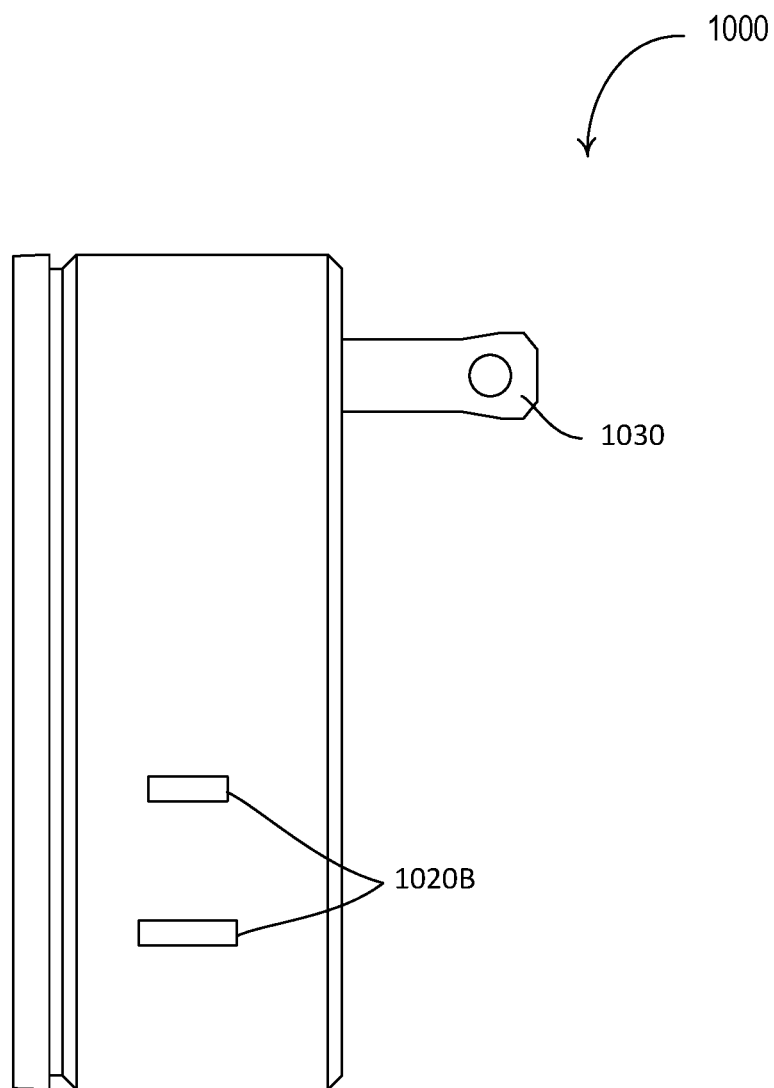
FIG. 37C is a right side view of the example control device illustrated in FIG. 37A.

FIG. 37A-C are views of an example control device 1000. The control device 1000 may include a front surface 1000 that includes one or more input devices 1012, such as those described herein (e.g., a rotational sensing circuit, one or more actuators, a touch sensitive device, etc.). The control device 1000 may include a plug 1030 that is configured to be plugged into a standard electrical outlet. The control device 1000 may include one or more receptacles 1020A-B that are configured to receive plugs from one or more electrical loads. The control device 1000 may be configured to deliver power from an AC power source (via the plug 1030) to the one or more electrical loads (via the receptacles 1020A-B) to control the one or more electrical loads, for example, based on user inputs received via the input device 1012.

Further, although illustrated with the receptacles 1020A-B and the plug 1030, it should be appreciated that the control device 1000 may be implemented as a standard wall-switch (e.g., a dimmer) that is configured to be mounted in a standard electrical wall-box. In such implementations, the control device 1000 may be configured to receive AC line voltage and be electrically connected to one or more electrical loads (e.g., lighting loads).

The control device 1000 may include an orientation sensing circuit (not shown), for example, as described herein with reference to FIGS. 1-32 (e.g., the orientation sensing circuit 542). As such, the control device 1000 may determine the orientation of the control device 1000, for example, relative to the space where it is installed (e.g., based on gravity) and/or its orientation relative to another component such as a mounting structure, etc. Further, the control device 1000 may be configured to perform the orientation detection procedure 600, the orientation user interface mapping procedure 700, the orientation detection procedure 800, and/or the orientation detection procedure 900. The control device 1000 may be configured to control an internal load control circuit (e.g., a drive circuit, a controllably conductive device, and/or the like) based on the orientation of the control device 1000. Additionally or alternatively, the control device 1000 may be configured to control visual indicators and/or the control data that is transmitted via control signals by a wireless communication circuit based on its determined orientation, for example, as described herein. For instance, the control device 1000 may determine how to control the controllable conductive device to control the amount of power delivered to one or more electrical loads based on its orientation (e.g., instead of and/or in addition to being able to adjust control data and/or feedback based on its orientation). Accordingly, the control device 1000 may be similar to the remote control devices described herein, except the control device 1000 may be able to also control an internal load control circuit in response to its determined orientation to, for example, control an electrical load that is directed connected to the load control device.

Figure 38:
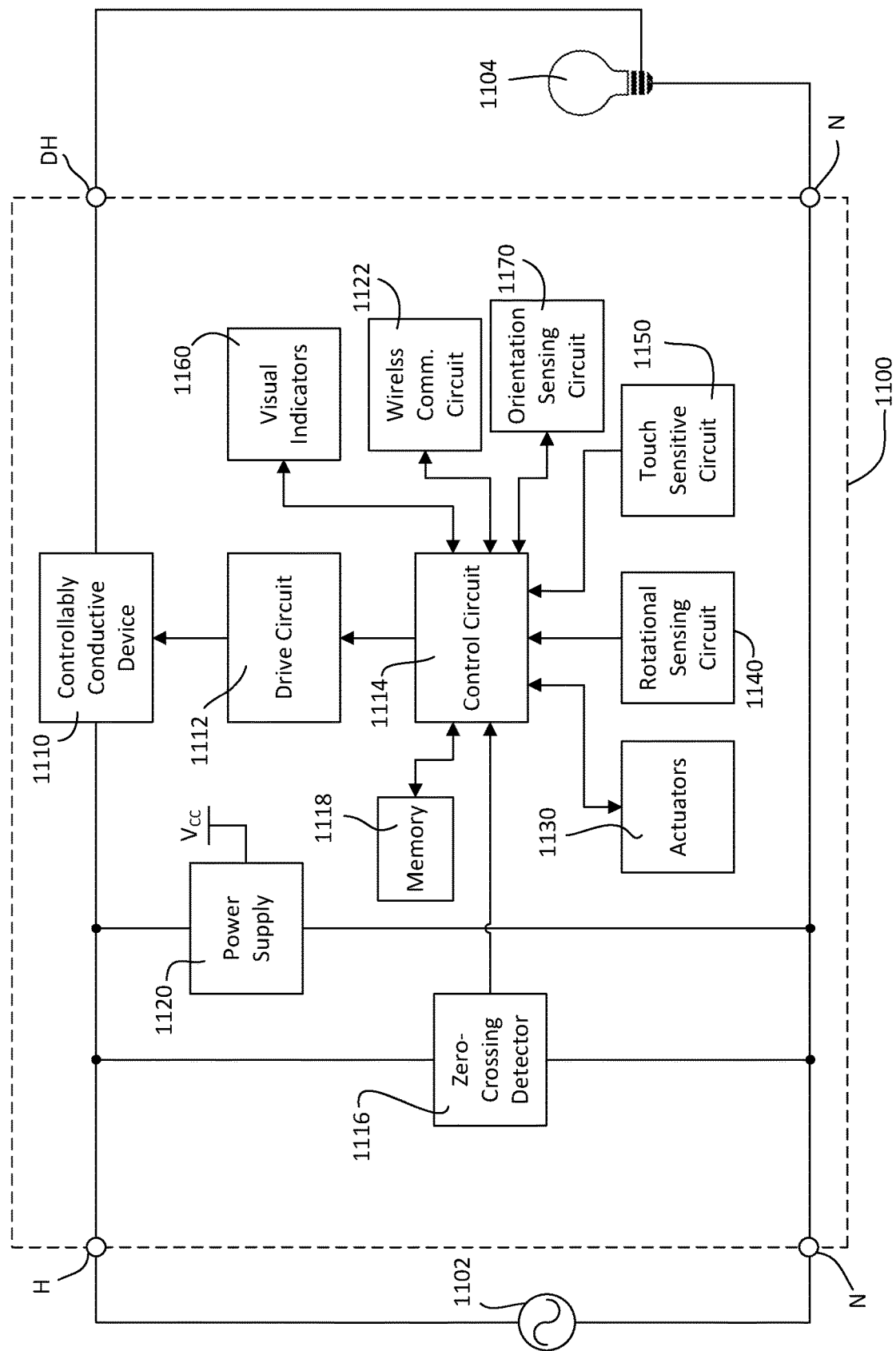
FIG. 38 is a simplified equivalent schematic diagram of an example control unit for the example control device.

FIG. 38 is a simplified equivalent schematic diagram of an example control device 1100 (e.g., a dimmer switch) that may be deployed as, for example, the control device 1000. The control device 1100 may be configured to perform any of the functions described with reference to the remote control devices described herein. Moreover, the control device 1100 may be configured to control an internal load control circuit (e.g., a drive circuit, a controllably conductive device, and/or the like) to control an electrical load that is connected to the load control device (e.g., electrically connected via wiring).

An AC power source 1102 may be coupled between a hot terminal H and a neutral terminal N of the control device 1100. An electrical load, such as a lighting load 1104, may be coupled between a dimmed hot terminal DH and a second neutral terminal N of the control device 1100. For example, the lighting load 1104 may be a table lamp plugged into a receptacle including the dimmed hot DH and the second neutral terminal N. The control device 1100 may include a controllably conductive device 1110 coupled in series electrical connection between the AC power source 1102 and the lighting load 1104 between the hot terminal H and the dimmed hot terminal DH. The controllably conductive device 1110 may control the power delivered to the lighting load 1104. The controllably conductive device 1110 may include a suitable type of bidirectional semiconductor switch, such as, for example, a triac, a field-effect transistor (FET) in a rectifier bridge, two FETs in anti-series connection, or one or more insulated-gate bipolar junction transistors (IGBTs).

The control device 1100 may include a control circuit 1114. The control circuit 1114 may include one or more of a processor (e.g., a microprocessor), a microcontroller, a programmable logic device (PLD), a field programmable gate array (FPGA), an application specific integrated circuit (ASIC), or any suitable controller or processing device. The control circuit 1114 may be operatively coupled to a control input of the controllably conductive device 1110, for example, via a gate drive circuit 1112. The control circuit 1114 may be used for rendering the controllably conductive device 1110 conductive or non-conductive, for example, to control the amount of power delivered to the lighting load 1104.

The control circuit 1114 may receive a signal representative of the zero-crossing points of the AC main line voltage of the AC power source 1102 from a zero-crossing detector 1116, which may be coupled between the hot terminal H and the neutral terminal N of the control device 1100. The control circuit 1114 may be operable to render the controllably conductive device 1110 conductive and/or non-conductive at predetermined times relative to the zero-crossing points of the AC waveform using a phase-control dimming technique. Examples of dimmers are described in greater detail in commonly-assigned U.S. Pat. No. 7,242,150, issued Jul. 10, 2007, entitled Dimmer Having a Power Supply Monitoring Circuit; U.S. Pat. No. 7,546,473, issued Jun. 9, 2009, entitled Dimmer having a microprocessor-controlled power supply; and U.S. Pat. No. 8,664,881, issued Mar. 4, 2014, entitled Two-wire dimmer switch for low-power loads, the entire disclosures of which are hereby incorporated by reference.

The control device 1100 may include a memory 1118. The memory 1118 may be communicatively coupled to the control circuit 1114 for the storage and/or retrieval of, for example, operational settings, such as, lighting presets and associated preset light intensities. The memory 1118 may be implemented as an external integrated circuit (IC) or as an internal circuit of the control circuit 1114. The control device 1100 may include a power supply 1120, which may be coupled between the hot terminal H and the neutral terminal N of the control device 1100. The power supply 1120 may generate a direct-current (DC) supply voltage $V_{CC}$ for powering the control circuit 1114 and the other low-voltage circuitry of the control device 1100. The power supply 1120 may be coupled in parallel with the controllably conductive device 1110. The power supply 1120 may be operable to conduct a charging current through the lighting load 1104 to generate the DC supply voltage $V_{CC}$.

The control circuit 1114 may be responsive to inputs received from actuators 1130, a rotational position sensing circuit 1140, and/or a touch sensitive device 1150. The control circuit 1114 may control the controllably conductive device 1110 to adjust the intensity of the lighting load 1104 in response to the input received via the actuators 1130, the rotational position sensing circuit 1140, and/or the touch sensitive device 1150.

The rotational sensing circuit 1140 may be configured to translate a force applied to a rotating mechanism (e.g., such as the rotating portion 322 of the remote control device 300) into an input signal and provide the input signal to the control circuit 1114. The rotational sensing circuit 1140 may include, for example, a Hall-effect sensor, a mechanical encoder, and/or an optical encoder. The rotational sensing circuit 1140 may also operate as an antenna of the control device 1100. The one or more actuators 1130 may include a button or switch (e.g., a mechanical button or switch, or an imitation thereof), for example, such as those described in association with the actuators of the remote control device 130 and the actuator 411 of the remote control device 400. The actuators 1130 may be configured to send respective input signals to the control circuit 1114 in response to actuations of the actuators 1130 (e.g., in response to movements of the actuators 1130). The touch sensitive circuit 1150 may include a capacitive or resistive touch element. Examples of such a touch sensitive circuit may include the touch sensitive circuits described with reference to the remote control devices 200, 300, and 400. The touch sensitive circuit 1150 may be configured to detect point actuations and/or gestures (e.g., the gestures may be effectuated with or without physical contacts with the touch sensitive device 1150), and provide respective input signals to the control circuit 1114 indicating the detection.

It should be noted that, although depicted as including all of the rotational sensing circuit 1140, the actuators 1130, and the touch sensitive device 1150, the control device 1100 may include any combination of the foregoing components (e.g., one or more of those components) and/or any input device, for example, those described herein.

The control device 1100 may comprise a wireless communication circuit 1122. The wireless communication circuit 1122 may include for example, a radio-frequency (RF) transceiver coupled to an antenna for transmitting and/or receiving RF signals. The wireless communication circuit 1122 may also include an RF transmitter for transmitting RF signals, an RF receiver for receiving RF signals, or an infrared (IR) transmitter and/or receiver for transmitting and/or receiving IR signals. The wireless communication circuit 1122 may be configured to transmit a control signal (e.g., a digital message) generated by the control circuit 1114 to the lighting load 1104. As described herein, the control signal may be generated in response to a user input (e.g., a point actuation or a gesture) to adjust one or more operational aspects of the lighting load 1104. The control signal may include control data (e.g., a command) and/or identification information (e.g., such as a unique identifier) associated with the control device 1100. In addition to or in lieu of transmitting the control signal to the lighting load 1104, the wireless communication circuit 1122 may be controlled to transmit the control signal to a central controller of the lighting control system.

The control circuit 1114 may be configured to illuminate visual indicators 1160 (e.g., LEDs) to provide feedback of a status of the lighting load 1104, to indicate a status of the control device 1100, and/or to assist with a control operation (e.g., to provide a color gradient for controlling the color of the lighting load 1104, to present backlit virtual buttons for preset selection, etc.). The visual indicators 1160 may be configured to illuminate a light bar and/or to serve as indicators of various conditions.

The control device 1100 may also include an orientation sensing circuit 1170, for example, as described herein with reference to FIGS. 1-32 (e.g., the orientation sensing circuit 542). As such, the control device 1100 may determine the orientation of the load control device, for example, relative to the space where it is installed (e.g., based on gravity) and/or its orientation relative to another component such as a mounting structure, etc. Further, the control device 1100 may be configured to perform the orientation detection procedure 600, the orientation user interface mapping procedure 700, the orientation detection procedure 800, and/or the orientation detection procedure 900. The control device 1100 may be configured to control an internal load control circuit (e.g., the drive circuit 1112, the controllably conductive device 1110, and/or the like.) based on the orientation of the control device 1100. Additionally or alternatively, the control device 1100 may be configured to control the visual indicators 1160 and/or the control data that is transmitted via control signals by the wireless communication circuit 1122 based on its determined orientation, for example, as described herein. For instance, the control device 1100 may determine how to control the controllable conductive device to control the amount of power delivered to the lighting load 1104 based on its orientation (e.g., instead of and/or in addition to being able to adjust control data and/or feedback based on its orientation). Accordingly, the control device 1100 may be similar to the remote control devices described herein, except the control device 1100 may be able to also control an internal load control circuit in response to its determined orientation.

The invention claimed is:

1. A control unit configured to be mounted to a mounting structure, the control unit comprising:
a user interface;
an orientation sensing circuit;
a communication circuit configured to communicate messages; and
a control circuit, wherein the control unit is configured to be supported by the mounting structure in a plurality of orientations, and wherein the control circuit is configured to:
determine an orientation of the control unit relative to the mounting structure in response to the orientation sensing circuit;
translate a user input from the user interface into control data based on the orientation of the control unit, the control data configured to control an electrical load of a load control system; and
cause the communication circuit to transmit a control signal comprising the control data.

2. The control unit of claim 1, wherein the user interface comprises an actuation portion configured to receive the user input.

3. The control unit of claim 2, wherein the control circuit is configured to translate an actuation of an upper portion of the actuation portion into an on command for the electrical load, and translate an actuation of a lower portion of the actuation portion into an off command for the electrical load.

4. The control unit of claim 2, wherein the actuation portion comprises a touch sensitive surface, and the control circuit is configured to translate point actuations on the touch sensitive surface into commands for adjusting the amount of power delivered to the electrical load based on the orientation of the control unit relative to the mounting structure.

5. The control unit of claim 1, further comprising:
at least one light source;
wherein the control circuit is configured to control the at least one light source to provide a visual indication based on the orientation of the control unit.

6. The control device of claim 5, wherein the at least one light source comprises a plurality of light sources, and the control circuit is configured to control the plurality of light sources based on the orientation of the control unit to provide a visual indication of an amount of power delivered to the electrical load.

7. A control unit configured to be mounted to a mounting structure, the control unit comprising:
a user interface;
an orientation sensing circuit;
at least one light source configured to be illuminated; and
a control circuit, wherein the control unit is configured to be supported by the mounting structure in a plurality of orientations, and wherein the control circuit is configured to:
determine an orientation of the control unit relative to the mounting structure in response to the orientation sensing circuit;
translate a user input from the user interface into control data based on the orientation of the control unit, the control data configured to control an electrical load of a load control system; and
control the at least one light source to provide a visual indication based on the orientation.

8. The control unit of claim 7, wherein the at least one light source comprises a plurality of light sources, and the user interface comprises a light bar configured to be illuminated by the plurality of light sources.

9. The control unit of claim 8, wherein the control circuit is configured to control the plurality of light sources based on the orientation of the control unit to provide a visual indication of an amount of power delivered to an electrical load.

10. The control unit of claim 9, wherein the light bar defines a starting point of the visual indication that corresponds to low-end amount of power and an ending point of the visual indication that corresponds to a high-end amount of power; and
wherein the control circuit is further configured to determine the relative locations of the starting point and ending point of the visual indication based on the orientation of the control unit relative to the mounting structure.

11. The control unit of claim 10, wherein the starting point and the ending point are the same location or adjacent locations on the light bar.

12. The control unit of claim 9, wherein the plurality of light sources are arranged in a linear array for providing the visual indication.

13. The control unit of claim 9, wherein the light bar has an at least partially circular geometry.

14. The control unit of claim 9, wherein the plurality of light sources comprises a plurality of light-emitting diodes arranged to illuminate the light bar.

15. The control unit of claim 7, wherein the control circuit is configured to automatically determine the orientation of the control unit relative to the mounting structure.

16. The control unit of claim 15, wherein the orientation sensing circuit comprises a switch that is configured to be closed when the control unit is in a first orientation and open when the control unit is in a second orientation relative to the mounting structure.

17. The control unit of claim 16, wherein the switch comprises two contacts configured to be electrically shorted by a shorting member of a faceplate attached to the mounting structure when the control unit is in the first orientation, and not electrically shorted by the shorting member of the faceplate attached the mounting structure when the control unit is in the second orientation relative to the mounting structure.

18. The control unit of claim 16, wherein the switch comprises a tactile switch configured to be actuated by a protrusion of the mounting structure when the control unit is in the first orientation, and not actuated by the protrusion of the mounting structure when the control unit is in the second orientation relative to the mounting structure.

19. The control unit of claim 15, wherein the orientation sensing circuit comprises one of an accelerometer and a gyroscope, and wherein the control circuit is configured to determine the orientation of the control unit based on feedback from one of the accelerometer and the gyroscope.

20. The control unit of claim 15, wherein the control circuit is configured to determine the orientation of the control unit each time the control unit wakes up from an off or sleep state.

21. The control unit of claim 7, further comprising:
a communication circuit configured to communicate messages;
wherein the control circuit is configured to:
translate a user input from the user interface into control data based on the orientation of the control unit relative to the mounting structure, the control data configured to control the electrical load of the load control system; and
cause the communication circuit to transmit a control signal comprising the control data.

22. The control unit of claim 21, wherein the control circuit is configured to receive the orientation of the control unit relative to the mounting structure via the communication circuit during a configuration mode of the control unit.

23. The control unit of claim 22, wherein the control unit is configured to be paired with the electrical load of the load control system during the configuration mode.

24. The control unit of claim 7, wherein the orientation sensing circuit comprises a switch that is configured to be manually operated to indicate the orientation of the control unit.

25. The control unit of claim 7, wherein the at least one light source comprises a plurality of light sources, and the control circuit is configured to control the plurality of light sources based on the orientation of the control unit to provide a visual indication of an amount of power delivered to the electrical load controlled by the control unit.

\* \* \* \* \*